United States Patent

Noguchi et al.

[11] Patent Number: 5,804,851
[45] Date of Patent: Sep. 8, 1998

[54] SEMICONDUCTOR MEMORY DEVICE AND MANUFACTURING METHOD THEREOF

[75] Inventors: Mitsuhiro Noguchi, Kawasaki; Masami Aoki, Yokohama, both of Japan

[73] Assignee: Kabushiki Kaisha Toshiba, Kawasaki, Japan

[21] Appl. No.: 820,626

[22] Filed: Mar. 19, 1997

Related U.S. Application Data

[63] Continuation of Ser. No. 528,137, Sep. 14, 1995, abandoned.

[30] Foreign Application Priority Data

Sep. 17, 1994 [JP] Japan .................................. 6-248463

[51] Int. Cl.⁶ .................. H01L 27/108; H01L 29/76; H01L 29/94
[52] U.S. Cl. .................. 257/304; 257/296; 257/301; 257/302; 257/305
[58] Field of Search .................. 257/296, 301, 257/302, 304, 305

[56] References Cited

U.S. PATENT DOCUMENTS

| | | | |
|---|---|---|---|
| 4,967,248 | 10/1990 | Shimizu .................. | 257/304 |
| 5,250,829 | 10/1993 | Bronner et al. . | |
| 5,264,716 | 11/1993 | Kenney . | |
| 5,300,800 | 4/1994 | Bronner et al. . | |
| 5,309,008 | 5/1994 | Watanabe .................. | 257/304 |
| 5,326,998 | 7/1994 | Jun . | |
| 5,371,701 | 12/1994 | Lee et al. .................. | 365/149 |
| 5,463,236 | 10/1995 | Sakao .................. | 257/306 |

FOREIGN PATENT DOCUMENTS 61-144057 7/1986 Japan .
1-192165 8/1989 Japan .

OTHER PUBLICATIONS

IEEE, 1992, pp. 803–806, Toshiyuki Nishihara, et al., "A Buried Capacitor DRAM cell with Bonded SOI for 256M and 1Gbit DRAMs".

Primary Examiner—Valencia Martin Wallace
Attorney, Agent, or Firm—Oblon, Spivak, McClelland, Maier & Neustadt, P.C.

[57] ABSTRACT

A semiconductor memory device comprises a semiconductor substrate having a plurality of trenches selectively formed thereon, a plurality of capacitors formed in the trenches, each of the capacitors formed of the substrate, a capacitor insulating film formed on a surface of each of the trenches, and a storage node buried in each of the trenches interposing the capacitor insulating film, a plurality of transistors, formed on the substrate, for forming memory cells in relation to the plurality of capacitors, each of the transistors having a gate electrode formed on the substrate interposing a gate insulating film and source and drain regions formed in the substrate on both sides of the gate electrode, a plurality of element isolation films formed on side surfaces of upper portions of the trenches to surround the circumference thereof, respectively, the element isolation films having adjacent ones of the isolation films selectively coupled to each other such that at least one of the transistors is electrically insulated from another one of the transistors, and a plurality of conductive members, each connecting one of the source and drain regions of each of the transistors to the storage node of a corresponding one of the capacitors.

28 Claims, 50 Drawing Sheets

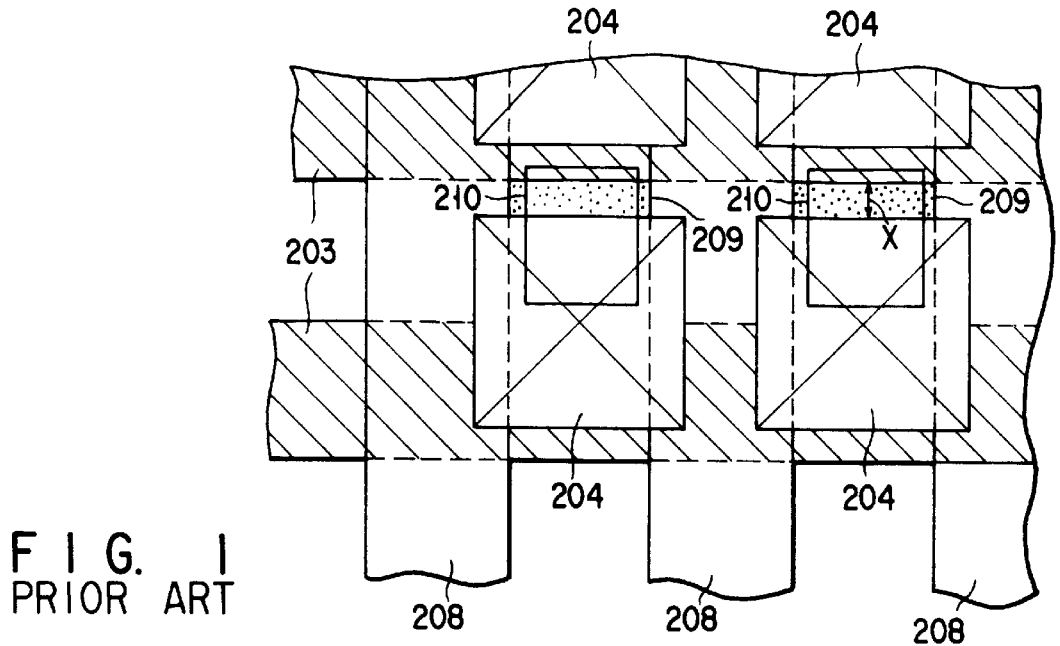
FIG. 1
PRIOR ART
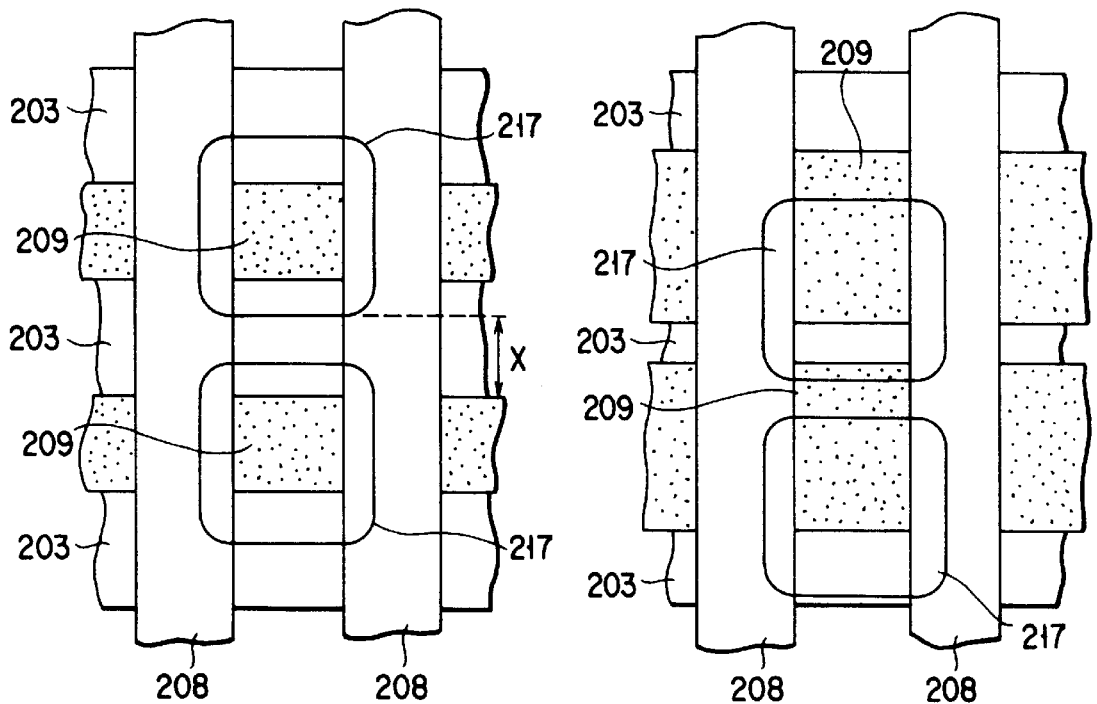
FIG. 2A
PRIOR ART
FIG. 2B
PRIOR ART

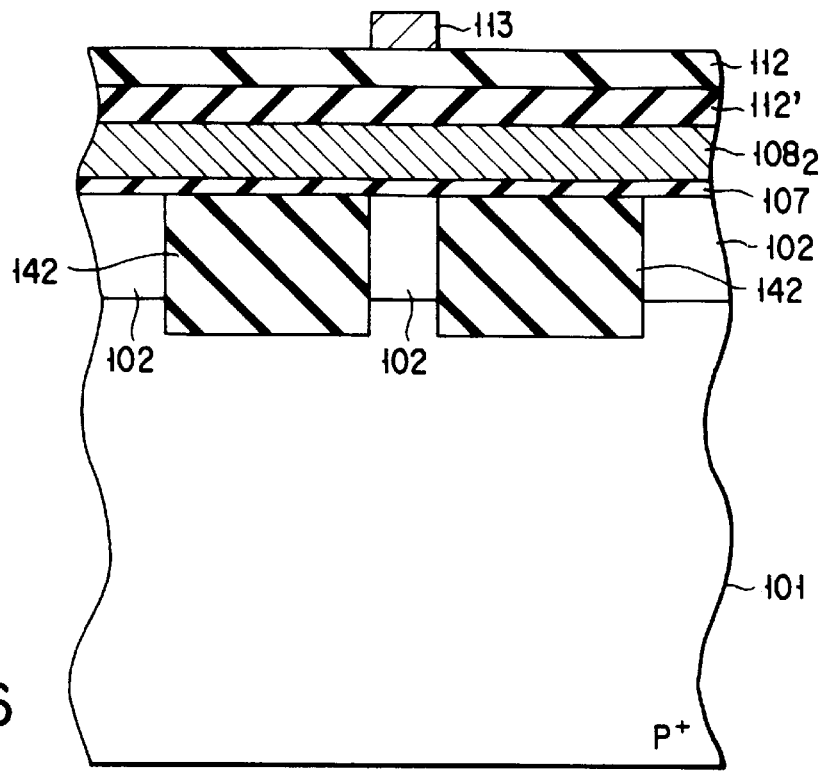
F I G. 6
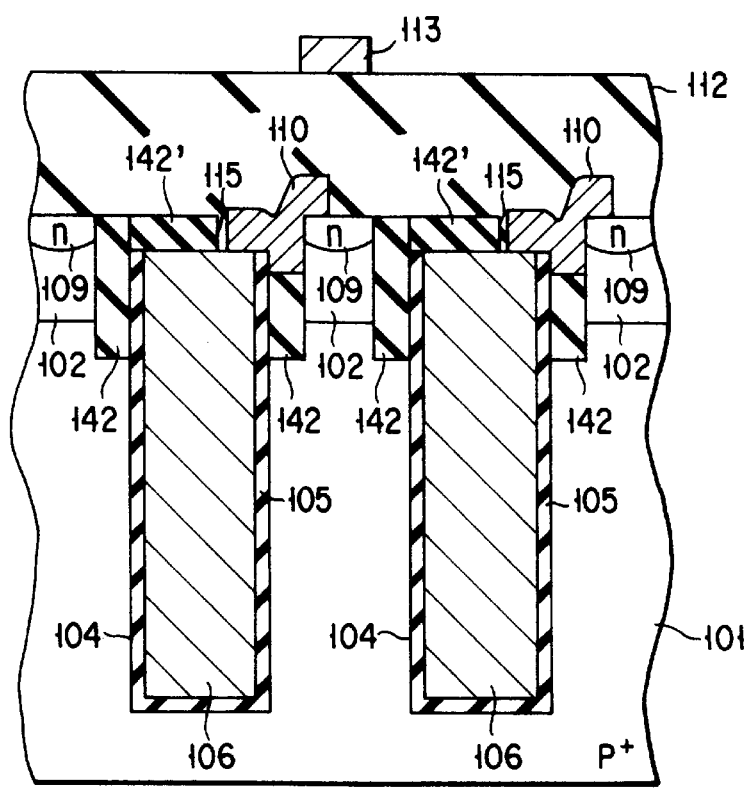
F I G. 7

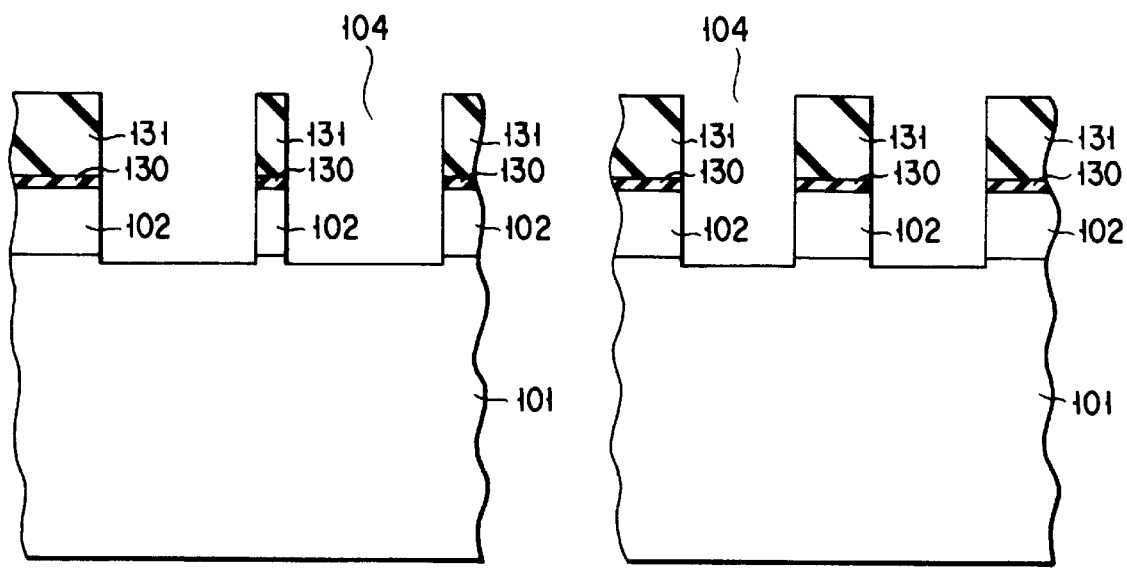
F I G. 8A    F I G. 8B
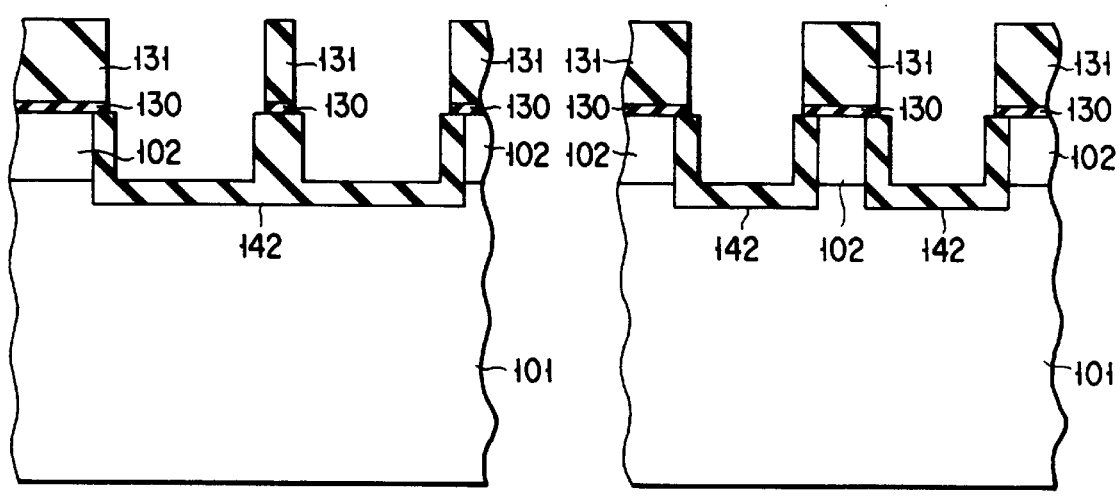
F I G. 9A    F I G. 9B

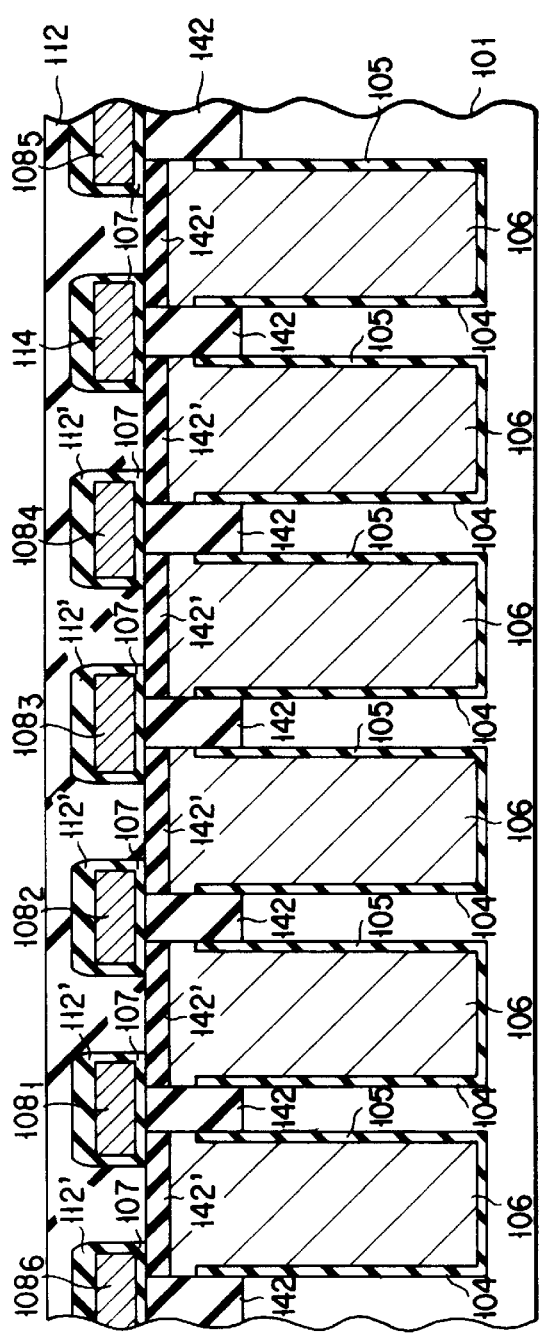
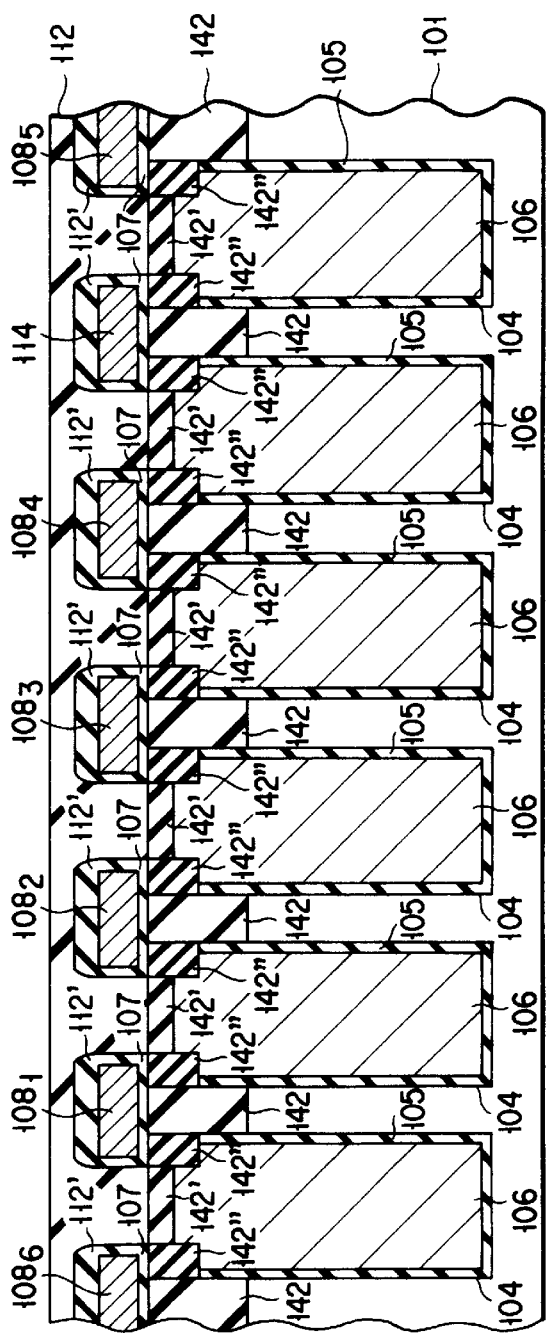
F I G. 12
F I G. 13

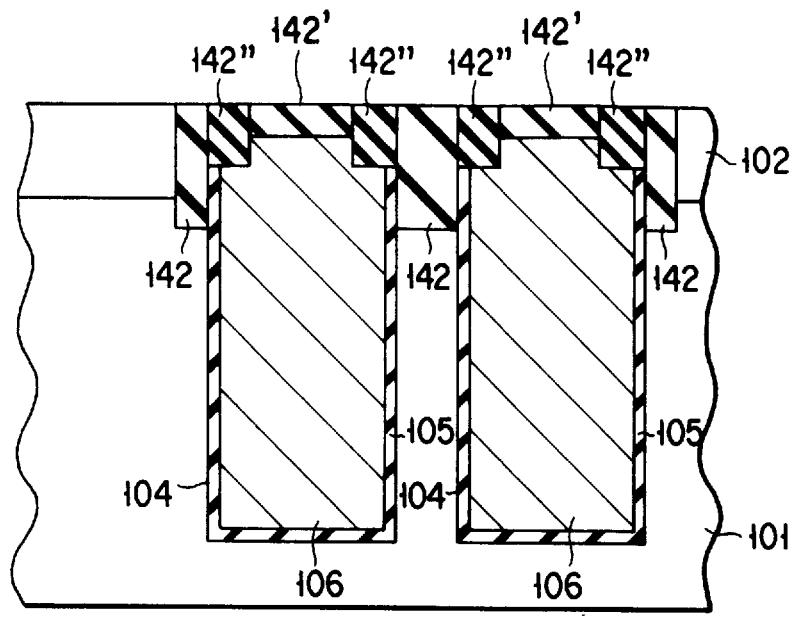
F I G. 14
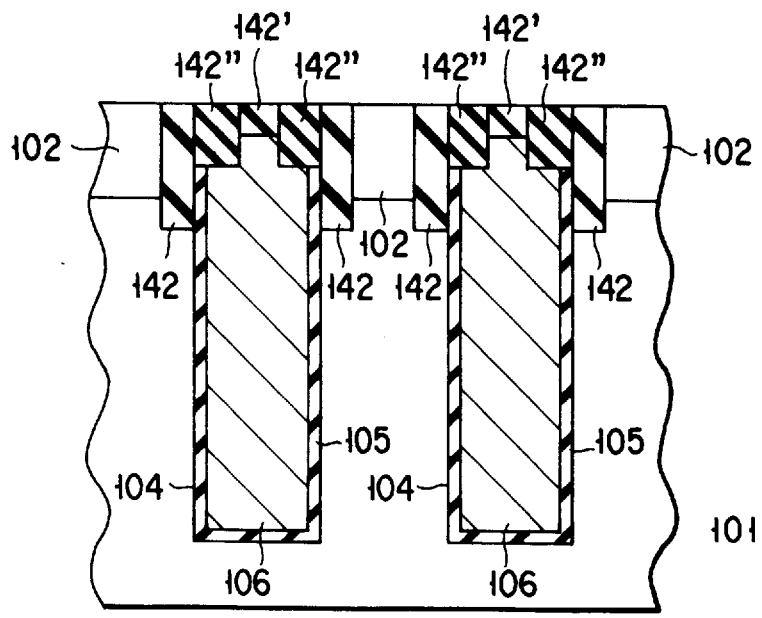
F I G. 15

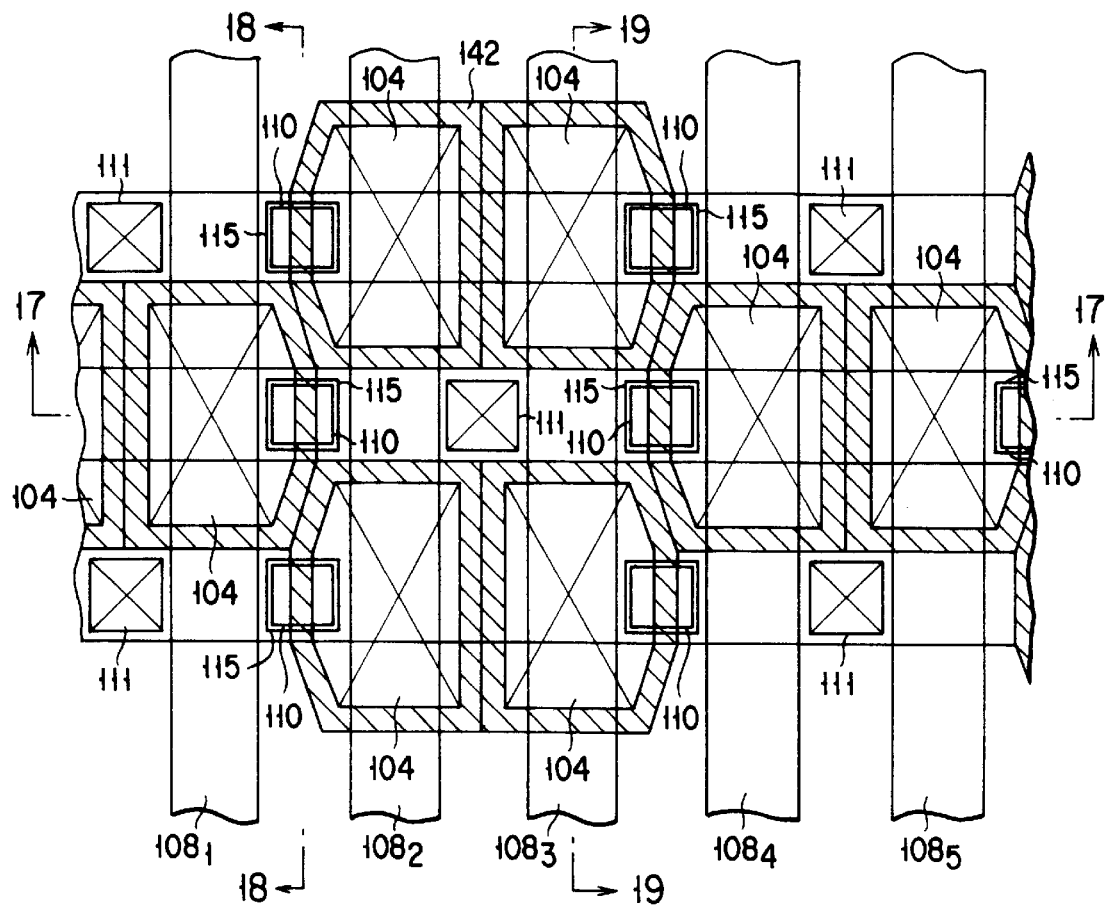
F I G. 16
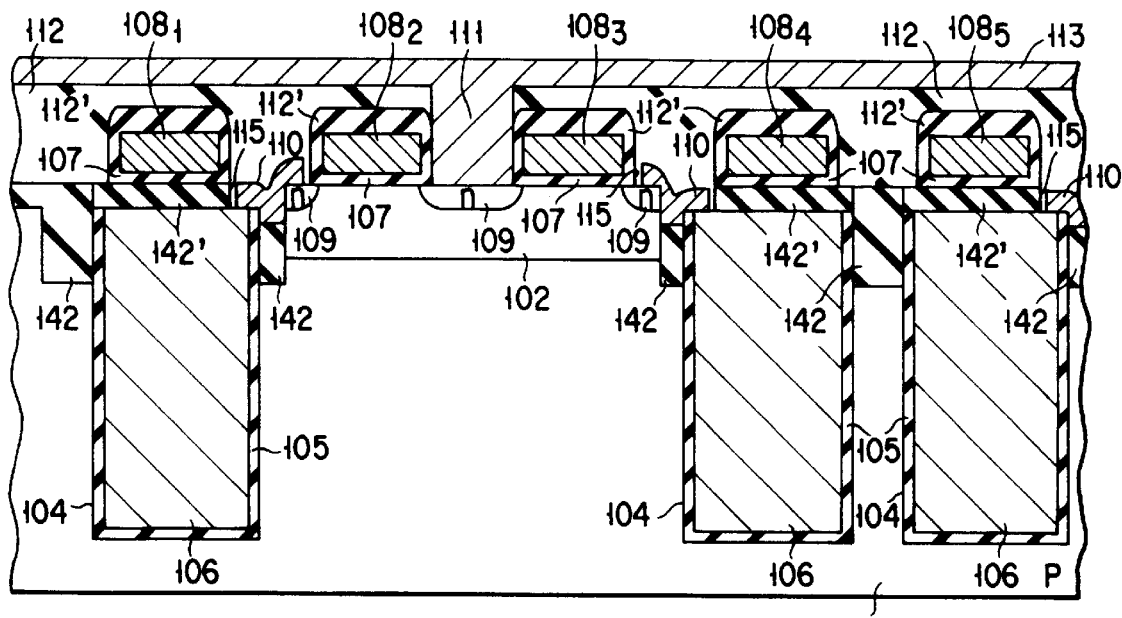
F I G. 17

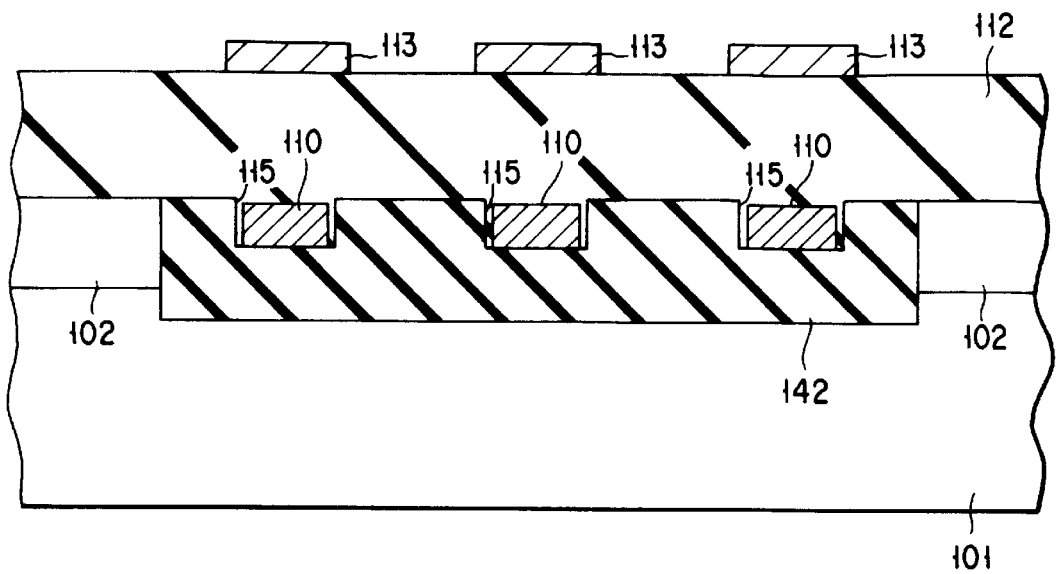
F I G. 18
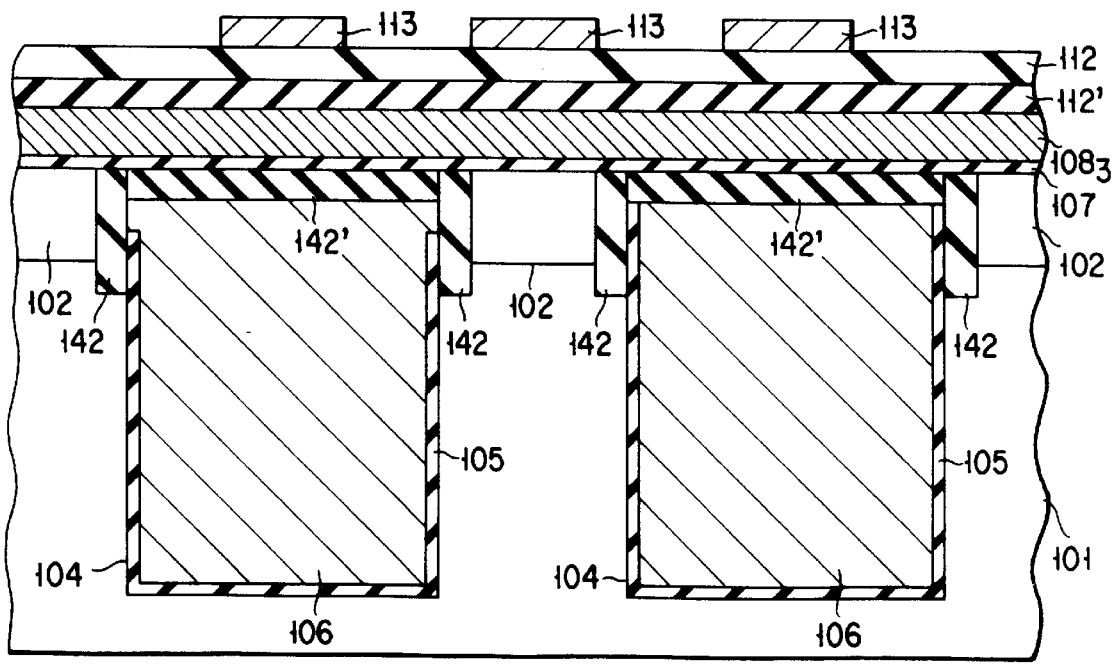
F I G. 19

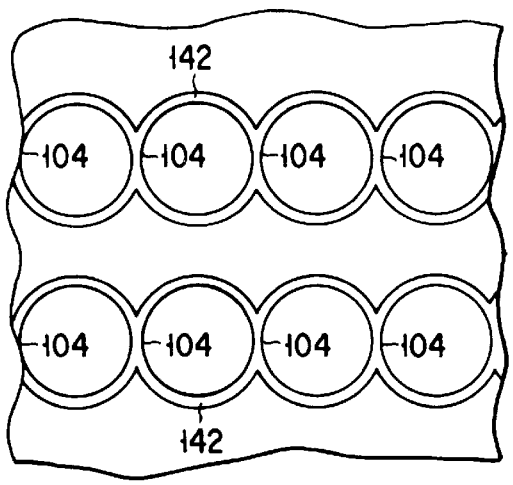
F I G. 21A
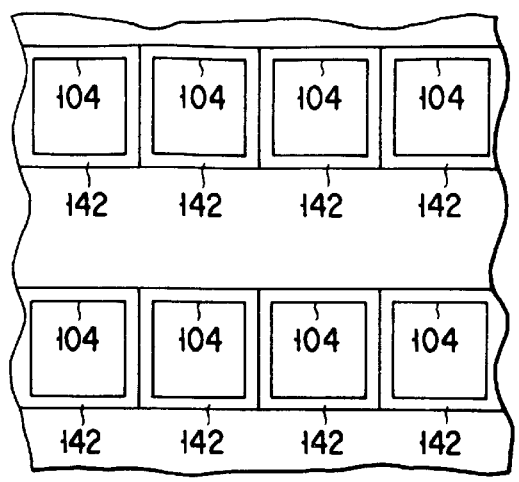
F I G. 21B
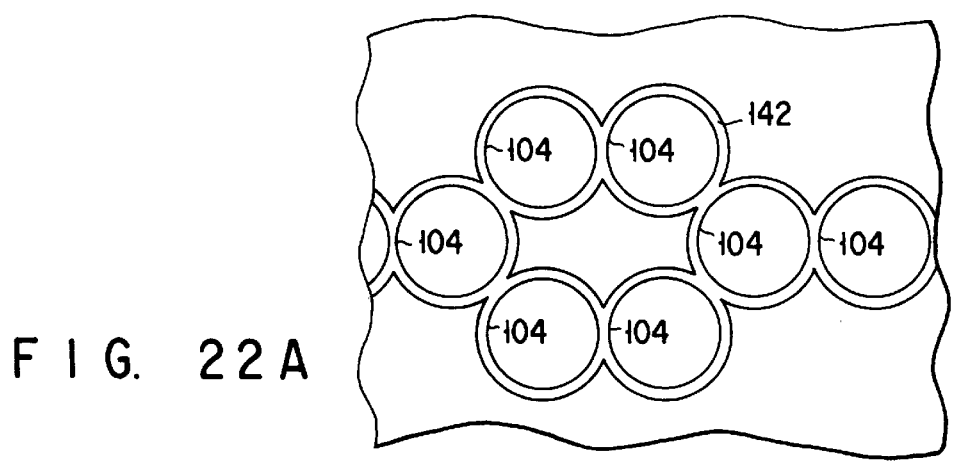
F I G. 22A
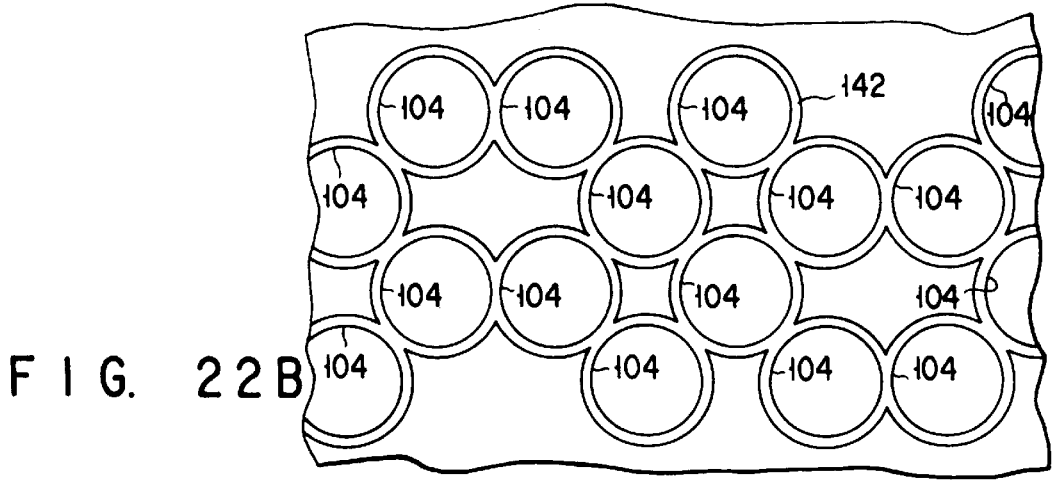
F I G. 22B

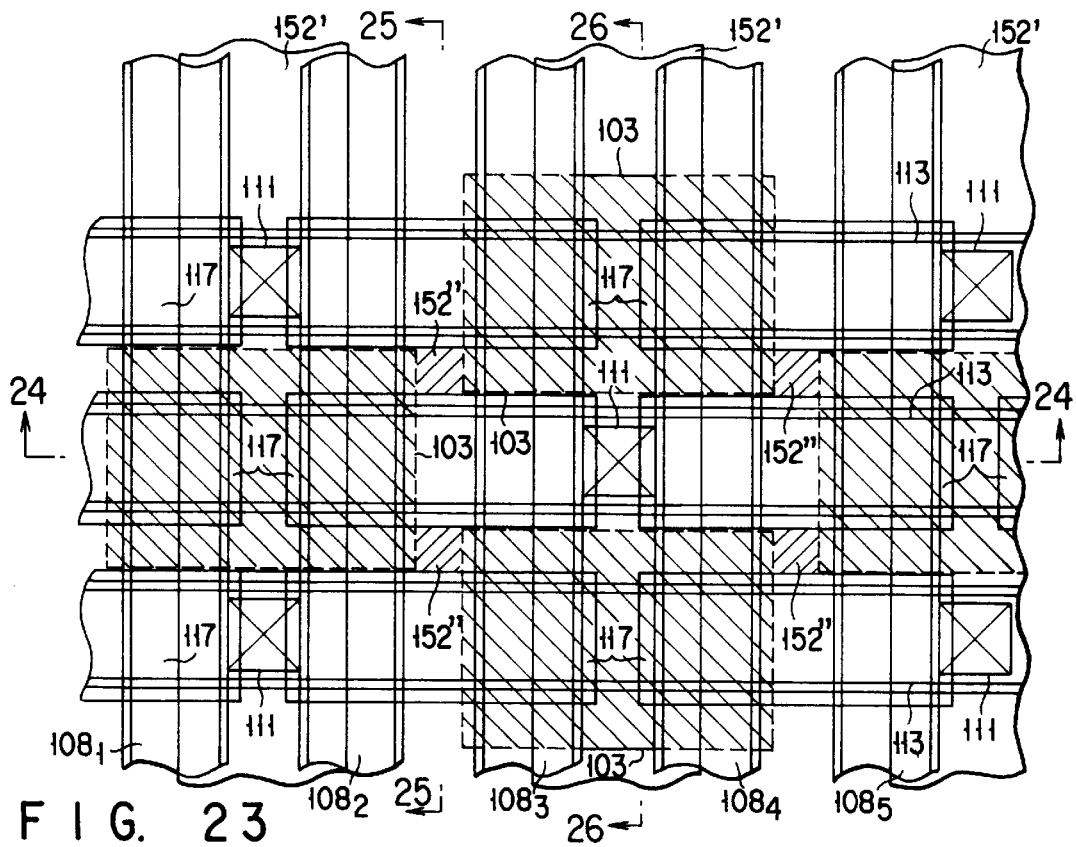
F I G. 23
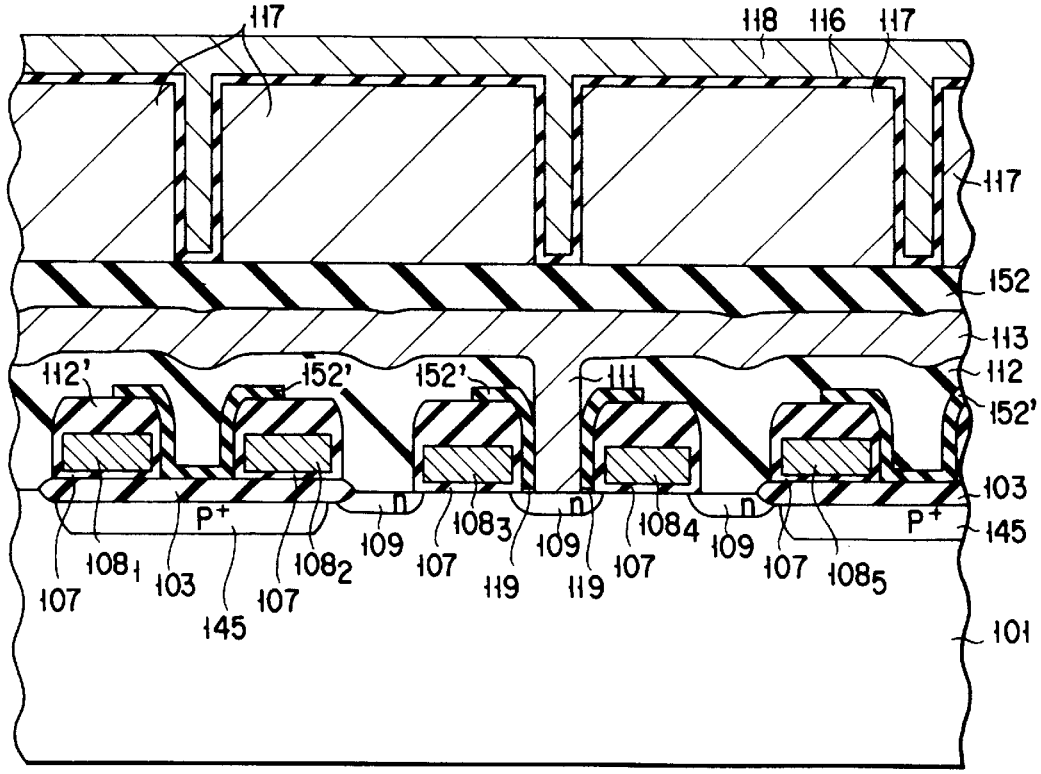
F I G. 24

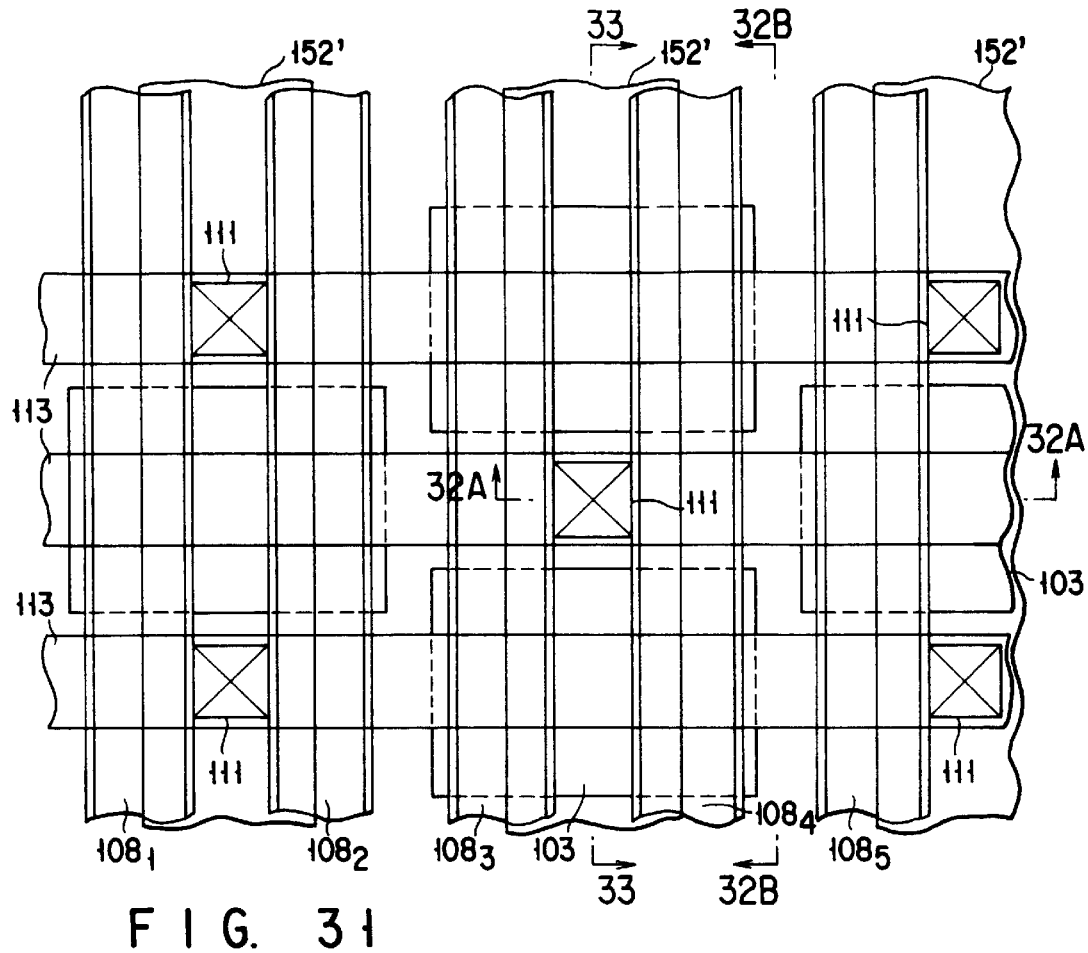
F I G. 31
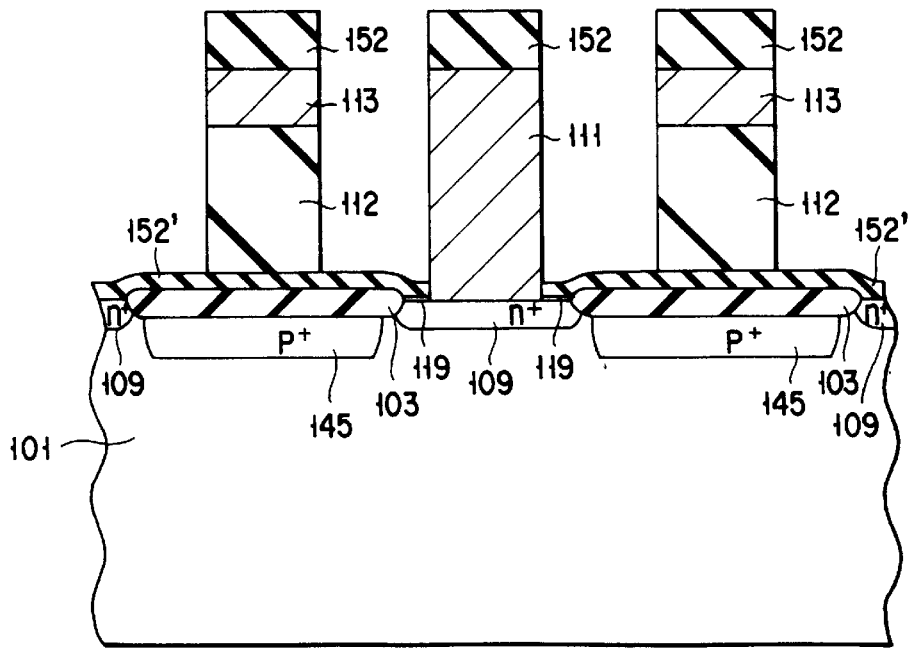
F I G. 33

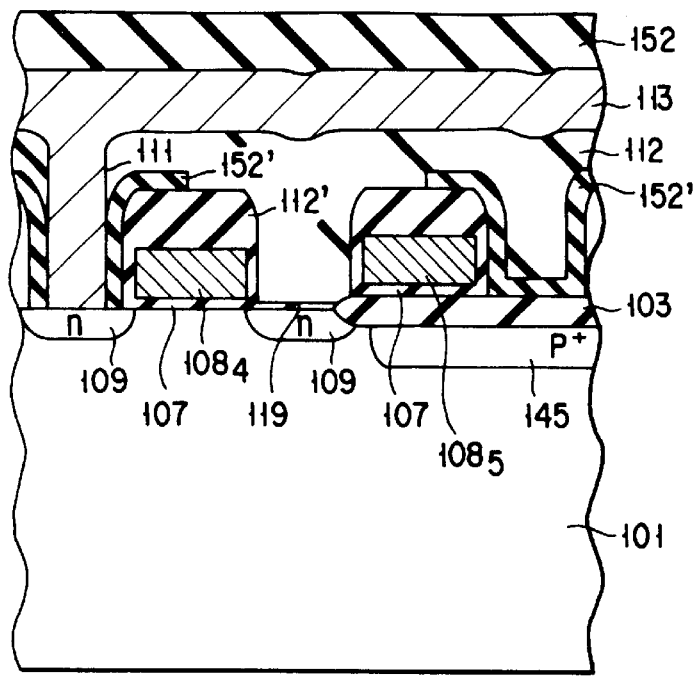
F I G. 32A
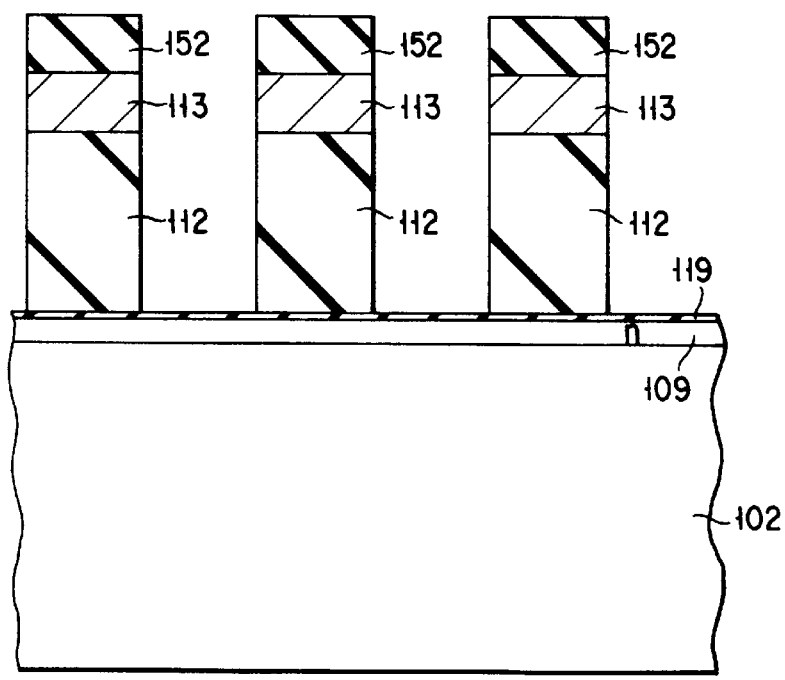
F I G. 32B

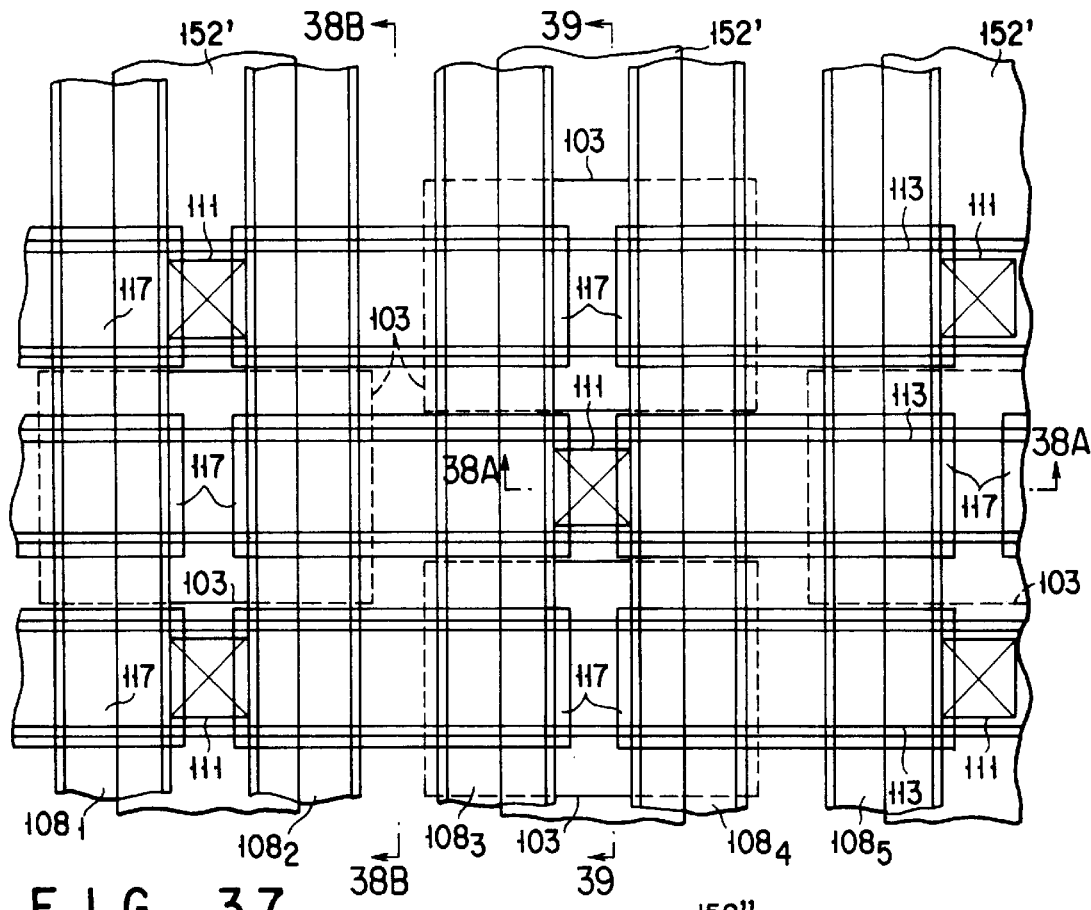
F I G. 37
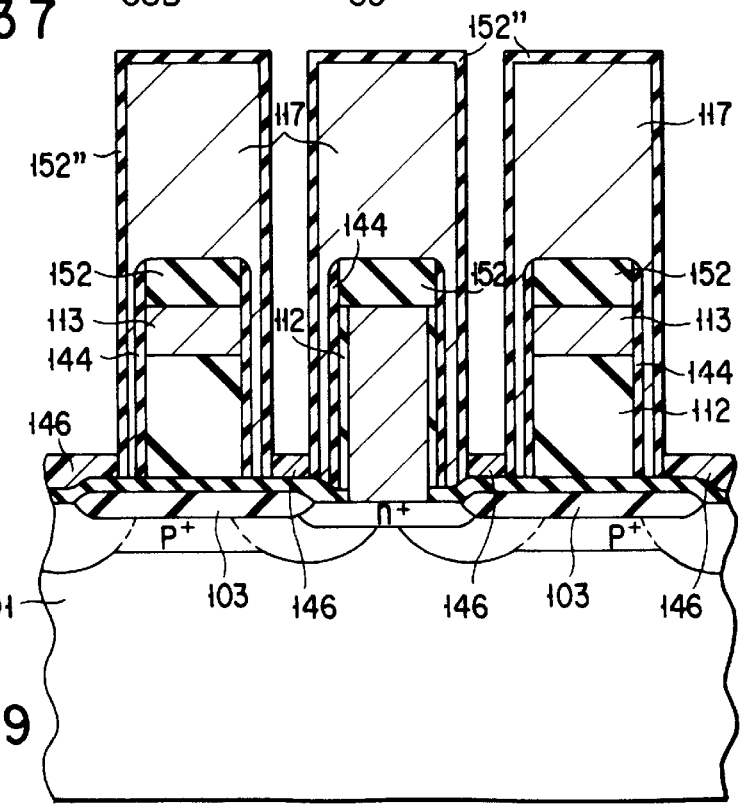
F I G. 39

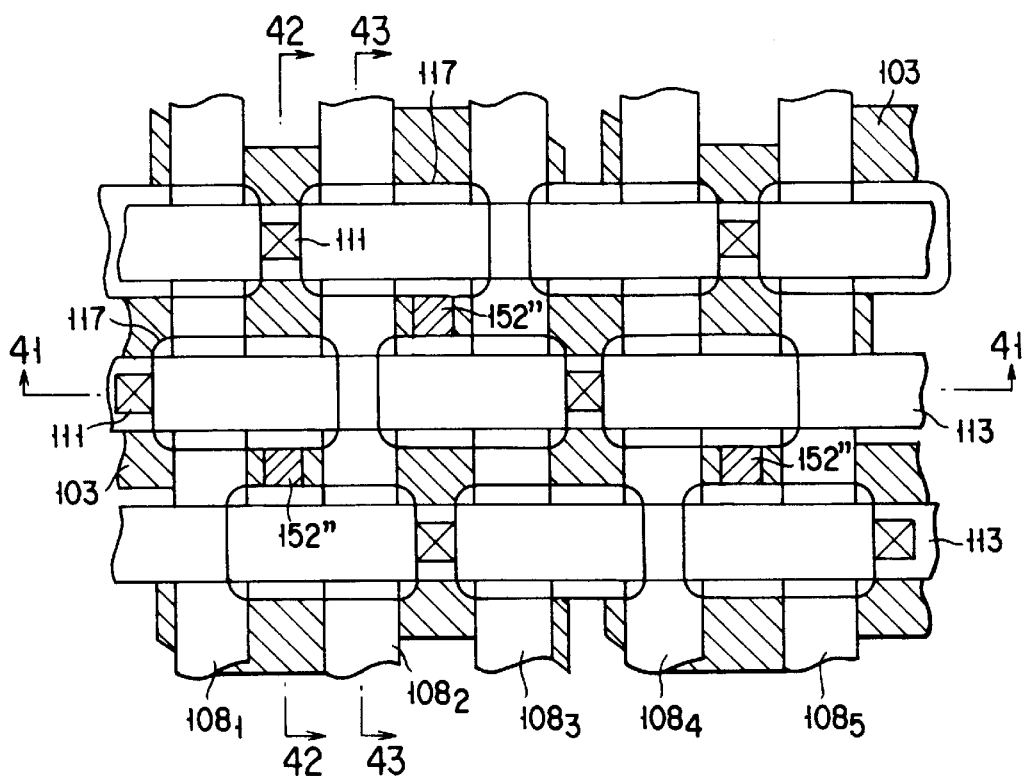
F I G. 40
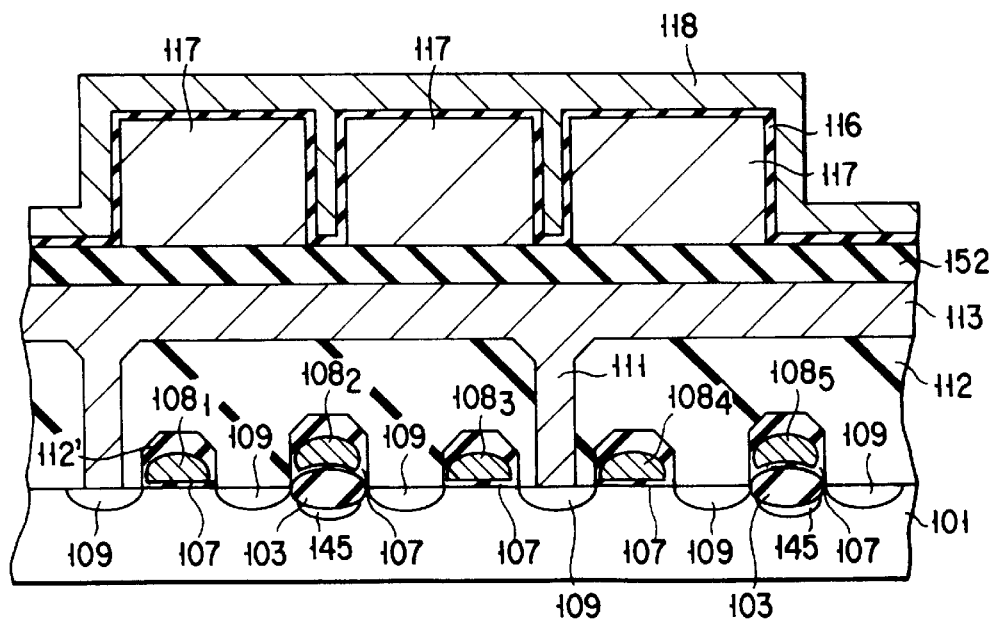
F I G. 41

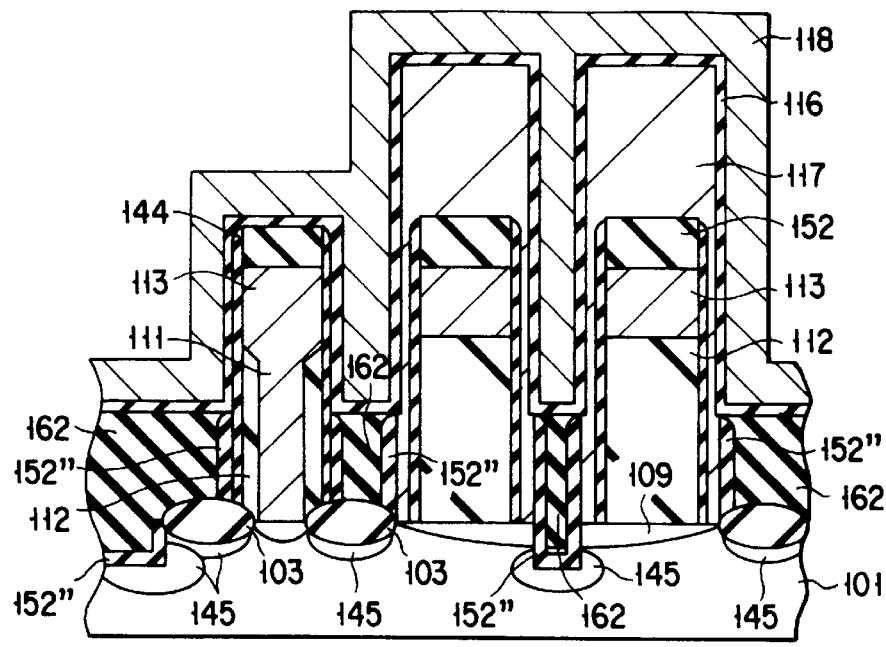
F I G. 42
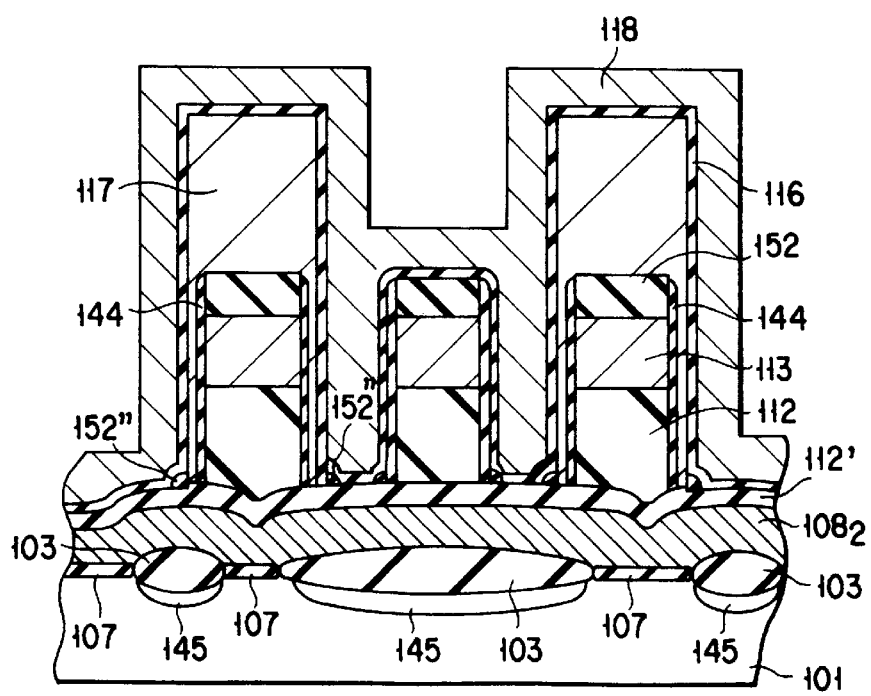
F I G. 43

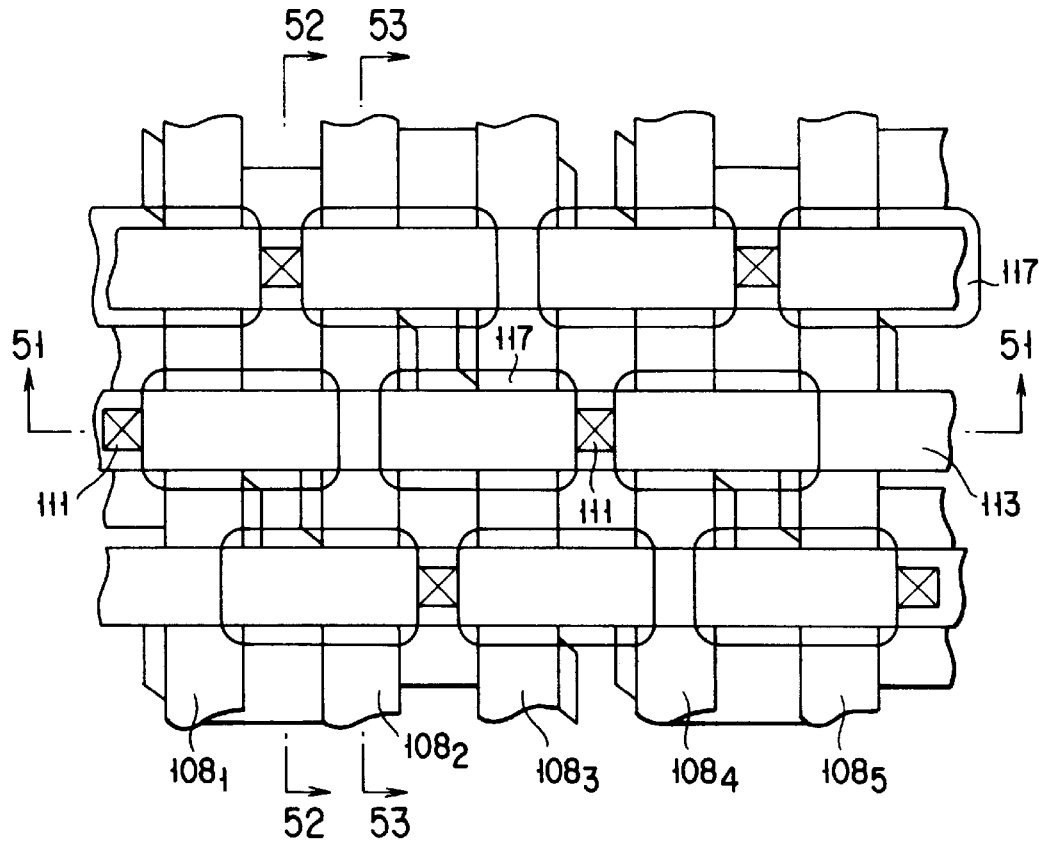
F I G. 50
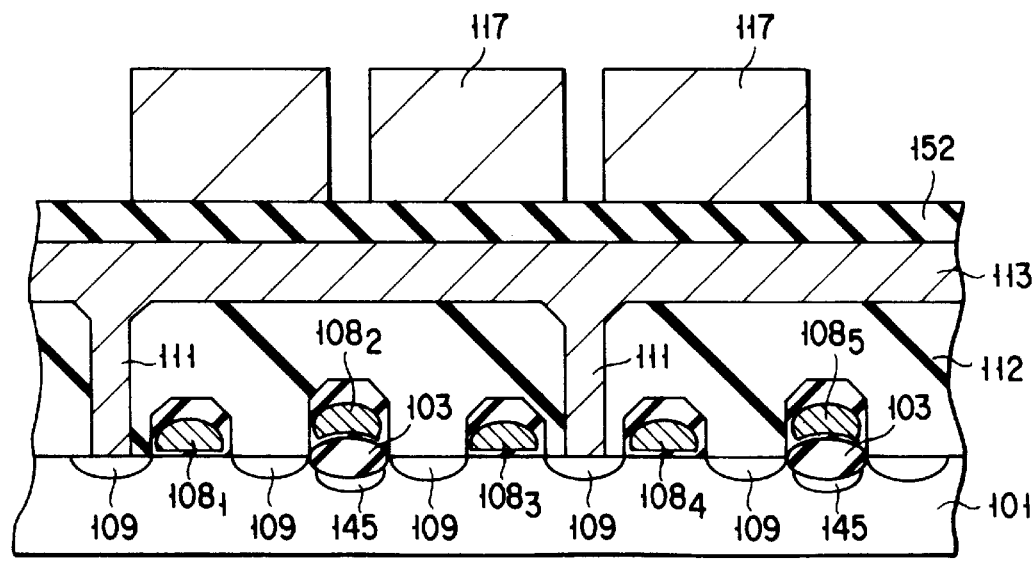
F I G. 51

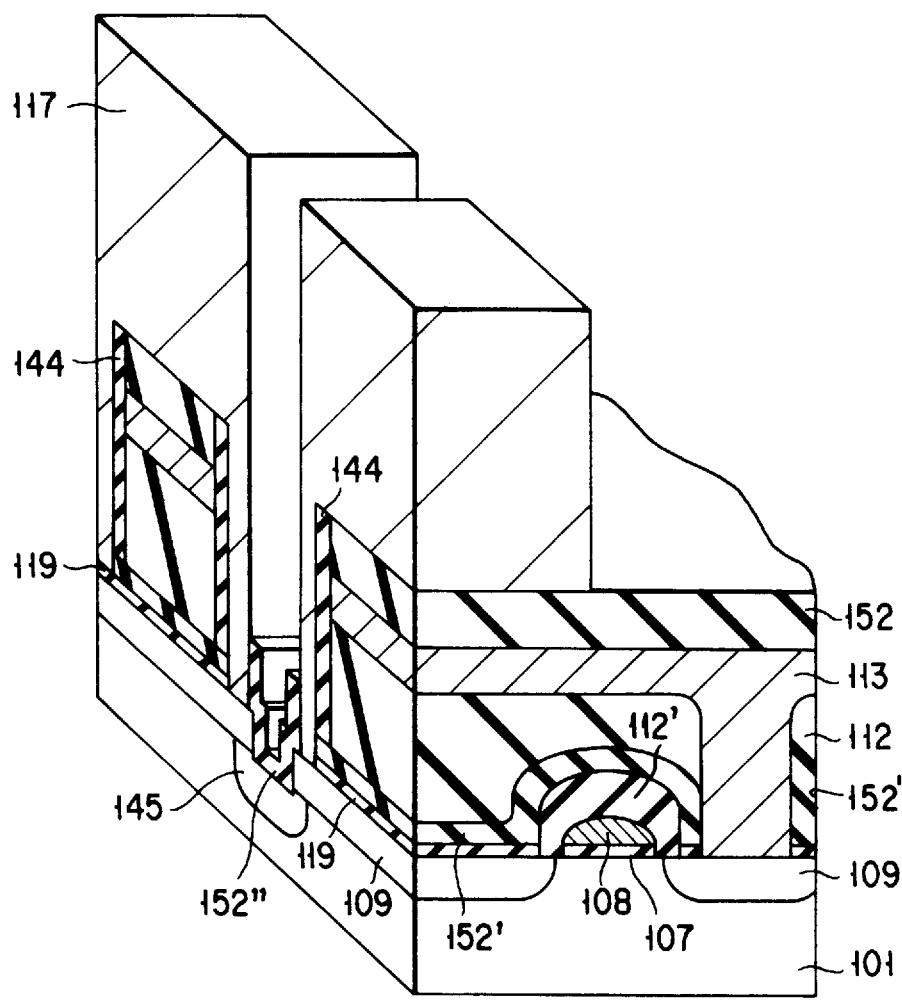
F I G. 54B

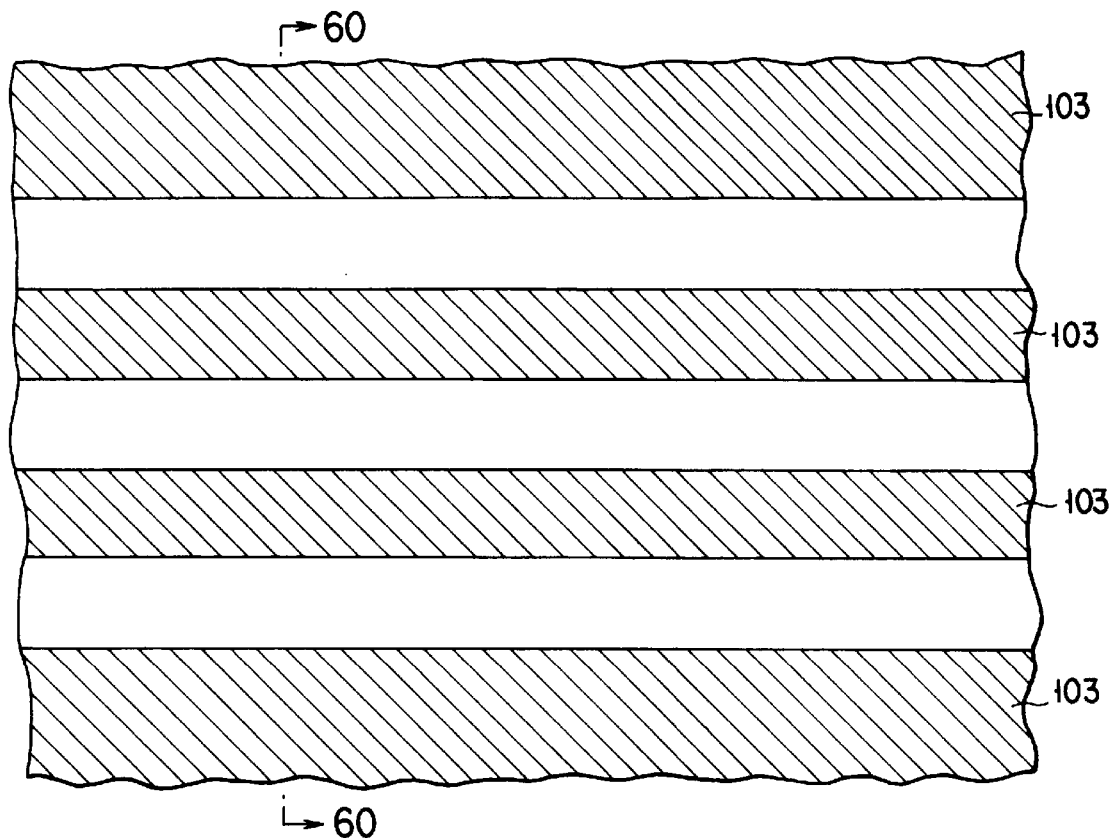
F I G. 59
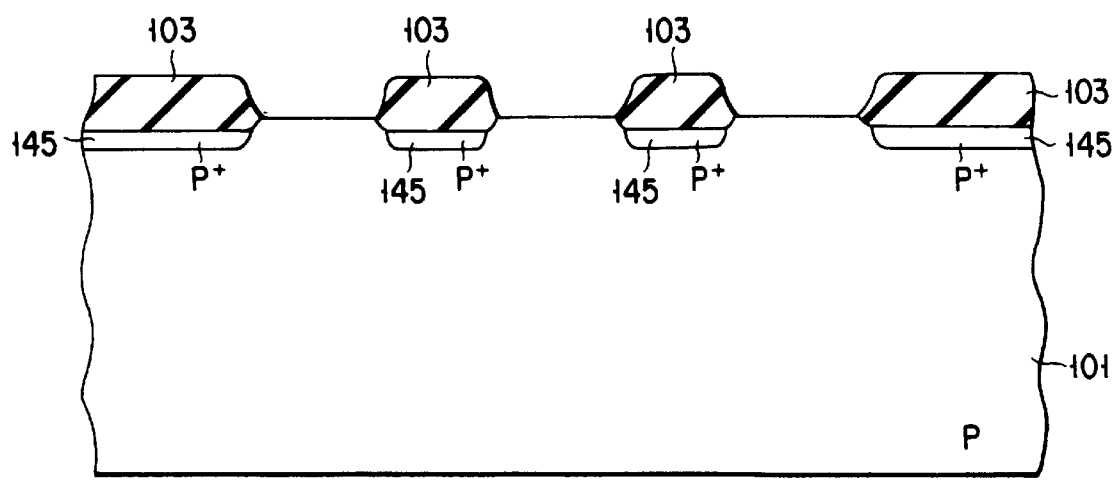
F I G. 60

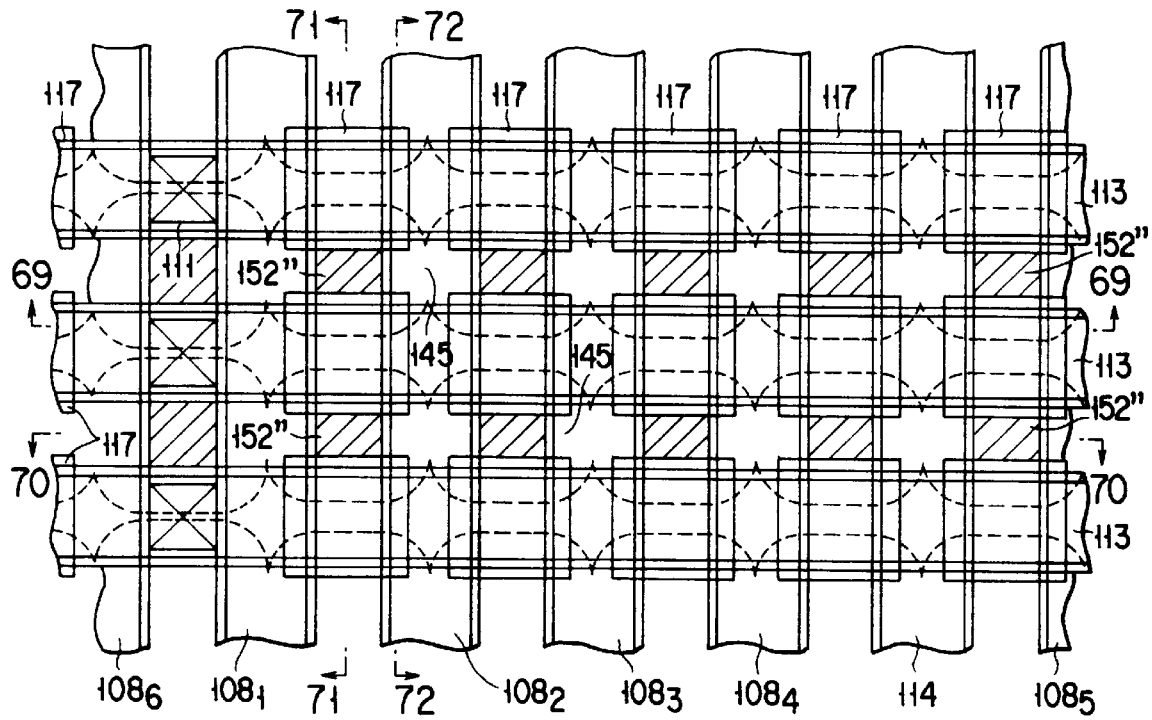
F I G. 68
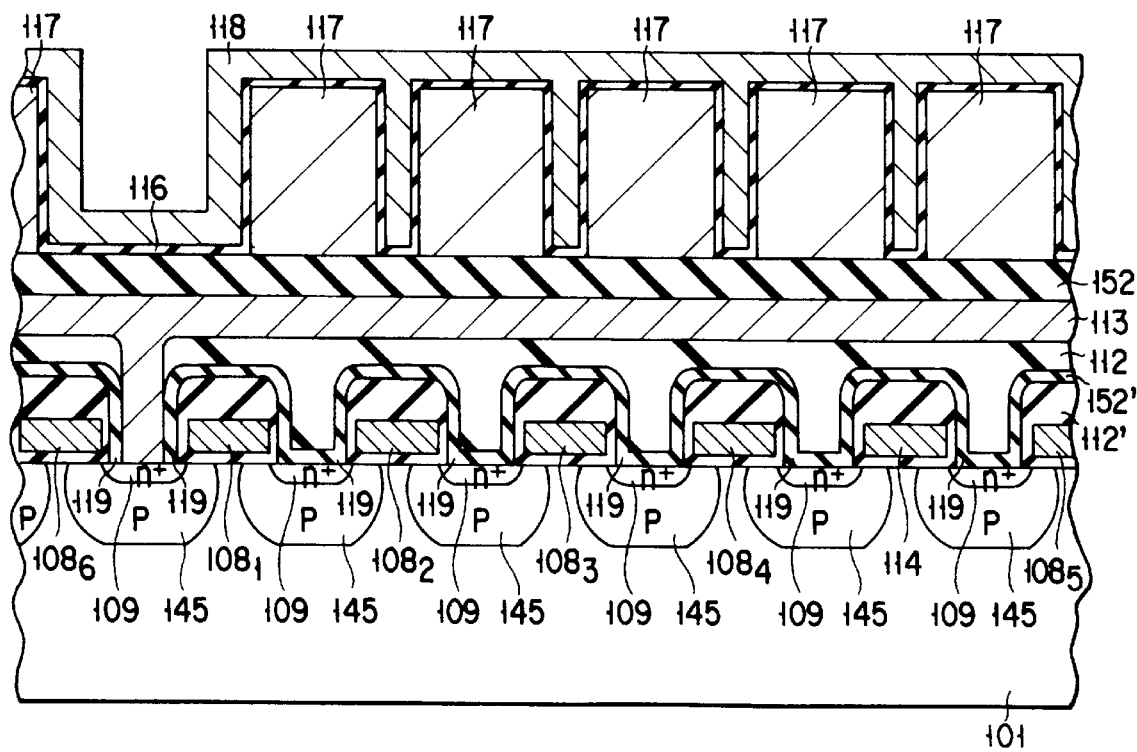
F I G. 69

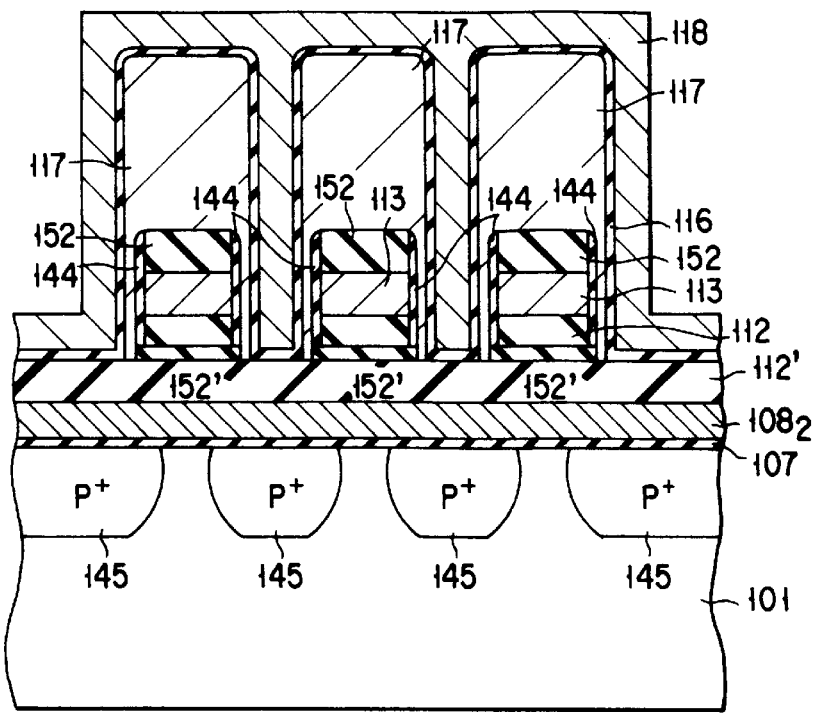
F I G. 72
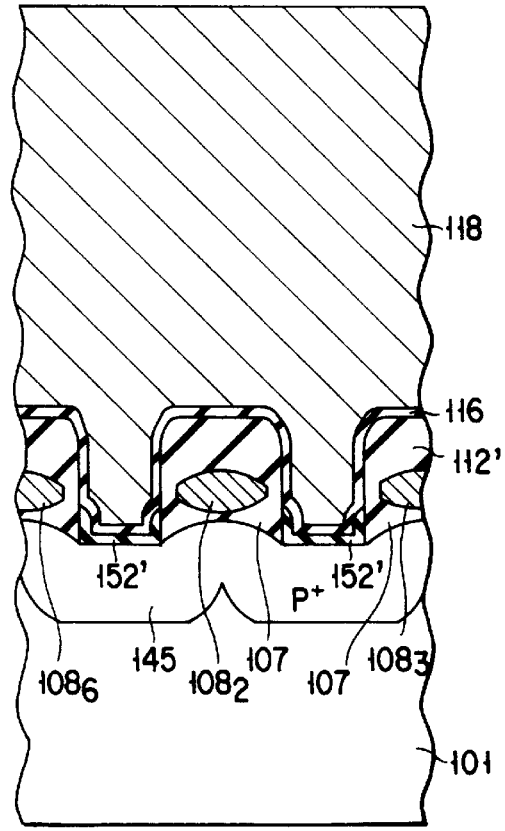
F I G. 73

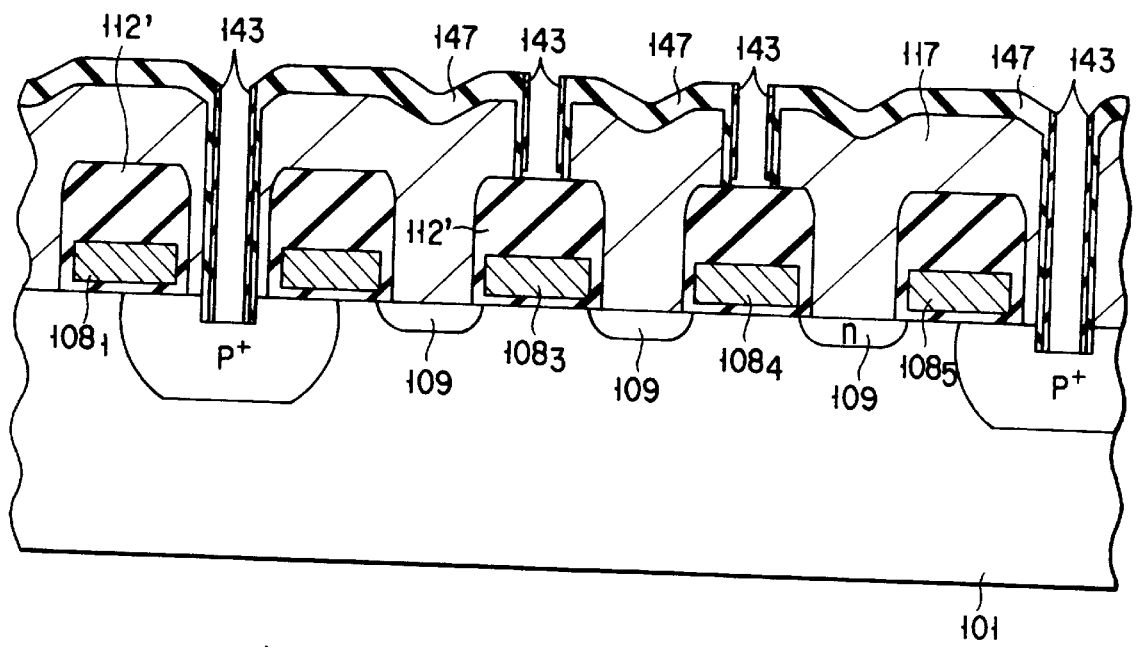
F I G. 78

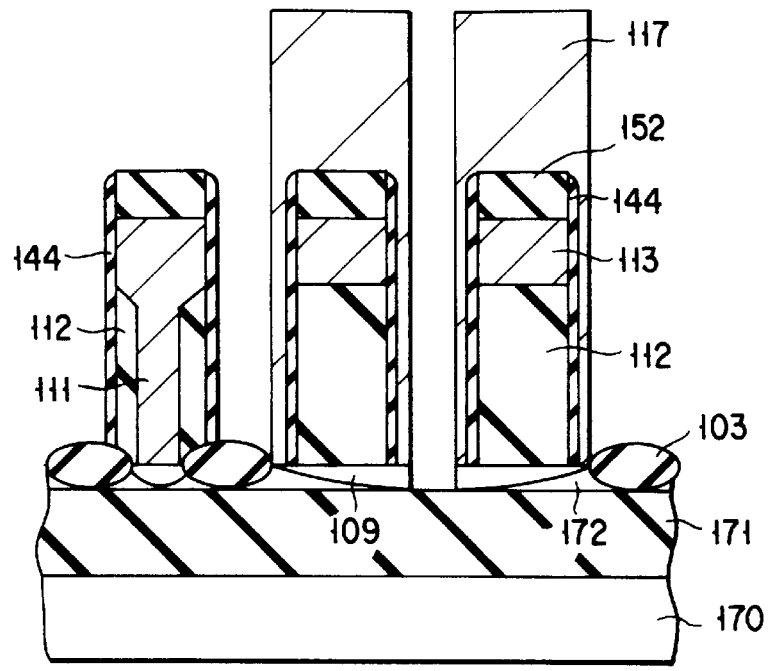
F I G. 91
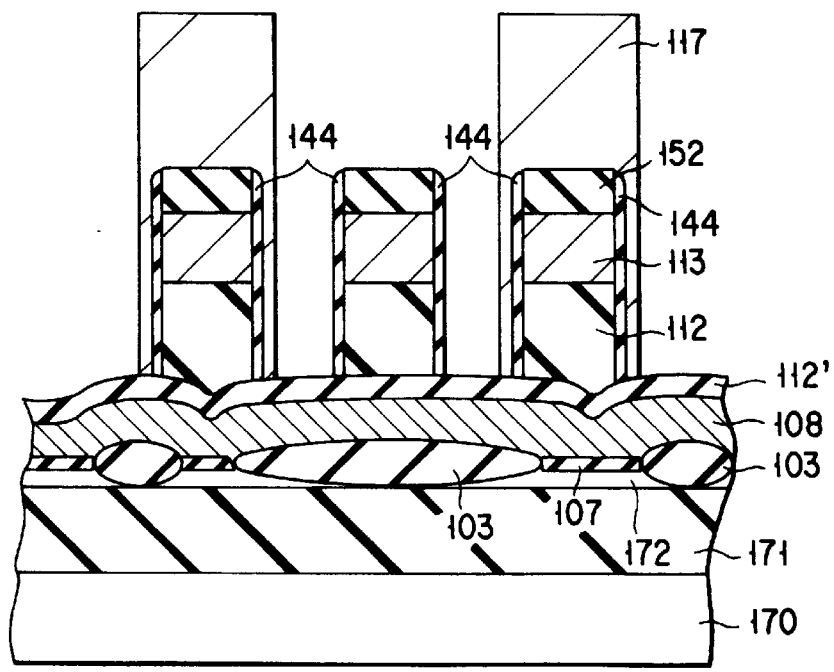
F I G. 92

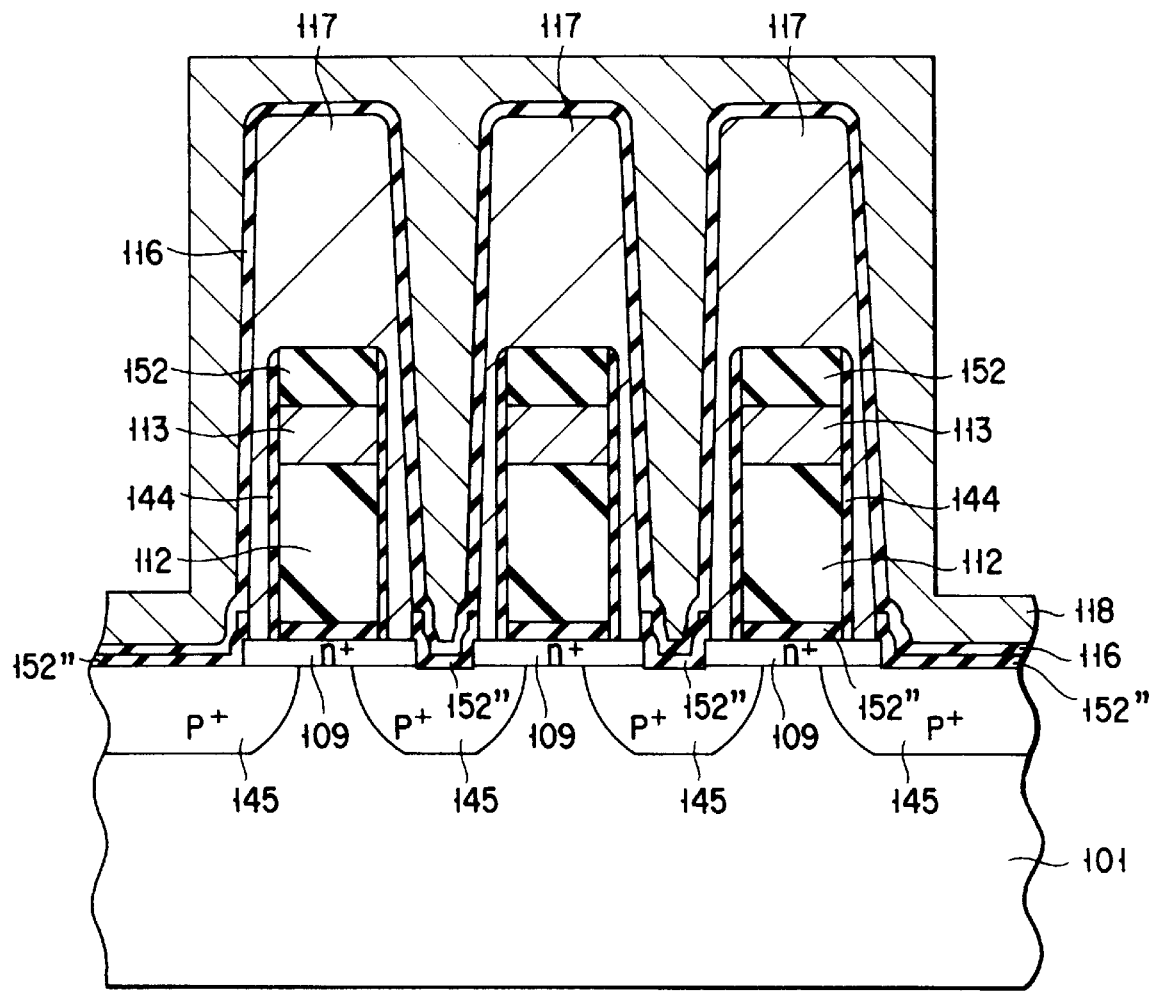
F I G. 95

SEMICONDUCTOR MEMORY DEVICE AND MANUFACTURING METHOD THEREOF

This application is a Continuation of application Ser. No. 08/528,137, filed on Sep. 14, 1995, now abandoned.

BACKGROUND OF THE INVENTION

1. Field of the Invention

The present invention relates to a semiconductor memory device and more particularly to a DRAM and manufacturing method thereof.

2. Description of the Related Art

In recent years, development of a semiconductor memory device such as a DRAM as a memory device has been advanced. The reason is that there are advantages in which the semiconductor memory device has no mechanical driving part, and is strong against impact, and a high speed access can be executed.

Improvement of performance of the semiconductor memory device can be realized by increasing degree of integration, that is, making finer a memory cell. More specifically, in order to realize a semiconductor memory cell having a smaller area as maintaining a capacity of a capacitor for data storage, there has been proposed and realized a device having a trench capacitor or a stacked capacitor.

Moreover, in order to reduce a memory cell area, there has been proposed a memory cell array, which is called as NAND type memory cell array having a structure in which a plurality of MOS transistors are connected in series and capacitors for data storage are connected to sources (or drains) of these MOS transistors, respectively.

As compared with a memory device in which a plurality of memory cells are not connected in series, the NAND type memory device has advantages that the number of contacts with bit lines is small and a cell area can be reduced. Such an NAND type trench memory cell has been proposed in e.g., Japanese patent application KOKAI publication No. 5-201554.

However, in the conventional NAND type memory cell array in which an element isolation insulating film and a trench are prepared by a different mask, the following problems occur as high degree of integration advances.

FIG. 1 is a plan view showing an area corresponding to substantially one cell of of an NAND type memory cell array of a conventional DRAM. In the drawing, reference numeral 209 denotes an n type source/drain diffusion layer, 208: a gate electrode, 203: an element isolation insulating film, 204: a trench having a capacitor, and 210: a conductive pad for connecting a trench capacitor electrode to the n type source/drain diffusion layer 209.

In the conventional manufacturing method, after the element isolation insulating film 203 is formed by LOCOS (local oxidation of silicon), the trench 204 is formed by a different mask pattern from the element isolation insulating film 203. Then, a collar oxidation film (not shown) is formed on an upper portion of the trench 204.

Then, if a misalignment is generated between the mask pattern used in preparing the element isolation insulating film 203 and the the mask pattern used in preparing the trench 204, it is difficult to maintain a residual width x of the n type source/drain diffusion layer 209 constant. Such a problem becomes conspicuous as the degree of integration advances.

Then, as the residual width x becomes short, a contact resistance between the source (drain) of the MOS transistor and the trench capacitor electrode increases. Due to this, it is difficult to stably read/write data (electrical charge) of the trench capacitor.

Moreover, in the conventional manufacturing method, since the element isolation insulating film 203 is formed by LOCOS, the thickness of the element isolation insulating film 203 becomes thick. Due to this, there is generated a difference in level between the element isolation insulating film 203 and a surface of a substrate. As a result, resolution of photo-lithography in forming the trench 204 is deteriorated, and it is difficult to form the trench having a desirable shape. Therefore, it is difficult to realize a deposited film having a uniform thickness of film and a uniform electrical field in the interior of the trench. Moreover, reliability of the trench capacitor can not be easily reserved.

These problems also occur in highly integrating a non-NAND type memory cell array in which the element isolation insulating film 203 and the trench 204 are formed by the different mask pattern.

FIG. 2A is a plan view showing an area corresponding to two parallel memory cells of the NAND type memory cell of a conventional stacked capacitor. In the drawing, reference numeral 209 denotes an n type source/drain diffusion layer, 208: a gate electrode, 203: an element isolation insulating film, and 217: a stacked capacitor storage node electrode.

In the conventional manufacturing method, after the element isolation insulating film 203 is formed by LOCOS, the the stacked capacitor storage node electrode 217 is formed by a different mask pattern from the element isolation insulating film 203. Then, if a shift of adjustment is generated between the mask pattern used in preparing the element isolation insulating film 203 and the the mask pattern used in preparing the stacked capacitor storage node electrode 217 as shown in FIG. 2B, it is difficult to maintain a isolation width x between the n type source/drain diffusion layer 209 and the stacked capacitor storage node electrode 217. Such a problem becomes conspicuous as the degree of integration advances.

Then, if the isolation width x is 0 or less, the adjacent n type source/drain diffusion layers 209 are short-circuited each other through the stacked capacitor storage node electrode 217, an electrical isolation between the adjacent memory cells cannot be performed. Such a problem is considerably generated in a high density memory cell in which the level of the stacked capacitor node electrode 217 is high and accuracy of alignment between the stacked capacity storage node electrode 217 and the element isolation insulating film 203 cannot be easily reserved.

These problems also occur in highly integrating the non-NAND type memory cell in which the element isolation insulating film 203 and the stacked capacitor storage node electrode 217 are formed by the different mask pattern.

As mentioned above, the following problem was generated in the conventional memory cell using the trench capacitor.

More specifically, as the memory cell is made fine, the contact resistance between the MOS transistor and the trench capacitor electrode increases by the misalignment between the element isolation insulating film and the trench. As a result, stable reading and writing of data becomes difficult.

Also, the following problem was also generated in the conventional memory cell using the stacked capacitor More specifically, as the memory cell is made finer, the electrical isolation between the adjacent memory cells cannot be easily performed by the misalignment between the element isolation insulating film and the stacked capacitor storage node electrode.

SUMMARY OF THE INVENTION

A first object of the present invention is to provide a semiconductor memory device using a trench capacitor, which can prevent misalignment between an element isolation insulating film and a trench even if a memory cell is fined, and its manufacturing method.

A second object of the present invention is to provide a semiconductor memory device using a capacitor, which can prevent misalignment between an element isolation insulating film and a stacked capacitor storage node electrode even if a memory cell is fined, and its manufacturing method.

In order to attain the above objects, according to a first aspect of the present invention, there is provided a semiconductor memory device comprises a semiconductor substrate having a plurality of trenches selectively formed on a main surface; a plurality of trench capacitors formed in the plurality of trenches, each of the trench capacitors formed of the semiconductor substrate, a capacitor insulating film formed on a surface of each of the trenches, and a storage node electrode buried in each of the trenches interposing the capacitor insulating film; a plurality of transistors, formed on the main surface of the semiconductor substrate, for forming a plurality of memory cells in relation to the plurality of trench capacitors, each of the plurality of transistors having a gate electrode formed on the semiconductor substrate interposing a gate insulating film and source and drain regions formed in the semiconductor substrate on both sides of the gate electrode, respectively; a plurality of element isolation insulating films formed on side surfaces of upper portions of the plurality of trenches to surround the circumference of the trenches, respectively, the plurality of element isolation insulating films having adjacent ones of the insulating films selectively coupled to each other such that at least one of the transistors is electrically insulated from another one of the transistors; and a plurality of conductive members, each connecting one of the source and drain regions of each of the plurality of transistors to the storage node electrode of a corresponding one of the plurality of the capacitors.

The above-described plurality of the element isolation insulating films are formed in a self-alignment manner along side surfaces of the plurality of the trenches, respectively, and a depth of the element isolation insulating film in a direction along the side surface is larger than a thickness of the element isolation insulating film in a direction perpendicular to the side surface.

The plurality of element isolation insulating films may be formed of a two-layered insulating film. In a case where the insulating film is formed by two layers, the two-layered insulating film can be formed on each of inner and outer sides of the trench along the side surface of the trench.

The plurality of trenches are arranged in rows and columns, and the element isolation insulating films formed in the trenches are coupled to each other in a column direction so as to form a plurality of element isolation areas. The plurality of transistors are formed in an area sandwiched by the adjacent two element isolation areas of the plurality of element isolation areas, and the adjacent transistors use one source and drain region in common, so that the plurality of transistors are connected in cascade. Thereby, an NAND type DRAM can be formed.

According to a manufacturing method of the semiconductor memory device of the first aspect, there is provided a method for manufacturing a semiconductor memory device comprising the steps of: selectively forming a plurality of first trenches on a semiconductor substrate; and oxidizing the substrate of a side surface of an upper portion of the plurality of first trenches to form a plurality of element isolation insulating films on the substrate, thereby selectively coupling the element isolation insulating films corresponding to the adjacent ones of the trenches to form a plurality of element forming areas isolated by the element isolation insulating films. Moreover, the above method further comprises the steps of: forming storage node electrodes in the plurality of first trenches interposing capacitor insulating films, respectively, to form a plurality of capacitors; forming a plurality of transistors each having a gate electrode formed interposing a gate insulating film, and source and drain regions formed in the semiconductor substrate on both sides of the gate electrode, respectively, in the plurality of element forming areas; and forming a plurality of conductive members for connecting the storage node electrode to one of the source and drain regions of the transistors, correspondingly. Thereby, a DRAM can be formed.

The step of forming the plurality of element isolation insulating films may include a step of oxidizing all inner surfaces of the trenches to open a bottom surface of each of the trenches, and to form a second trench.

Moreover, the above-described method may further comprises the steps of: etching back the storage node electrode of the upper portions of the plurality of first trenches and the capacitor insulating films to have a predetermined depth, respectively; burying upper layer insulating films into concave portions formed by the etching back step, respectively; and forming openings in the upper layer insulating films to form second element isolation insulating films along the inner surfaces of the trenches, respectively.

According to a second aspect of the present invention, there is provided a semiconductor memory device comprising: a semiconductor substrate; a plurality of transistors formed on the semiconductor substrate, the transistors each having a gate electrode formed on the semiconductor substrate interposing a gate insulating film, and source and drain regions formed in the semiconductor substrate on both sides of the gate electrode, respectively; a plurality of layered capacitors formed on the plurality of transistors in an insulation manner, respectively, the capacitors having storage node electrodes formed on the transistors in an insulation manner, capacitor insulating films formed on the storage node electrode, and plate electrodes formed on the capacitor insulating films, respectively; a plurality of word lines, arranged substantially in parallel, each selectively connected to the gate electrode of each of the plurality of the transistors; a plurality of bit lines, arranged substantially in parallel, each selectively connected to one of the source and drain regions of the plurality of transistors, and formed to be substantially perpendicular to a direction where the word lines are arranged; and a plurality of element isolation insulating film formed on the semiconductor substrate between adjacent one of the transistors in a direction where the bit lines are arranged, wherein a distance between adjacent ones of the storage node electrodes in the direction where the bit lines are arranged is adjusted in such a manner that a distance at an uppermost portion of each of the storage node electrodes is not smaller than a distance at a surface of the substrate.

The distance between adjacent ones of the storage node electrodes in the direction where the bit lines are arranged is adjusted to the constant throughout a range from the surface of the substrate to the uppermost portion of each of the storage node electrodes, or to have a gradual change in such a manner that the distance at the uppermost portion of each of the storage node electrodes is greater than the distance at the surface of the substrate.

Each of the element isolation insulating films has a portion formed on a side surface of a lower section of each of the storage node electrodes. Each of the element isolation insulating films is provided between adjacent ones of the source and drain regions in the direction where said bit lines are arranged.

The element isolation films are coupled to another kind of element isolation means to selectively isolate forming areas of the plurality of transistors. The other element isolation means may be an LOCOS film or a semiconductor layer of a predetermined conductive type having a predetermined impurity concentration.

The storage node electrode is formed to stride over the bit line, and connected to one of the source and drain regions at a lower portion of both sides of the bit line. The bit lines have insulating films on their upper and lower surfaces and side walls to be insulated from the storage node electrode.

According to a manufacturing method of the semiconductor memory device of the second aspect, there is provided a method for manufacturing a semiconductor memory device comprising the steps of: forming a plurality of gate electrodes on a semiconductor substrate with gate insulating films interposed therebetween, respectively; forming source and drain regions on the semiconductor substrate on both sides of the plurality of gate electrodes, respectively, to form a plurality of transistors; forming an insulating film on upper and side surfaces of each of the plurality of the gate electrodes; forming a conductive film on an entire surface of the substrate where the transistors are formed; patterning the conductive film by anisotropic etching to form storage node electrodes on the transistors, respectively; forming a plurality of bit lines selectively connected to one of the source and drain regions of the plurality of transistors; exposing surfaces of the substrate between the storage node electrodes being adjacent in a direction where the plurality of bit lines are arranged; forming element isolation insulating films on the surfaces exposed on the substrate, respectively; and forming plate electrodes on the storage node electrode with a capacitor insulating films interposed therebetween respectively.

The step of forming the storage node electrodes includes a step of adjusting a distance between the storage node electrodes being adjacent in a direction where the bit lines are arranged to have a gradual change in such manner that a distance at an uppermost portion of each of the storage node electrodes is greater than a distance at a surface of the substrate, or to be constant throughout a range from a surface of the substrate to an uppermost portion of each of the storage node electrodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below serve to explain the principles of the invention.

FIG. 1 is a schematic plan view explaining a problem of an NAND type DRAM using a conventional trench capacitor;

FIGS. 2A and 2B schematic plan views explaining a problem of an NAND type DRAM using a conventional stacked capacitor;

FIGS. 4 to 7 are cross sectional views taken along line 4—4, 5—5, 6—6 and lines 7—7 of FIG. 3, respectively.

FIGS. 8A, 8B to 11A, 11B are cross sectional views stepwise showing the manufacturing steps of the cell array of the NAND type DRAM using the trench capacitor of the first embodiment of the present invention, respectively, FIGS. 8A, 9A, 10A, and 11A correspond to the cross section taken along line 5—5 of FIG. 3, and FIGS. 8B, 9B, 10B, and 11B correspond to the cross section taken long line 7—7 of FIG. 3, respectively;

FIG. 12 is a cross sectional view of a cell array of an NAND type DRAM of a second embodiment of the present invention, taken along a line which is parallel to a bit line but does not include the bit line;

FIG. 13 is a cross sectional view of a cell array of an NAND type DRAM of a third embodiment of the present invention, and this figure corresponds to FIG. 5 of the first embodiment;

FIGS. 14 and 15 are cross sectional views of the cell array of the NAND type DRAM of the third embodiment of the present invention, and these figures correspond to the cross sectional views showing a state in the course of the steps of FIGS. 5 and 7 of the first embodiment, respectively;

FIG. 16 is a plan view of a DRAM cell array of a fourth embodiment of the present invention;

FIGS. 17 to 19 are cross sectional views taken along lines 17—17, 18—18, and 19—19 of FIG. 16, respectively;

FIGS 21A and 21B are plan views showing other plane shapes of a trench and an element isolation insulating film which can be applied to the first to third embodiments, and their connection forms, respectively;

FIGS. 22A and 22B are plan views showing other plane shapes of a trench and an element isolation insulating film which can be applied to the fourth and fifth embodiments, and their connection forms, respectively;

FIG. 23 is a plan view showing a cell array of a 2-cell 1-bit line contact type DRAM using a stacked capacitor of a sixth embodiment of the present invention;

FIGS. 24 to 26 are across sectional views taken along lines 24—24, 25—25, and 26—26 of FIG. 23, respectively;

FIG. 31 is a plan view showing a manufacturing step of a third stage of the cell array of the 2-cell 1-bit line contact type DRAM using the stacked capacitor of the sixth embodiment of the present invention;

FIGS. 32A, 32B, and 33 are cross sectional views showing the manufacturing step of the third stage of the cell array of the 2-cell 1-bit line contact type DRAM using the stacked capacitor of the sixth embodiment of the present invention, taken along lines 32A—32A, 32B—32B, and 33—33 of FIG. 31, respectively;

FIG. 37 is a plan view showing a manufacturing step of a fifth stage of the cell array of the 2-cell 1-bit line contact type DRAM using the stacked capacitor of the sixth embodiment of the present invention;

FIGS. 38A, 38B, and 39 are cross sectional views showing the manufacturing step of the fifth stage of the cell array of the 2-cell 1-bit line contact type DRAM using the stacked capacitor of the sixth embodiment of the present invention, taken along lines 38A—38A, 38B—38B and 39—39 of FIG. 37, respectively;

FIG. 40 is a schematic plan view showing a cell array of a 2-cell 1-bit line contact type DRAM of a seventh embodiment of the present invention;

FIGS. 41, 42, and 43 are cross sectional views of the DRAM cell array of the seventh embodiment of the present invention, and these figures are cross sectional views taken along lines 41—41, 42—42, and 43—43 of FIG. 40, respectively;

FIG. 50 is a plan view showing a manufacturing step of a third stage of the DRAM cell array of the seventh embodiment of the present invention;

FIG. 51, 52, and 53 are cross sectional views showing a manufacturing step of the third stage of the DRAM cell array of the seventh embodiment of the present invention, taken along lines 51—51, 52—52 and 53—53 of FIG. 50, respectively;

FIG. 54B is a perspective view showing the cross section taken along line, 54B—54B of FIG. 54 seen in a direction of an arrow;

FIG. 59 is a plan view showing a manufacturing step of a first stage of the DRAM cell array of the eighth embodiment of the present invention;

FIG. 60 is a cross sectional view showing a manufacturing step of the first stage of the DRAM cell array of the eighth embodiment of the present invention;

FIG. 68 is a plan view of an NAND type DRAM cell of a ninth embodiment of the present invention;

FIG. 69 to 72 are cross sectional views taken along lines 69—69, 70—70, 71—71, and 72—72, respectively;

FIG. 73 is a cross sectional view showing a modification of FIG. 70;

FIGS. 76 to 78 are cross sectional views stepwise showing a manufacturing method of the DRAM cell array of the tenth embodiment, respectively, and these figures correspond to the cross sectional view taken along line 75—75, of FIG. 74;

FIGS. 90, 91, and 92 are cross sectional views showing a manufacturing step of the third stage of the DRAM cell array of the eleventh embodiment of the present invention, and these figures are cross sectional views takes along lines 90—90, 91—91, and 92—92, respectively;

FIG. 95 is a view showing an example in which anisotropic etching is performed for a storage node electrode forming such that a width of the storage node electrode becomes narrower as going upward, and the figure corresponds to the cross sectional view of FIG. 57 of the sixth embodiment.

DETAILED DESCRIPTION OF THE PREFERRED EMBODIMENTS

Figure 3:
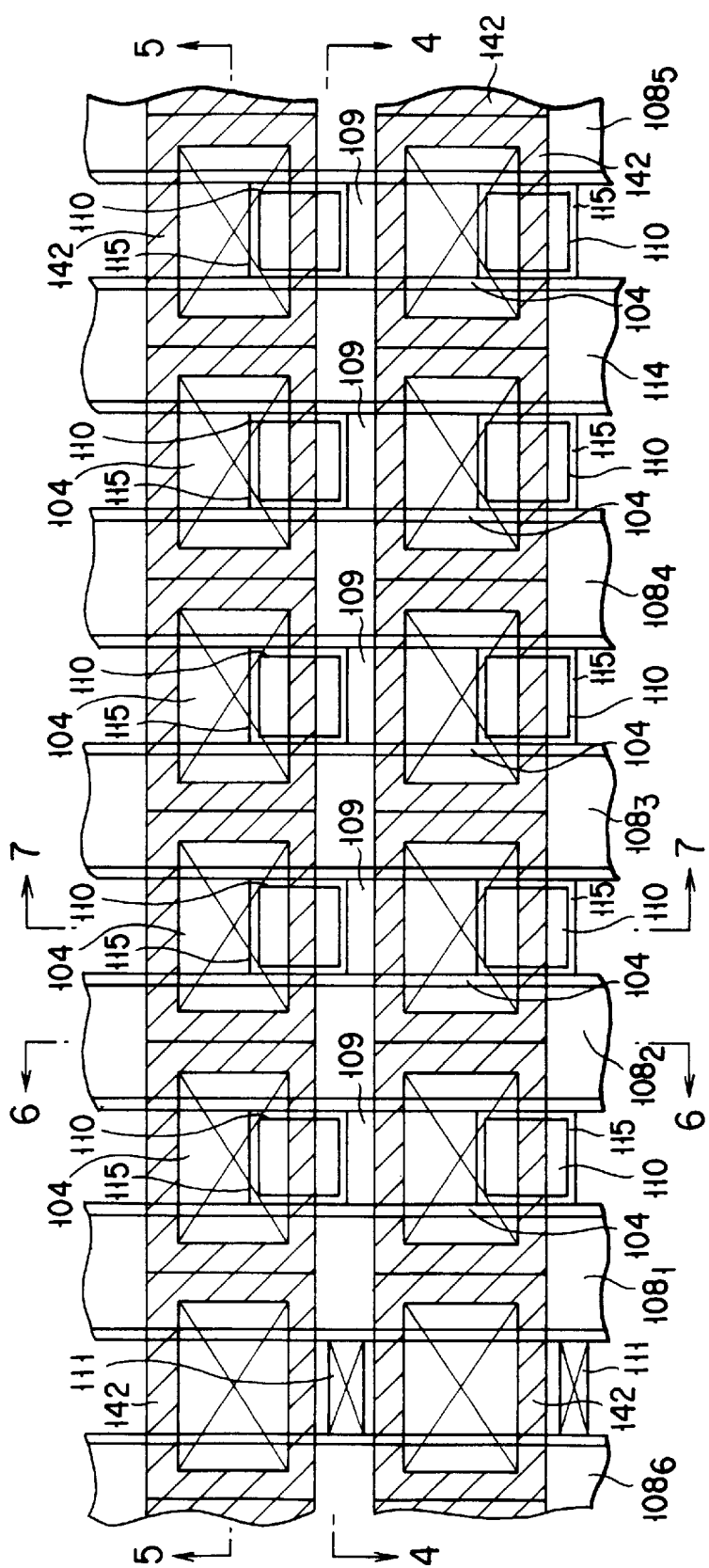
FIG. 3 is a schematic plan showing a cell array of an NAND type DRAM using a trench capacitor of a first embodiment of the present invention.

The following will explain embodiments of the present invention with reference to figures. It is noted that the same reference numerals are added to the portions common to all embodiments, and duplicated explanation will be omitted.

First Embodiment

FIG. 3 is a plan view showing a cell array of an NAND type DRAM using a trench capacitor of a first embodiment of the present invention. FIG. 3 schematically shows the relationship between elements in a form that various element layout patterns to be used in a memory cell array are overlapped. FIGS. 4 to 7 are cross sectional views taken along lines 4—4, 5—5, 6—6, and 7—7 of FIG. 3, respectively.

A memory cell area is formed in a wafer in which an epitaxial growth layer 102 is formed on a p type silicon substrate 101 having a high impurity concentration. An element forming area is divided by an element isolation insulating film 142 formed on a trench side surface (FIGS. 3, 6, 7). A trench capacitor storage node electrode 106 is buried in a trench 104 through a capacitor insulating film 105. More specifically, the p type silicon substrate 101 serves as a plate electrode of a MOS capacitor, and the MOS capacitor is formed of the p type silicon substrate 101, a capacitor insulating film 105, and the trench capacitor storage node electrode 106 (FIG. 7).

Figures 4, 5:
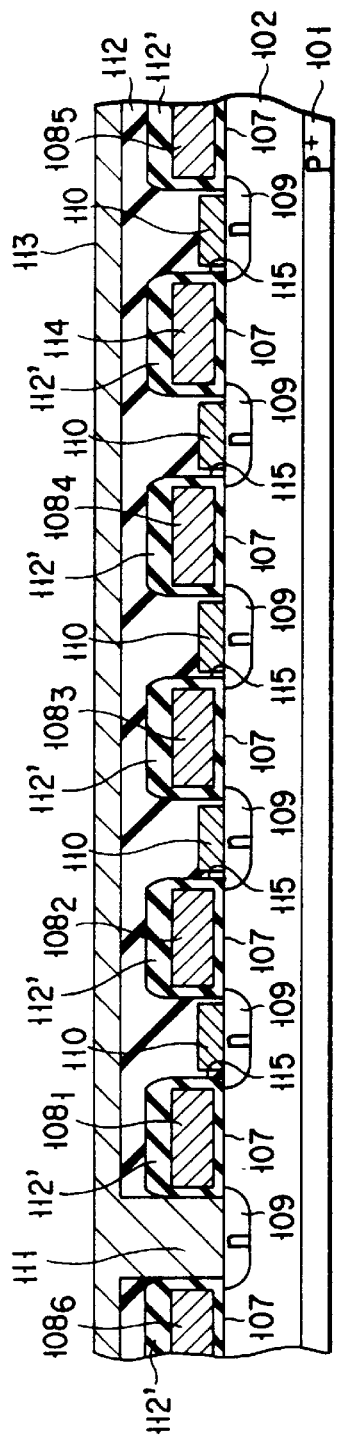

Each of the element isolation insulating films 142 is formed on a side surface of an upper portion of the trench 104 to surround the circumference of the trench 104 in a self-aligned manner against the trench 104 (FIG. 5). These element isolation insulating films 142 are connected to each other between the trenches in a direction of a bit line to be described later as shown by hatching of FIG. 3 in order to form an element forming area sandwiched by the insulting films. A transistor is formed in the element forming area.

Moreover, gate electrodes $108_1$ to $108_6$, and 114 are formed on the epitaxial growth layer 102 and an upper portion of the trench 104 with a gate insulating film 107 interposed therebetween (FIGS. 4, 5). The gate electrodes $108_1$ to $108_6$ and 114 are patterned in one direction to serve as a word line and a field shield isolation gate, respectively. An n type diffusion layer 109 is formed on both sides of the gate electrodes $108_1$ to $108_6$, and 114. The n type diffusion layer 109 is used as a source region and a drain region of a plane type MOS transistor, and is connected to the trench capacitor storage node electrode 106 through a conductive member (pad) 110 (FIGS. 4, 7).

Regarding the above-mentioned plane type MOS transistor, a plurality of transistors (four in this embodiment) are connected to each other in series, and the MOS capacitor having the trench capacitor storage node electrode 106 in the trench 104 is connected to a source region (or a drain region) of each MOS transistor. Thereby, an NAND type memory cell array is structured.

An interlayer insulating film 112 is formed on the p type silicon substrate 101 having such a structure, and a bit line contact path 111 is formed in the interlayer insulating film 112. Then, a part of the n type diffusion layer 109 is connected to a bit line 113 through the bit line contact path 111 (FIG. 4).

The following will explain the manufacturing method of the NAND type cell array with reference to FIGS. 8A, 8B, 11A, and 11B. These figures stepwise show the manufacturing steps, and FIGS. 8A, 9A, 10A, and 11A correspond to one portion of a cross section taken along line 5—5 of FIG. 3, and FIGS. 8B, 9B, 10B, and 11B correspond to one portion of a cross section taken along line 7—7 of FIG. 3.

First of all, as shown in FIGS. 8A and 8B, for example, a p type epitaxial growth layer 102 having boron concentration of $1 \times 10^{15}$ cm$^{-3}$ is formed on the p type silicon substrate 101 having boron concentration of $1 \times 10^{19}$ cm$^{-3}$. A thickness of the p type epitaxial layer 102 is set to, for example, 0.7 µm.

Next, boron is ion-implanted to the element forming area to form a well, and concentration of the p type epitaxial growth layer 102 of the element forming area is optimized. Then, the surface of the p type epitaxial layer 102 is oxidized to form a silicon oxide film having a thickness of, for example, 0.05 µm. Thereafter, for example, a silicon nitride film 131 having a thickness of 1 µm is formed on the silicon oxide film 130.

Next, the trench 104 is formed by photo-lithography and reactive ion etching. A depth from a boundary between the p type silicon epitaxial layer 102 of the trench 104 and the silicon oxide film 130 is set to, for example, 1 µm.

As shown in FIGS. 9A and 9B, an inner surface of the trench 104 is oxidized to form an element isolation oxide film 142. The element isolation oxide film 142 is formed to have a thickness enough to completely oxidize the substrate interposed between the adjacent trenches in the bit line direction.

In order to reserve the thickness of the insulating film and to prevent deterioration caused by thermal stress due to the thick oxidization film, after forming the element isolation insulating film 142, a silicon oxide film may be deposited thereon, and the insulating film may be anisotropically etched, thereby an insulating film is further formed on a side wall of the element isolation oxide film 142.

Figures 10A, 10B:
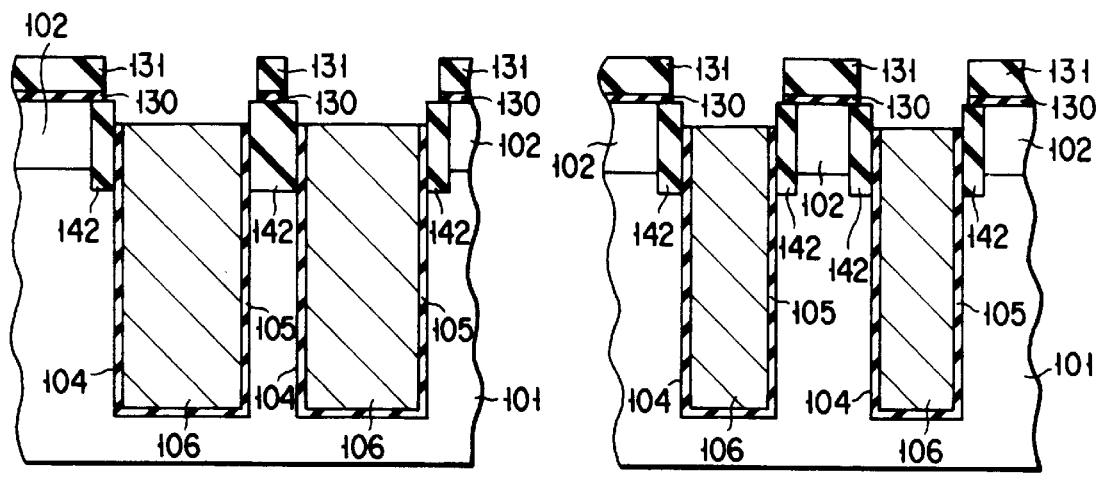

A next step is shown in FIGS. 10A an 10B. First, by reactive ion etching, an oxide film of a bottom surface of the element isolation oxide film 142 is removed until the surface of the p type silicon substrate 101 is exposed.

At this time, by selecting a condition of reactive ion etching, an etching speed of the side wall of the element isolation oxide film 142 can be controlled to be lower than an etching speed of the bottom surface.

Next, by reactive ion etching, a trench is further formed on the p type silicon substrate 101. The depth of the trench is set to, for example, 5 µm. Thereafter, in order to reduce a resistance value of a substrate plate electrode of the trench, impurity material such as boron may be ion-implanted to the trench.

Then, the capacitor insulating film 105 is formed on an inner wall of the trench 104, and a first polycrystalline silicon film, serving as a trench capacitor storage node electrode 106, is deposited on the entire surface.

The capacitor insulating film 105 is formed of, for example, a layered film of silicon oxide film/silicon nitride film/silicon oxide film (effective film thickness: 10 nm). Moreover, the resistance of the first polycrystalline silicon film is lowered by ion-implantation of, for example, arsenic (As).

Next, by chemical dry etching, the first polycrystalline silicon film is etched back to be left in the trench 104, and the trench capacitor storage node electrode 106 is formed. Thereafter, the capacitor insulating film 105, which is exposed on the silicon nitride film 131, the silicon oxide film 130, and the element isolation insulating film 142, is removed by chemical dry etching. Thereby, the structure shown in FIGS. 10A and 10B is formed.

Then, the silicon oxide film is deposited on the entire surface until the surface of the substrate is smoothed. Thereafter, the layered silicon oxide film is etched back by chemical dry etching, and a cap insulating film 142' is formed on an upper portion of the trench 104.

Figures 11A, 11B:
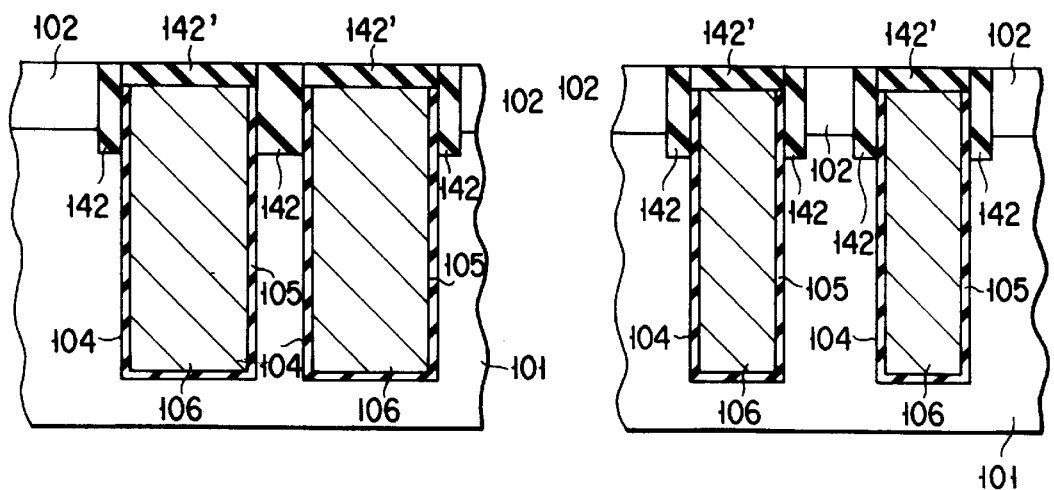

Thereafter, the silicon nitride film 131, serving as a trench mask, is removed by reactive ion etching, and the silicon oxide film 130, serving as a trench mask, is removed by chemical etching. Thereby, the structure shown in FIGS. 11A and 11B is formed.

Though the following steps are not shown in the drawings, the NAND type DRAM is formed as follows by a well known method until the NAND type DRAM is completed as shown in FIGS. 3 to 7.

More specifically, the surface of the p type epitaxial layer 102 is oxidized to form the gate oxide film 107. Thereafter, a second polycrystalline film, serving as gate electrodes 108 and 114, is deposited on the entire surface. The resistance of second polycrystalline silicon film is lowered by diffusion of $POCl_3$.

Then, a silicon nitride film, serving as an insulating film 112', is deposited on the entire surface. Thereafter, the silicon nitride film and the second polycrystalline silicon are processed by lithography and reactive ion etching to form the gate electrodes 108 and 114 having a silicon nitride film on their surface.

Then, an n type diffusion layer 109 is formed on the entire surface by ion-implantation of, for example, arsenic (As). Thereafter, the silicon nitride film, serving as insulating film 112', is further deposited thereon. Then, the insulating film 112' is left on the vertical side wall of the gate electrodes 108 and 114. Thereby, a gate side wall insulating film is formed.

The gate side wall film and the silicon nitride film, which is deposited right before lithography, surround the gate electrodes 108 and 114. Thereby, an electrical insulation between a trench connection pad 110 which will be formed later and a bit line 113 can be easily kept (FIG. 4).

In order to lower connection resistance among the conductive pad 110 formed later, the bit line 113, and the n type diffusion layer 109, for example, arsenic (As) may be ion-implanted to the n type diffusion layer 109.

Then, a contact hole 115 for connecting the storage node electrode 106 and the n type diffusion layer 109 is formed by lithography and etching. Thereafter, for example, a polycrystalline silicon film is deposited on the entire surface. Then, the polycrystalline silicon film is processed to form the conductive pad 110 for connection of the storage node electrode. Thereby, the trench capacitor storage node electrode 106 is electrically connected to the n type diffusion layer 109 (FIG. 7).

Then, the interlayer insulating layer 112 is deposited on the entire surface, and an opening for the bit line contact path 111 is formed in the interlayer insulating film 112 by lithography and reactive ion etching (FIG. 4).

Next, bit line material such as a polycrystalline silicon film is deposited on the entire surface. The polycrystalline silicon film is processed by lithography and reactive ion etching, thereby forming the bit line 113 (FIG. 4). Finally, a wiring layer of the upper layer is processed to complete the NAND type DRAM.

According to the above-mentioned embodiment, since the element isolation insulating film 142 is formed on the side surface of the trench 104 in a self-alignment manner, no misalignment is generated in patterning the element isolation insulating film 142 and the trench 104, and the sufficient area of source and drain region can be reserved. Therefore, even if the memory cell is fined, there is not generated a problem in which connection resistance between the MOS transistors is increased by the misalignment, and the memory cell can be more highly fined.

Moreover, it is unnecessary to provide alignment margin for patterning the element isolation insulating film 142 and the trench 104. Also, since the element isolation insulating film 142 is formed by a method in which bird's beak, which is seen at both ends of LOCOS, is not generated. Due to this, there is no need for providing alignment margin and a bird's beak generating area. Therefore, the trench opening area, which is larger than the conventional case, can be reserved, and a capacity of the trench capacitor can be enlarged.

Furthermore, by enlarging the depth of the trench 104, the burying depth of the insulating film 142 can be largely formed while the width of the element isolation insulating film 142 maintains constant. Due to this, there can be realized the element isolation having higher ability of current interruption between elements than the LOCOS isolation.

Moreover, unlike the prior art, since it is unnecessary to provide the element isolation insulating film (LOCOS) before patterning the trench 104, the step of LOCOS can be omitted, and the number of process steps can be reduced.

Also, since the element isolation insulating film 142 is not formed by LOCOS, unlike the case of LOCOS, the patterning of the trench 104 is not influenced by the difference in level (i.e. step). Therefore, a desirable shape of the trench can be realized, and the variation of dielectric withstand voltage and capacitance of a capacitor can be reduced. Due to this, it is possible to realize the semiconductor memory device which can be stably operated even if the memory cell is fined.

Second Embodiment

FIG. 12 is a cross sectional view of a cell array of an NAND type DRAM of a second embodiment of the present invention, and this figure corresponds to FIG. 5 of the first embodiment.

The second embodiment is basically the same as the first embodiment. A method for forming a cap insulating film 142' of the upper surface of the trench 104 is different from that of the first embodiment.

More specifically, in the second embodiment, similar to FIGS. 10A and 10B, the trench capacitor storage node electrode 106 is buried into the trench 104 and etched back. Thereby, the exposed silicon nitride film 131, the silicon oxide film 130, and the capacitor insulating film 105 formed on the element isolation insulating film 142 are etched. Sequentially, a second polycrystalline silicon film (not shown) is deposited on the entire surface. Thereafter, for example, As may be ion-implanted to the second polycrystalline silicon such that the resistance of the second polycrystalline silicon film is lowered.

Sequentially, the second polycrystalline silicon film is etched back by chemical dry etching such that the second polycrystalline silicon film is left to cover the trench capacitor storage node electrode 106 of the trench 104 and to be integral therewith. Moreover, the surface of the second polycrystalline silicon film is thermally oxidized, so that the cap insulating film 142' is formed of the thermal oxide film on the upper surface of the trench 104.

In the first embodiment, the cap insulating film 142' is formed on the upper surface of the trench 104 by the deposition method. However, in the second embodiment, since the cap insulating film 142' is formed by oxidization of the polycrystalline silicon (second polycrystalline silicon) forming the trench capacitor storage node electrode 106, a film having an electrical insulation characteristic which is superior to that of the first embodiment can be obtained.

Third Embodiment

FIGS. 13 to 15 are cross sectional views of a cell array of an NAND type DRAM of a third embodiment of the present invention. FIG. 13 is the cross sectional view corresponding to FIG. 5 of the first embodiment, and FIGS. 14 and 15 are the cross sectional views corresponding to FIGS. 6 and 7 of the first embodiment. In this case, the surface wiring layer and the insulating layer are not shown in the drawings.

The third embodiment is basically an improvement of the second embodiment. As shown in FIG. 13, before the second polycrystalline silicon film is buried into the trench 104, a silicon oxide film, serving as an upper layer insulating film 142", is further deposited on the entire surface.

Then, as shown in FIGS. 14 and 15, the upper layer insulating film 142" is left on the side wall of the element isolation insulating film 142 by anisotropic etching, so that a second side wall insulating film is formed. Moreover, the second polycrystalline silicon film is deposited on the entire surface. Thereafter, for example, As may be ion-implanted to the second polycrystalline silicon such that the resistance of the second polycrystalline silicon film is lowered.

Sequentially, the second polycrystalline silicon film is etched back by chemical dry etching such that the second polycrystalline silicon film is left to cover the trench capacitor storage node electrode 106 of the trench 104 and to be integral therewith. Moreover, the surface of the second polycrystalline silicon film is thermally oxidized, so that the cap insulating film 142' is formed on the upper surface of the trench 104 by the thermal oxide film.

According to the above-mentioned structure, it is needless to say that the same advantage as the second embodiment can be obtained. In addition, the oxide film of the second side wall insulating film 142" is formed to be deeper than that of the cap insulating film 142', so that electrical insulation of the gate electrodes 108 and 114 from the storage node electrode 106 can be improved.

The contact hole 115 for connecting the storage node electrode to be formed later can be easily formed by etching a portion of the cap insulating film 142' where the oxide film is thin as shown in FIG. 15.

Fourth Embodiment

FIG. 16 is a plan view of a DRAM cell array having one bit line contact per two memory cells according to a fourth embodiment of the present invention. FIGS. 17 to 19 are cross sectional views taken on lines 17—17, 18—18, and 19—19 of FIG. 16, respectively.

Since this type of memory device has larger number of bit line contacts than a NAND type memory device, the cell area becomes larger. However, random access to all bits can be performed at high speed. Moreover, by use of an under portion of a passing word line, a large capacitor can be formed.

Since the manufacturing method of the memory cell of this embodiment is the same as the first embodiment, the explanation is omitted. However, the plane structure is set to be the arrangement shown in FIG. 16, while the cap insulating film 142' can be formed by thermal oxidization of the polycrystalline silicon film similar to the second embodiment.

By use of the above-mentioned manufacturing method, the problem, which is caused by the misalignment between the element isolation insulating film and the capacitor electrode, can be avoided, and the advantage as mentioned in the first embodiment can be obtained, as well.

Fifth Embodiment

Figure 20:
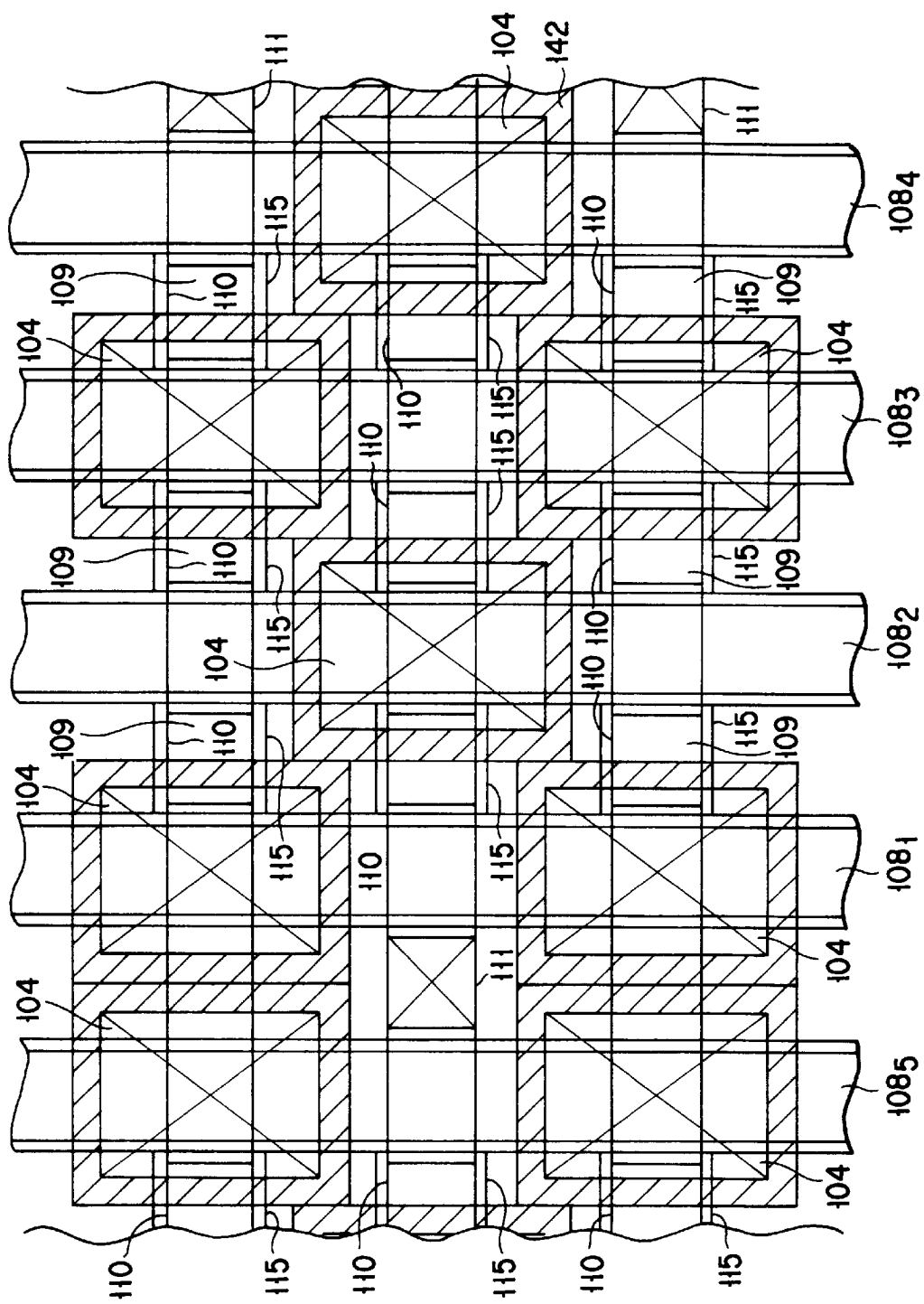
FIG. 20 is a cross sectional view of a cell array of an NAND type DRAM of a fifth embodiment of the present invention.

FIG. 20 is a plan view of a cell array of an NAND type DRAM of a folded bit line system having one bit line contact per four memory cells according to a fifth embodiment of the present invention.

In the fifth embodiment, since the folded bit line structure is used, phase noise generated in two word lines can be reduced. Moreover, by use of an under portion of a passing word line, a large capacitor can be formed.

Since the manufacturing method of the memory cell of this embodiment is the same as the first embodiment, the explanation is omitted. However, the plane structure is set to be the arrangement shown in FIG. 16, while the cap insulating film 142' can be formed by thermal oxidization of the polycrystalline silicon film similar to the second embodiment.

By use of the above-mentioned manufacturing method, the problem, which is caused by the misalignment between the element isolation insulating film and the capacitor electrode, can be avoided, and the advantage as mentioned in the first embodiment can be obtained, as well.

The embodiment of the semiconductor memory device using the trench capacitor of the present invention is not limited to the above mentioned embodiments.

In the above-described embodiment, a trench for a capacitor storage node electrode 106 is formed, after a formation of the element isolation film 142 in a self-aligned manner, by a further etching of the trench 104. However, after forming a trench to a depth of, e.g., 5 μm, the element isolation film 142 may be formed by oxidizing the upper portion of the trench to a depth of, e.g., 1 μm.

In order to form an element isolation film on the upper portion of the trench, after oxidizing the inner portion of the trench 104 to a thickness of, e.g., 10 nm, an oxidization preventing film, e.g., SiN, may be formed to a thickness of 10 nm to be removed by etching back using a resist film at the upper portion of the trench to a depth of, e.g., 1 μm. After that, by removing the resist film and performing oxidization, a thick element isolation film may be formed only at the upper portion of the trench. After the formation of the element isolation film, the SiN film is selectively removed by reactive ion etching or chemical dry etching.

Further, the above-mentioned embodiments showed the oxide film forming method by thermal oxidation as a method for forming the element isolation insulating film. However, oxygen may be implanted into the side surface of the trench with low acceleration energy of about 30 keV to form an oxide film.

Moreover, as the element isolation insulating film forming method itself, there may be used other methods than the above-mentioned methods if they are the methods for transforming silicon to a silicon oxide film or a silicon nitride film.

Further more, in order to reserve the thickness of the insulating film having sufficient dielectric withstand voltage and to prevent deterioration caused by thermal stress due to the thick oxidization film, there may be added a method in which the silicon oxide film is deposited to be etched by anisotropic etching, thereby leaving a silicon oxide film on the side wall. It is needless to say that a single layer film such as a silicon nitride film, a ferroelectric film, a para electric film or a composite film of these films can be used as the side wall film in place of the silicon oxide film.

Moreover, the silicon nitride film was used as the insulating film 112' in the above-mentioned embodiment. However, a single layer film such as a silicon oxide film, a para dielectric film or a composite film of these films can be used.

Furthermore, the above-mentioned embodiments explained the case using all self-aligned element isolation insulating films. However, it is possible to use an element isolation insulating film, which is prepared by use of a different mask for the isolation between the bit line contacts, the field shield isolation (gate electrode 114), and a part of the isolation between the trenches.

The first embodiment showed the structure in which the positions of the bit line contacts 111 are arranged in line in the word line direction. However, the positions of the bit line contacts 111 are not always put in line in the word line direction. Moreover, in the first and second embodiments, the number of trenches to be connected in cascade may be set to be plural, and one-bit line contact per eight memory cells is not always needed.

Moreover, the above-mentioned embodiments explained the structure in which the conductive pads 110 are included in the trench connection contact hole 115. However, the conductive pads 110 may be formed to be larger than the the storage node electrode connection contact hole 115 in the range that the conductive pads 110 are not contacted each other.

The above-described embodiments explained that the entire substrate 101 was of P type and served as a plate electrode. However, it is possible to use a substrate in which at least a surface portion (e.g., about 6 μm in depth) of the cell array area of the substrate 101 is formed to be p typed at a high impurity concentration by ion-implantation of boron.

Moreover, it is possible to use a substrate having a highly concentrated p type layer by solid diffusion using BPSG (boron-doped phosphorus-silicate glass) or vapor diffusion using BN.

Furthermore, it is possible to use a substrate in which at least a surface portion (e.g., about 6 μm in depth) of the cell array area of the substrate 101 is formed to be n typed at a high impurity concentration by ion-implantation of phosphate or arsenic. Also, a highly concentrated n type region can be formed by solid diffusion using PSG (phosphorus-silicate glass) or AsSG (arsenic-silicate glass), or vapor diffusion using $POCl_3$.

Moreover, in the above embodiments, the p type epitaxial layer 102 was prepared. However, the high concentration p type layer, serving as a plate electrode, or the high concentration n type layer is may be formed on the silicon substrate 101 by ion-implantation of boron or phosphate under a condition of an acceleration voltage of about 3 Mev, instead of forming the p type epitaxial layer 102.

Furthermore, in place of the high concentration p type silicon substrate 101, an n type silicon substrate may be used, forming a p type well in the cell array area, instead of forming the p type epitaxial layer 102.

The boundary surface between the substrate 101 and the epitaxial layer 102 is located within the depth of the side wall the trench 104 interposing the element isolation insulating film 142. In this case, the boundary surface may be located at any portion of the side wall of the trench 104.

The above embodiments showed that the plane shape of the trenches were formed to be rectangular and hexagonal, respectively. However, in the first to third embodiments, the plane shape, the connection form of the trench 104 and the element isolation insulating film 142 may be prepared as shown in FIGS. 21A and 21B.

In the fourth and fifth embodiments, the plane shape, the connection form of the trench 104 and the element isolation insulating film 142 may be prepared as shown in FIGS. 22A and 22B. Any shapes other than the above shapes may be used if the shape is formed such that the element isolation insulating films 142 are connected to each other.

In the above embodiments, there was used the polycrystalline Si film in which arsenic is ion-implanted to the trench capacitor storage node electrode 106. However, arsenic may be diffused in a solid form by AsSG. Or, there may be used the so-called doped polycrystalline silicon film in which arsenic is doped at the same time with the film formation.

Moreover, in place of arsenic, phosphate may be doped in the same method. The trench capacitor storage node electrode 106 can be a p-type layer, wherein boron is doped.

As a material of the trench capacitor storage node electrode 106, there can be used a metal other than the polycrystalline silicon such as single crystal silicon, porous silicon, amorphous silicon, W, Ta, Ti, Hf, Co, Pt, Pd or silicide thereof. Or, the layered structure of these materials may be used.

In the above embodiments, the n channel MOS transistor was used. However, a p channel MOS transistor may be used.

As mentioned above, according to the present invention, even if the memory cell fining advances, there can be obtained a trench capacitor in which the trench and the element isolation insulating film is not misaligned. Therefore, there can be obtained a semiconductor memory device having high integration and high reliability.

The following sixth to tenth embodiments will explain a stacked capacitor type memory cell array, which is the second aspect of the present invention.

Sixth Embodiment

Figure 25:
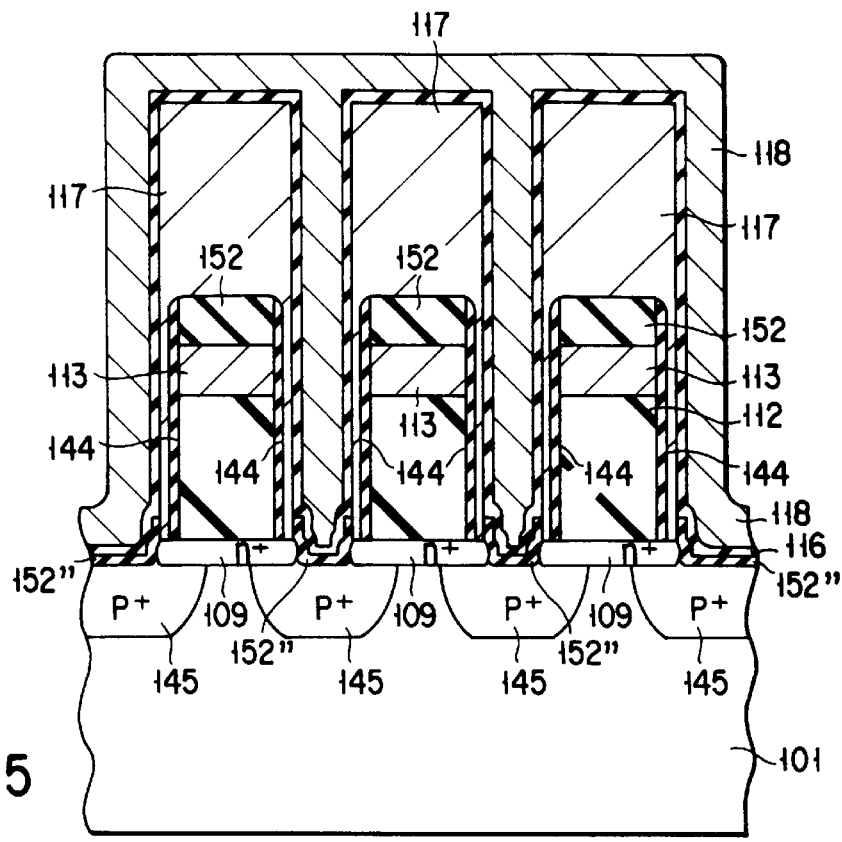
Figure 26:
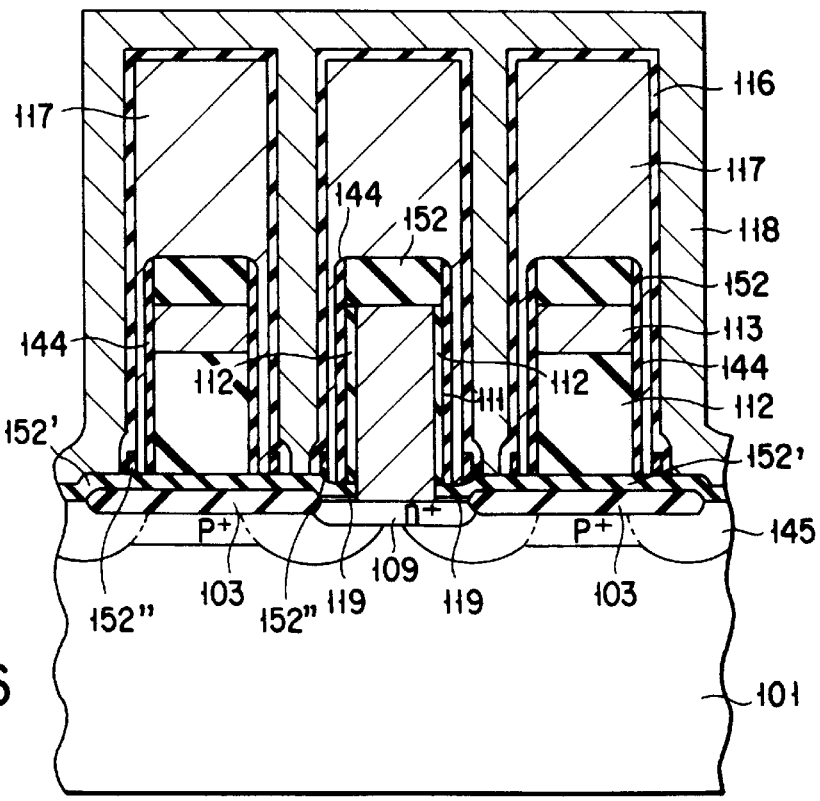

FIG. 23 is a plan view showing a cell array of two cell one-bit line contact type DRAM using a stacked capacitor according to a sixth embodiment of the present invention. FIGS. 24 to 26 are cross sectional views taken along lines 24—24, 25—25, and 26—26 of FIG. 23, respectively.

The memory cell area is formed on the p type silicon substrate 101, and the gate electrodes $108_1$ to $108_5$ are formed on the upper portion of the p type silicon substrate 101. These gate electrodes $108_1$ to $108_5$ are patterned in one direction of the cell array to be served as word lines, respectively. The gate electrodes 108, to $108_5$ are insulated with the insulating film 112, respectively (FIG. 24).

The n type diffusion layer 109 is formed on both sides of the gate electrodes $108_1$ to $108_5$ (hereinafter simply marked 108). The n type diffusion layer 109 is used as a source and a drain region of the plane MOS transistor, and is connected to a stacked capacitor storage node electrode 117. A plate electrode 118 is formed on the stacked capacitor storage node electrode 117 with a capacitor insulating film 116 interposed therebetween, and these members structure a MOS capacitor (FIG. 25). In FIG. 26, reference numerals 119 and 145 denote an insulating film and a punch through stopper, respectively.

The above-described transistor area is surrounded by an element isolation insulating films 103 and 152" which are formed by LOCOS. In FIG. 23, hatching is provided in these two areas to be readily recognizable. The element isolation insulating film 152" is formed in a self-alignment manner to be aligned with the stacked capacitor storage node electrode 117.

On the p type silicon substrate 101 having the above-mentioned structure, interlayer insulating films 152' and 112 are formed, and the bit line contact path 111 is formed to be passed through these films. A part of the n type diffusion layer 109 is connected to the bit line 113 through the bit line contact path 111.

The stacked capacitor storage node electrode 117 is formed to cover the bit line 113. Then, the distance between the adjacent stacked capacitor storage node electrodes 117 is constant to the direction where the plate electrode 118 is piled up (FIGS. 25, 26).

The interlayer insulating film 152 and the storage node electrode 117 are formed on the bit line 113, and the above-mentioned memory cell realizes a capacitor on bit-line structure.

The following will explain the manufacturing method of the cell array of the two cell one bit line contact type DRAM with reference to FIGS. 27 to 39.

Figure 27:
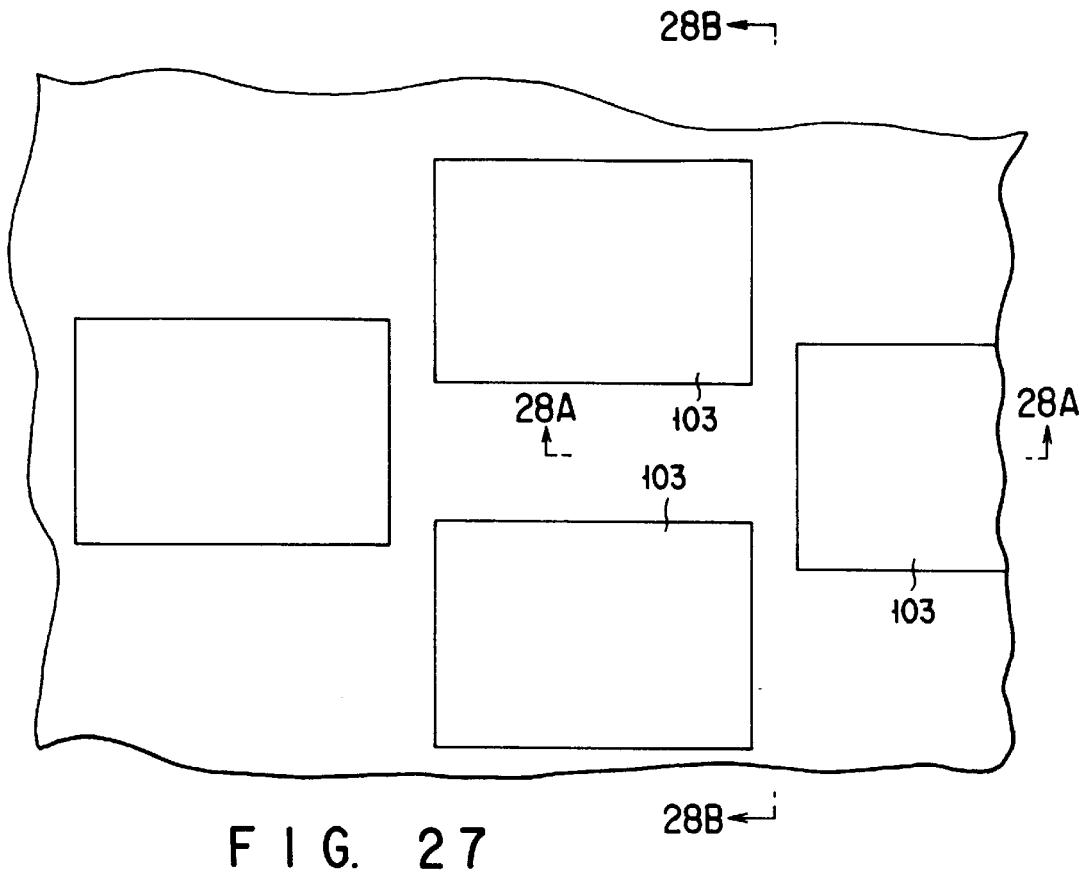
FIG. 27 is a plan view showing a manufacturing step of a first stage of the cell array of the 2-cell 1-bit line contact type DRAM using the stacked capacitor of the sixth embodiment of the present invention.
Figure 28A:
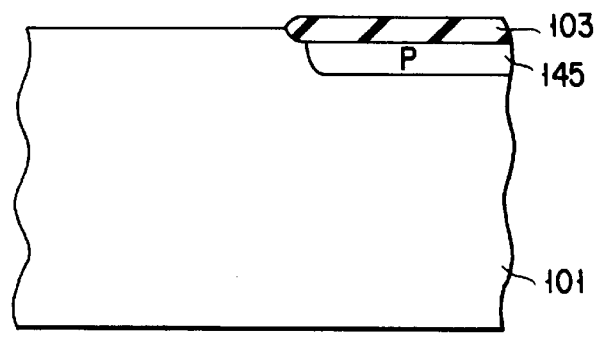
FIGS. 28A and 28B are cross sectional views showing the manufacturing step of the first stage of the cell array of the 2-cell 1-bit line contact type DRAM using the stacked capacitor of the sixth embodiment of the present invention, taken along lines 28A—28A and 28B—28B of FIG. 27, respectively.
Figure 28B:
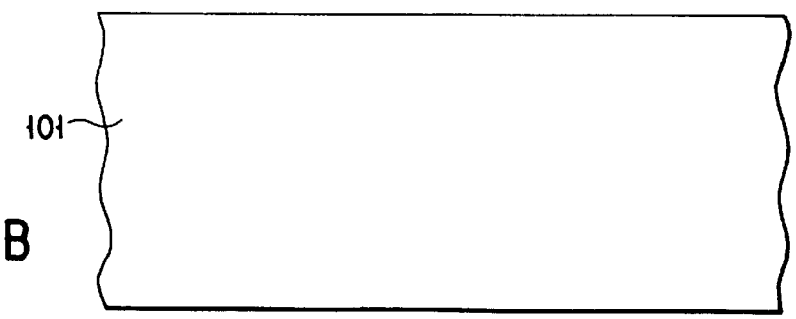

A step of a first stage will be explained with reference to FIGS. 27 and 28. FIG. 27 is a plan view conceptually showing the cell array arrangement of the NAND type DRAM of this embodiment. FIGS. 28A and 28B are cross sectional views taken along lines 28A—28A and 28B—28B of FIG. 27, respectively.

First, the punch through stopper 145 is formed on the high impurity concentration p type silicon substrate 102 having boron concentration of about $10^{16}$ cm$^{-3}$ by ion-implantation of boron. Thereafter, the field oxide film 103 is formed on the p type silicon substrate 101 by, for example, LOCOS. Concentration of ion to be implanted is set to be, for example, $1 \times 10^{18}$ cm$^{-3}$.

Figure 29:
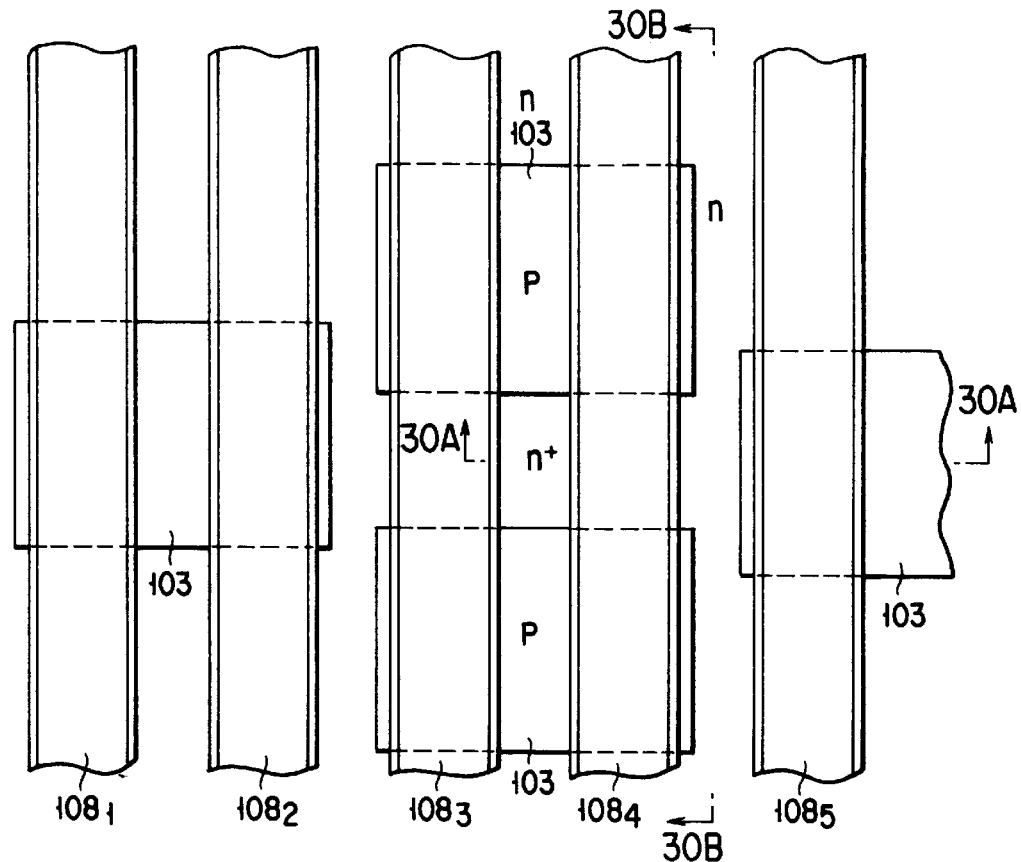
FIG. 29 is a plan view showing a manufacturing step of a second stage of the cell array of the 2-cell 1-bit line contact type DRAM using the stacked capacitor of the sixth embodiment of the present invention.
Figure 30A:
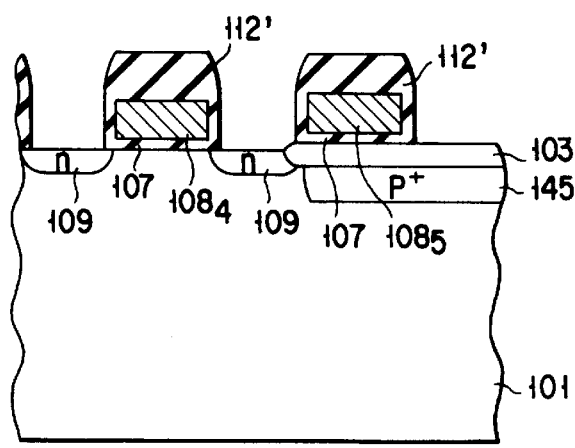
FIGS. 30A and 30B are cross sectional views showing the manufacturing step of the second stage of the cell array of the 2-cell 1-bit line contact type DRAM using the stacked capacitor of the sixth embodiment of the present invention, taken along lines 30A—30A and 30B—30B of FIG. 29, respectively.
Figure 30B:
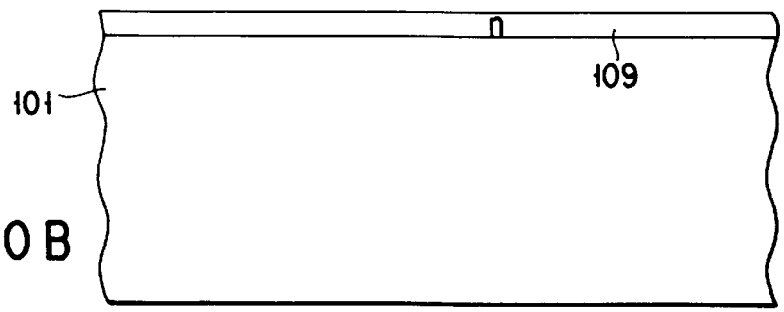

Then, the process goes to a second stage. FIG. 29 is a plan view of the cell array of the second stage. FIGS. 30A and 30B are cross sectional views taken along lines 30A—30A and 30B—30B of FIG. 29, respectively.

First, the p type silicon substrate 101 is oxidized by, for example, 10 nm, to form the gate oxide film 107. Thereafter, the first polycrystalline silicon film, serving as gate electrodes 108 and 114, is deposited on the entire surface, and POCl$_3$ is diffused thereto, so that the resistance of the first polycrystalline silicon layer is lowered.

Next, the silicon nitride film, serving as insulating film 112', is deposited on the entire surface. Thereafter, the silicon nitride film and the polycrystalline silicon film are processed by lithography and reactive ion etching, thereby forming the gate electrodes 108.

Then, for example, As is ion-implanted to the entire surface to form the n type diffusion layer 109. Thereafter, the silicon nitride film, serving as the insulating film 112', is further deposited on the entire surface. Then, the insulating film 112' is left on the vertical side wall of the gate electrodes 108 and 114 by anisotropic etching, thereby a gate side wall insulating film is formed.

The gate side wall film and the silicon nitride film, which is deposited right before lithography, surround the gate electrodes 108 and 114. Thereby, an electrical insulation between the stacked capacitor storage node electrode 117 and the bit line 113 can be easily kept. Thereafter, in order to reduce the connection resistance among the stacked capacitor storage node electrode 117, the bit lines 113, and the n type diffusion layer 109, for example, arsenic may be ion-implanted into the n type diffusion layer 109.

Then, the process goes to a third stage as shown in FIGS. 31, 32A, 32B, 33. FIG. 31 is a plan view of a cell array of the third stage. FIGS. 32A, and 32B are cross sectional views taken along lines of 32A—32A and 32B—32B of FIG. 31, respectively. FIG. 33 is a cross sectional view taken along line of 33—33 of FIG. 31.

First, the surface of the silicon substrate 101 is oxidized by about 10 nm, so that the insulating film 119 is formed.

Then, the interlayer insulating film 152', formed of a silicon nitride film, is deposited on the entire surface. Thereafter, the interlayer insulating film 152' is processed by lithography and reactive ion etching, thereby forming the element isolation insulating film surrounding the bit line contact path 111 to be formed later.

Next, the interlayer insulating film 112, formed of BPSG, is deposited on the entire surface. Then, the interlayer layers 112, 152', and the insulating film 119 are etched by lithography and reactive ion etching, so that a contact hole for bit line contact path 111 is formed (FIG. 33).

Then, the bit line material such as a polycrystalline silicon film 113 is deposited on the entire surface. Thereafter, the resistance of the polycrystalline silicon film 113 is lowered by ion-implantation of As.

Then, the interlayer insulating film 152 is deposited on the entire surface. Thereafter, the interlayer insulating film 152, the polycrystalline silicon film 113, and the interlayer insulating film 112 are processed based on the pattern of the bit line 113 by the lithography and the reactive ion etching (FIG. 33). Thereby, the bit line is formed as if it runs on a bank. In this case, the other cross sections are formed as shown in FIGS. 32A, and 32B.

Figure 34:
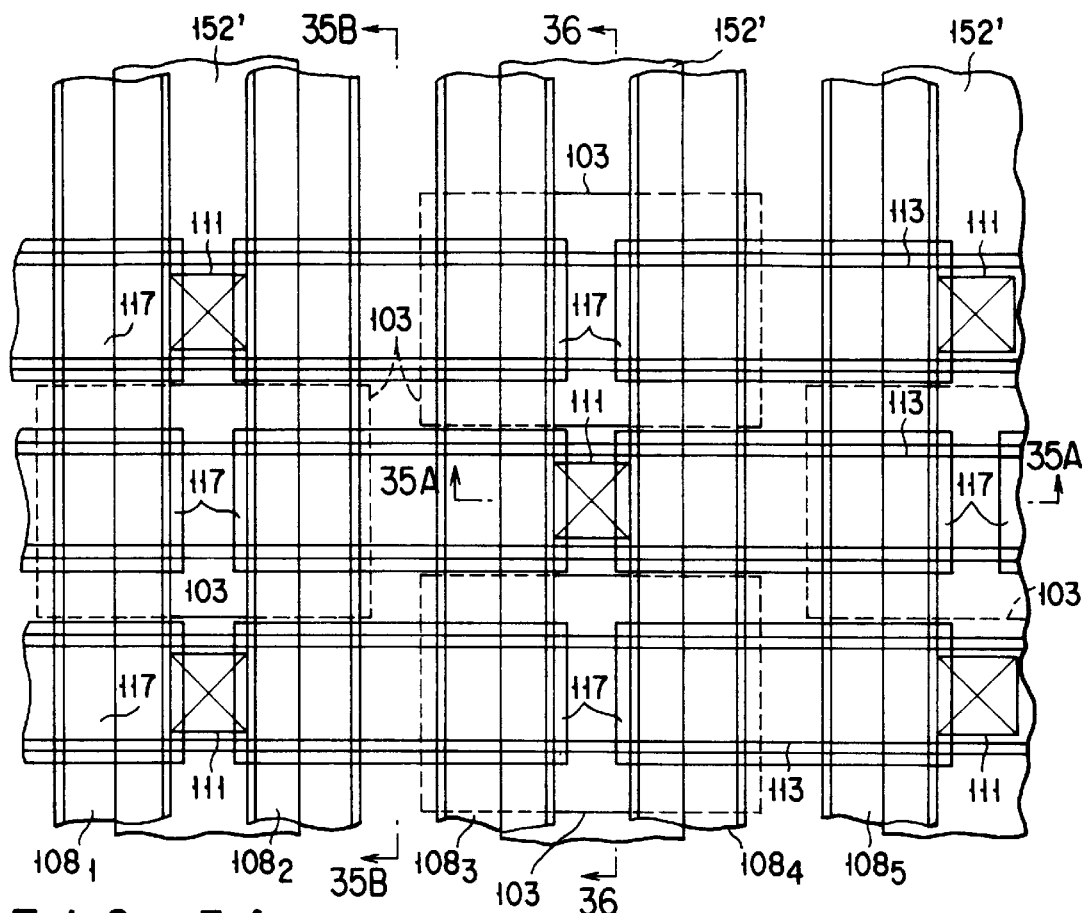
FIG. 34 is a plan view showing a manufacturing step of a fourth stage of the cell array of the 2-cell 1-bit line contact type DRAM using the stacked capacitor of the sixth embodiment of the present invention.
Figure 36:
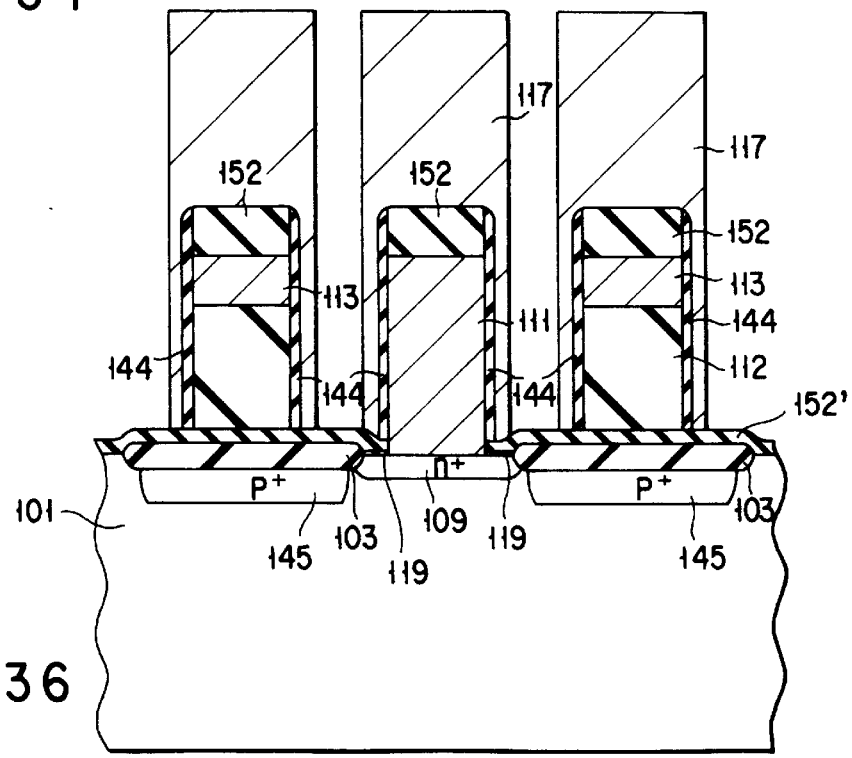
FIGS. 35A, 35B, and 36 are cross sectional views showing the manufacturing step of the fourth stage of the cell array of the 2-cell 1-bit line contact type DRAM using the stacked capacitor of the sixth embodiment of the present invention, taken along lines 35A—35A, 35B—35B and 36—36 of FIG. 34, respectively.
Figure 35A:
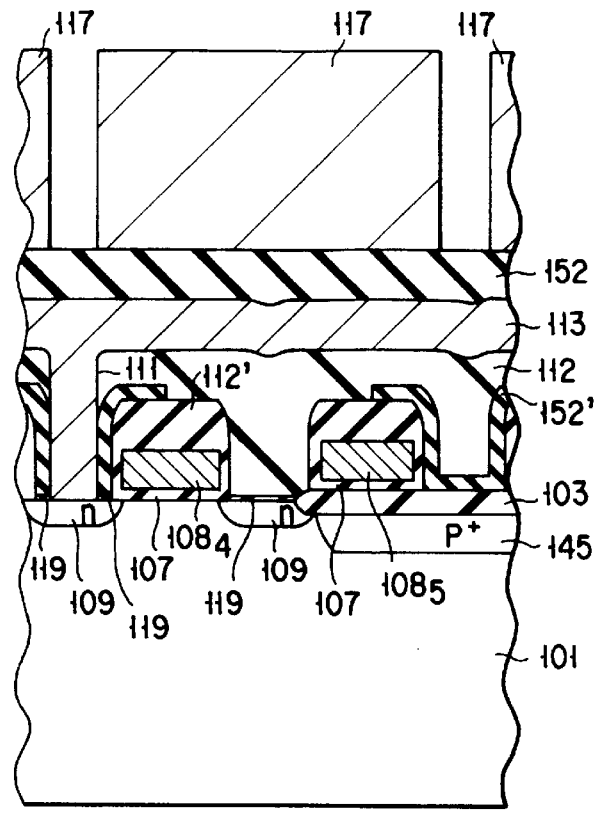
Figure 35B:
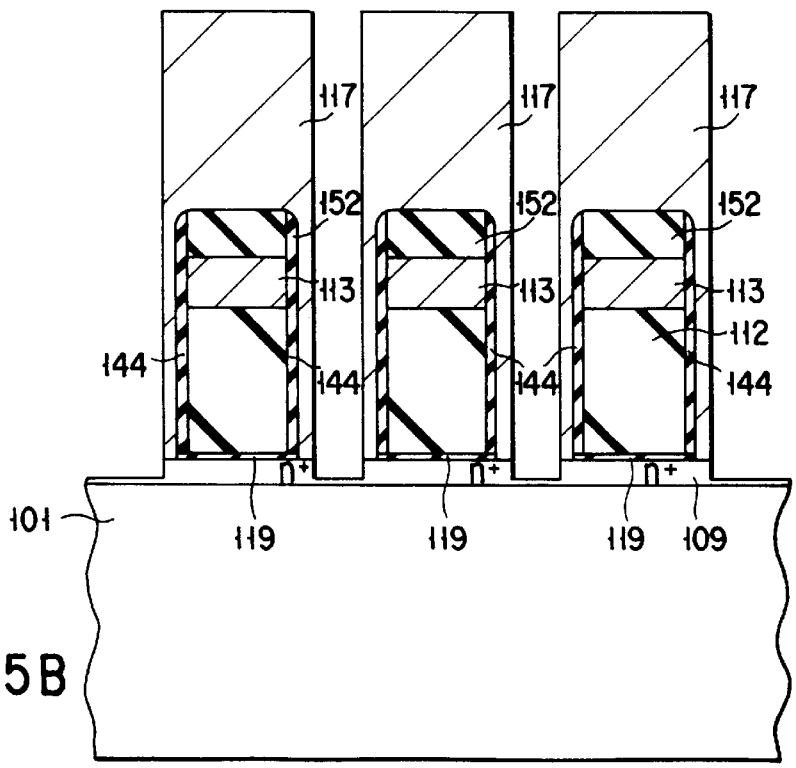

Then, the process goes to a fourth stage as shown in FIGS. 34, 35A, 35B, 36. FIG. 34 is a plan view of a cell array of the fourth stage. FIGS. 35A, and 35B are cross sectional views taken along lines of 35A—35A and 35B—35B of FIG. 34, respectively. FIG. 36 is a cross sectional view taken along line of 36—36 of FIG. 34.

First, a silicon nitride film, serving as an insulating film 144, is further deposited on the entire surface. By isotropic etching, the insulating film 144 is left on the side wall of the bank where the bit line 113 is mounted on the interlayer insulation film 112, so that a bit line side wall insulating film is formed. Further, the insulating film 119 exposed onto the lower portion of the side wall insulating film 144 is removed by etching (FIG. 35B).

The side wall insulating film 144 and the interlayer insulating film 152 are formed to surround the bit line 113, so that the electrical insulation from the stacked capacitor storage node electrode 117 can be surely maintained. Also, it is possible to use a method in which the side wall of the bit line 113 is oxidized to about 20 nm to form the insulating film as the pre-process of the side wall insulating film 144 or an alternative thereof.

Next, a conductive film, serving as the capacitor storage node electrode 117, such as a polycrystalline silicon film is deposited on the entire surface, and the resistance of the polycrystalline silicon film is lowered by ion-implantation of As.

Then, by lithography and the reactive ion etching, the polycrystalline film is etched to a depth reaching to the n type diffusion layer 109, so that the stacked capacitor storage node electrode 117 is formed. In this case, the depth of etching may be set such that there occurs no punch-through between adjacent MOS transistors after the element isolation film 152", is formed in a later step.

Thereafter, in order to prevent generation of the punch-through, the entire surface is ion-implanted with p-type ion, for example, boron, so that the p type punch-through stopper layer 145 is formed on the bottom of the deeply etched groove (FIG. 25).

Figure 38A:
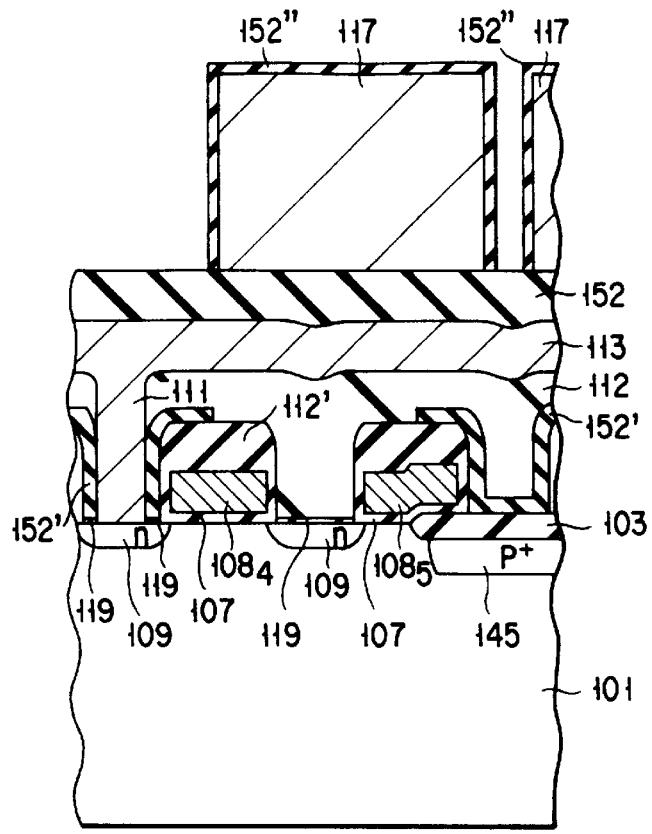
Figure 38B:
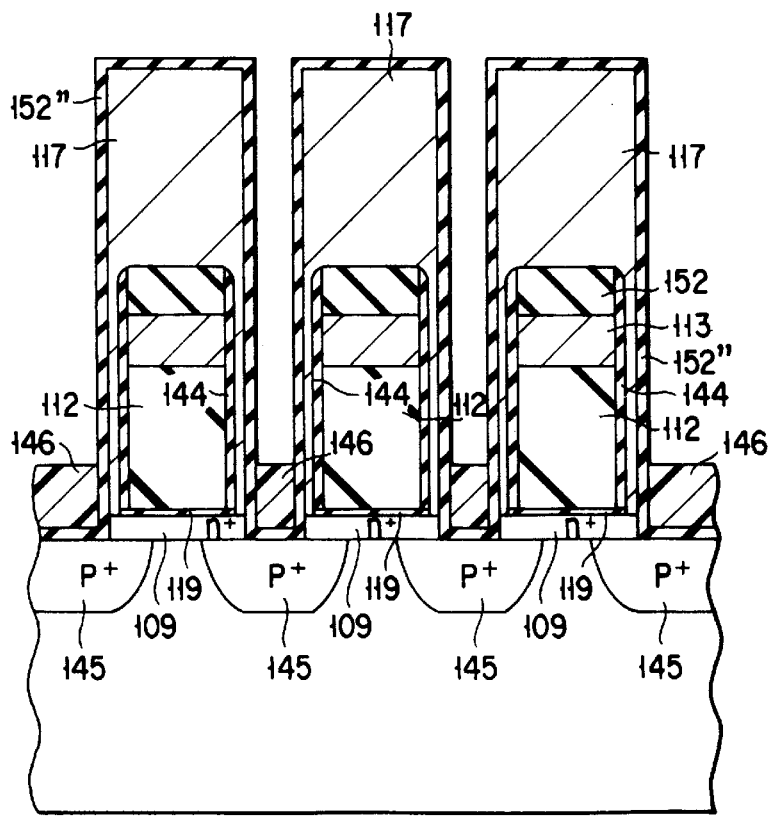

Then, the process goes to a fifth stage as shown in FIGS. 37, 38A, 38B, 39. FIG. 37 is a plane view of a memory cell array of the fifth stage. FIGS. 38A, and 38B are cross sectional views taken along lines of 38A—38A and 38B—38B, respectively. FIG. 39 is a cross sectional view taken along line of 39—39 of FIG. 35.

First, the stacked capacitor storage node electrode 117 is oxidized to, e.g., 20 nm, so that the element isolation insulating film 152" is formed. It is needed that a thickness of the element isolation insulating film 152" be set such that the contact area between the stacked capacitor storage node electrode 117 and the n type diffusion layer 109 is reserved. In this case, in place of oxidization, the stacked capacitor storage node electrode 117 may be ion-implanted with oxygen ion so that an oxide film area is formed.

Then, resist 146 is applied on the entire surface to be exposed to light, so that resist is left on the bottom of the deep groove between the stacked capacitor storage node electrodes 117. Then, by etching, the element isolation insulating film 152" formed on the upper portion of the stacked capacitor storage node electrode 117 is removed.

According to the above embodiment, the element isolation insulating film 152Δ is formed in a self-aligned manner with the pattern of the stacked capacitor storage node electrode 117. Due to this, the contact area between the stacked capacitor storage node electrode 117 and the diffusion area 109 is not interrupted by the element isolation insulating film. At the same time, a predetermined element isolation area can be reserved. Even if the memory cell is fined, there is not generated the problem that the punch-through between the MOS transistors is increased by mask misalignment. Therefore, a good element isolation characteristic can be realized.

Moreover, the contact between the n type diffusion layer 109 of the transistor and the stacked capacitor storage node electrode 117 is made automatically avoiding preformed transistor gate area and a bit line area. Then, the stacked capacitor storage node electrode 117 comes in contact with the n type diffusion layer 109 striding the bit line. Due to this, unlike the prior art, no patterning for a storage node electrode contact area is needed. Therefore, the lithography step of the contact area can be omitted, and the problem in which connection resistance is increased by misalignment between the contact area and the diffusion area can be solved.

Moreover, since the step of forming the element isolation insulating film is performed after forming the storage node electrode, the diffusion of the channel stopper ion, and the reduction of the insulating film or the change of the shape thereof due to pre-process, can be prevented because of not going through the heating process in the gate formation and the bit line formation.

Though the following step is not illustrated, the resist 146 is ashed and the capacitor insulating film 116 is deposited on the entire surface, and the plate electrode 118, and an upper wiring layer are formed, so that a memory cell array is completed.

Then, the capacitor insulating film 116 is formed as a layered film (effective film thickness: 10 nm) of, for example, silicon oxide film/silicon nitride film/silicon oxide film. Moreover, the plate electrode 118 is formed of, for example, polycrystalline silicon, and its resistance is lowered by ion-implantation of As. Moreover, in order to improve electrical insulation between the plate electrode 118 and the semiconductor substrate 102 or the bit line 113, after the resist 146 is ashed, an insulating film, formed of BPSG, may be deposited on the deep isolation groove portion of the stacked capacitor storage node electrode 117 to be etched back so that the insulating film is buried.

In the above embodiment, no thick element isolation insulating film such as LOCOS is not formed in advance in the n type diffusion area 109 connecting to the stacked capacitor storage node electrode 117 (FIG. 38B). Due to this, there can be formed a contact having little influence of the difference in level and good uniformity.

In the above embodiment, since there is used the folded bit line structure of two-memory cell one bit line contact, same phase noise generated in two bit lines can be largely reduced. Moreover, since the capacitor on bit-line structure is realized, the bit line contact can be easily formed without depending on the height of the stacked capacitor storage node electrode 117.

Seventh Embodiment

FIG. 40 is a plan view showing a DRAM cell array of two-cell one bit line contact type according to the seventh embodiment of the present invention. FIGS. 41 to 43 are cross sectional views taken along lines of 41—41, 42—42, and 43—43 of FIG. 40, respectively.

The seventh embodiment is basically the same as the sixth embodiment. However, the seventh embodiment differs from the sixth embodiment in the point that the number of passing word lines is one per two memory cells. Due to this, in the seventh embodiment, since there is no need of forming the interlayer insulating film 152' around the bit line contact path formed in the sixth embodiment, there are advantages in that the step of forming the interlayer insulating film 152' can be omitted, and the area of the memory cell can be reduced as compared with the sixth embodiment.

The following will explain the method of manufacturing the above-mentioned two cell one bit contact type DRAM cell array with reference to FIGS. 44 to 53. Since the manufacturing method is basically the same as the sixth embodiment, only the main point will be explained.

Figure 44:
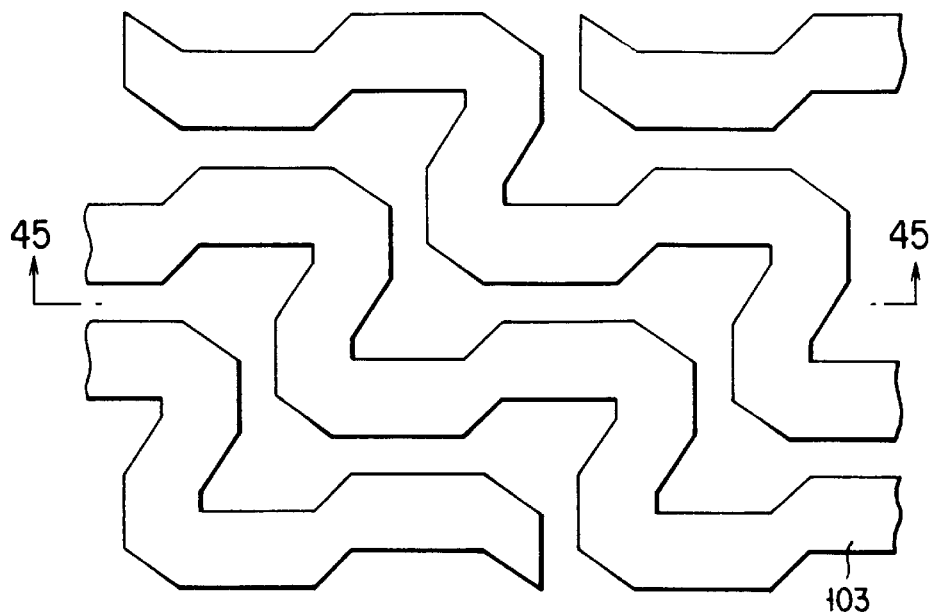
FIG. 44 is a plan view showing a manufacturing step of a first stage of the DRAM cell array of the seventh embodiment of the present invention.
Figure 45:
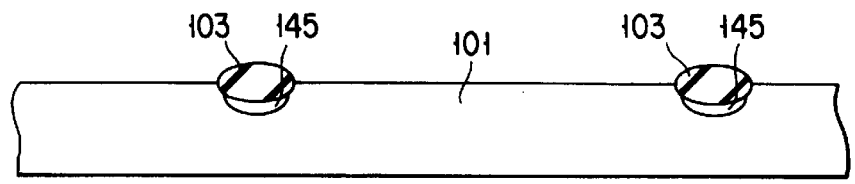
FIG. 45 is a cross sectional view showing a manufacturing step of the first stage of the DRAM cell array of the seventh embodiment of the present invention.

The process of a first stage is shown in FIGS. 44 and 45. FIG. 44 is a plan view conceptually showing a cell array arrangement of the first stage of the seventh embodiment of the present invention, and FIG. 45 is a cross sectional view taken along line 45—45 of FIG. 44.

First, for example, boron is ion-implanted into the p type silicon substrate 101 to form the punch-through stopper 145. Thereafter, the field oxide film 103 is formed on the p type silicon substrate 101 by LOCOS (FIG. 45).

Figure 46:
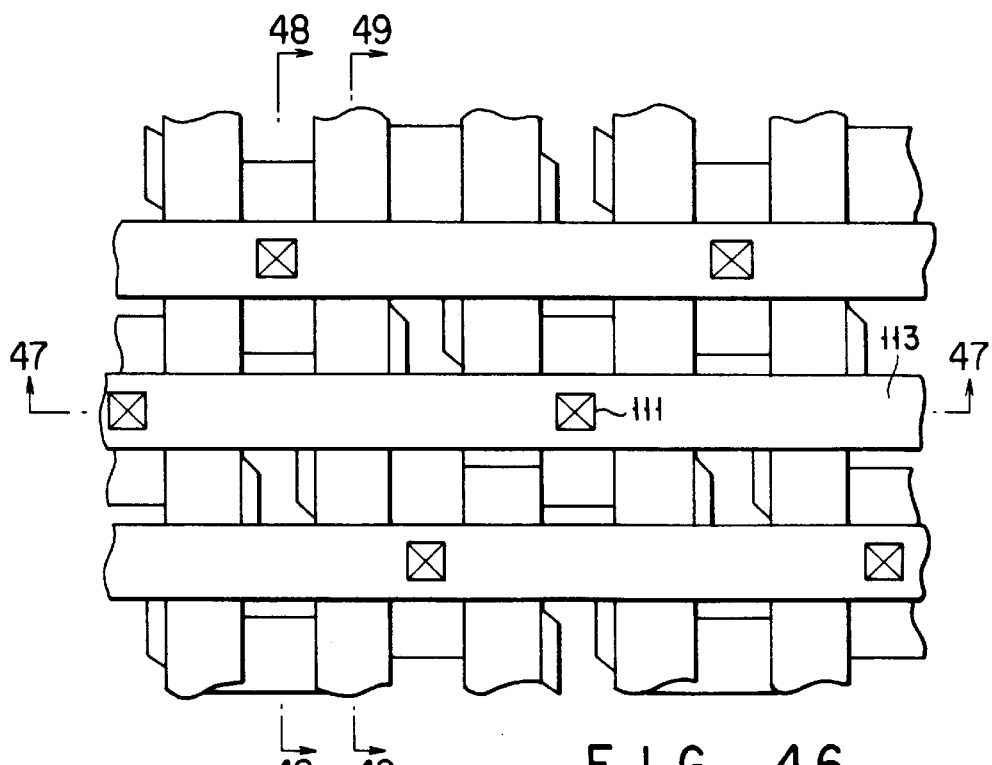
FIG. 46 is a plan view showing a manufacturing step of a second stage of the DRAM cell array of the seventh embodiment of the present invention.
Figure 47:
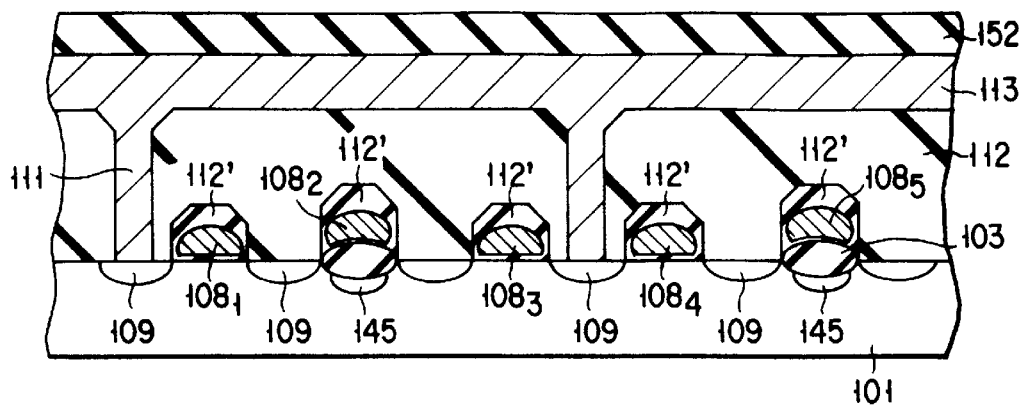
FIGS. 47, 48, and 49 are cross sectional views showing a manufacturing step of the second stage of the DRAM cell array of the seventh embodiment of the present invention, taken along lines 47—47, 48—48 and 49—49 of FIG. 46, respectively.
Figure 48:
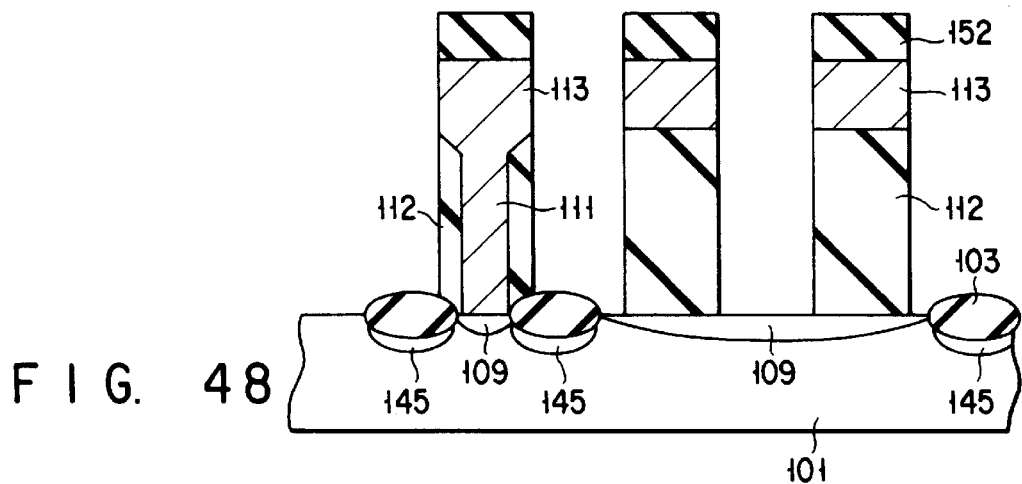
Figure 49:
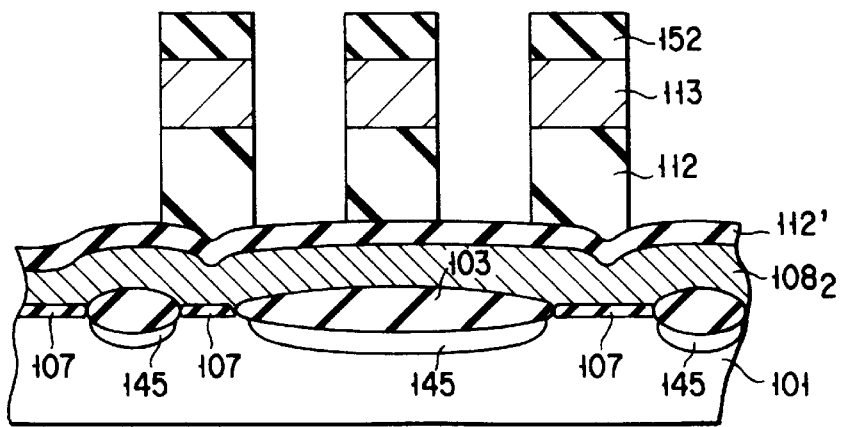

Then, the process goes to a next stage. FIG. 46 is a plan view of the cell array of a second stage. FIGS. 47, 48, and 49 are cross sectional views taken along lines of 47—47, 48—48, and 49—49 of FIG. 46.

First, the first polycrystalline silicon film, serving as the gate electrode 108, is deposited on the entire surface of the p type silicon substrate 101 with the gate oxide film 107 interposed therebetween. Then, $POCl_3$ is diffused thereto, and the resistance of the first polycrystalline silicon is lowered.

Then, the silicon nitride film, serving as the insulating film 112', is deposited on the entire surface. Thereafter, the silicon nitride film and the polycrystalline silicon film are processed by lithography and reactive ion etching, so that the gate electrode 108 is formed.

Then, for example, As is ion-implanted into the entire surface to form the n type diffusion layer 109. Thereafter, the silicon nitride film, serving as the insulating film 112', is further deposited on the entire surface. Then, by anisotropic etching, the insulating film 112' is left on the side wall of the gate electrodes 108 and 114 so that the side wall insulating film of the gate is formed.

Next, the interlayer insulating film 112, formed of, for example, BPSG, is deposited on the entire surface. Thereafter, by lithography and reactive ion etching, the interlayer insulating film 112 is etched, so that the contact area for the bit line contact path 111 is opened.

Then, the polycrystalline silicon film 113, serving as the bit line material, is deposited on the entire surface. Thereafter, the resistance of the polycrystalline silicon film 113 is lowered by ion-implantation of, for example, As.

Then, the interlayer insulating film 152 is deposited on the entire surface, and the interlayer insulating film 152, the polycrystalline silicon film 113, and the interlayer insulating film 112 are processed based on the pattern of the bit line 113 by the lithography and the reactive ion etching, so that a bank-like structure on which the bit line is mounted is formed.

Figure 52:
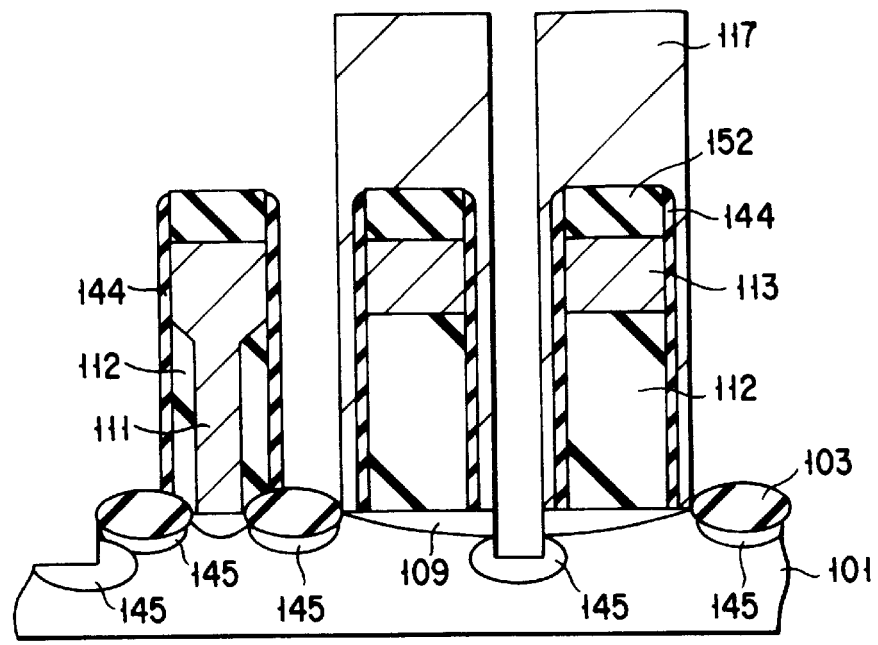
Figure 53:
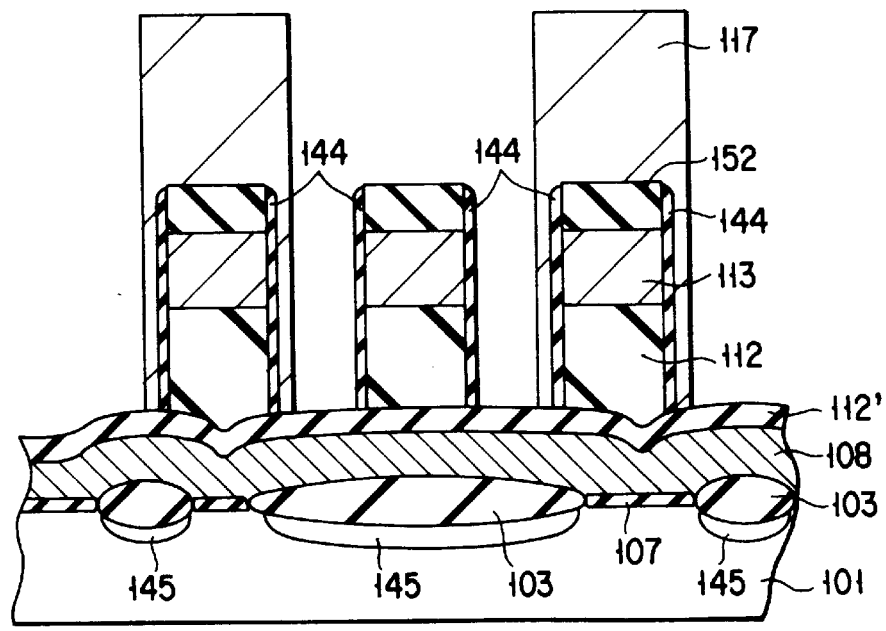

Then, the process goes to a third stage shown in FIGS. 50 to 53. FIG. 50 is a plan view of the cell array of the third stage. FIGS. 51 to 53 are cross sectional views taken along lines 51—51, 52—52, and 53—53 of FIG. 50, respectively.

First, for example, the silicon nitride film, serving as the insulating film 144, is further deposited on the entire surface. Then, by isotropic etching, the insulating film 144 is left on the side wall of the bank where the bit line 113 is mounted, so that the bit line side wall insulating film is formed (FIGS. 52, 53).

The side wall insulating film 144 and the interlayer insulating film 152 are formed to surround the bit line 113, so that the electrical insulation from the stacked capacitor storage node electrode 117 can be surely maintained.

Next, a conductive film, serving as the capacitor storage node electrode 117, such as a polycrystalline silicon film is deposited on the entire surface, and the resistance of the polycrystalline silicon film is lowered by ion-implantation of As.

Then, by lithography and the reactive ion etching, the polycrystalline film is etched to a depth reaching the n type diffusion layer 109 to form a deep isolation groove, so that the stacked capacitor storage node electrode 117 (FIG. 52) is formed.

Thereafter, through the same steps as the sixth embodiment, the DRAM as shown shown in FIGS. 40 to 43 is completed. However, in this case, as shown in FIG. 42, after forming the element isolation insulating film 152", an insulating film 162 is formed on the entire surface of substrate to ensure the insulation of the element isolation.

Eighth Embodiment

Figure 54A:
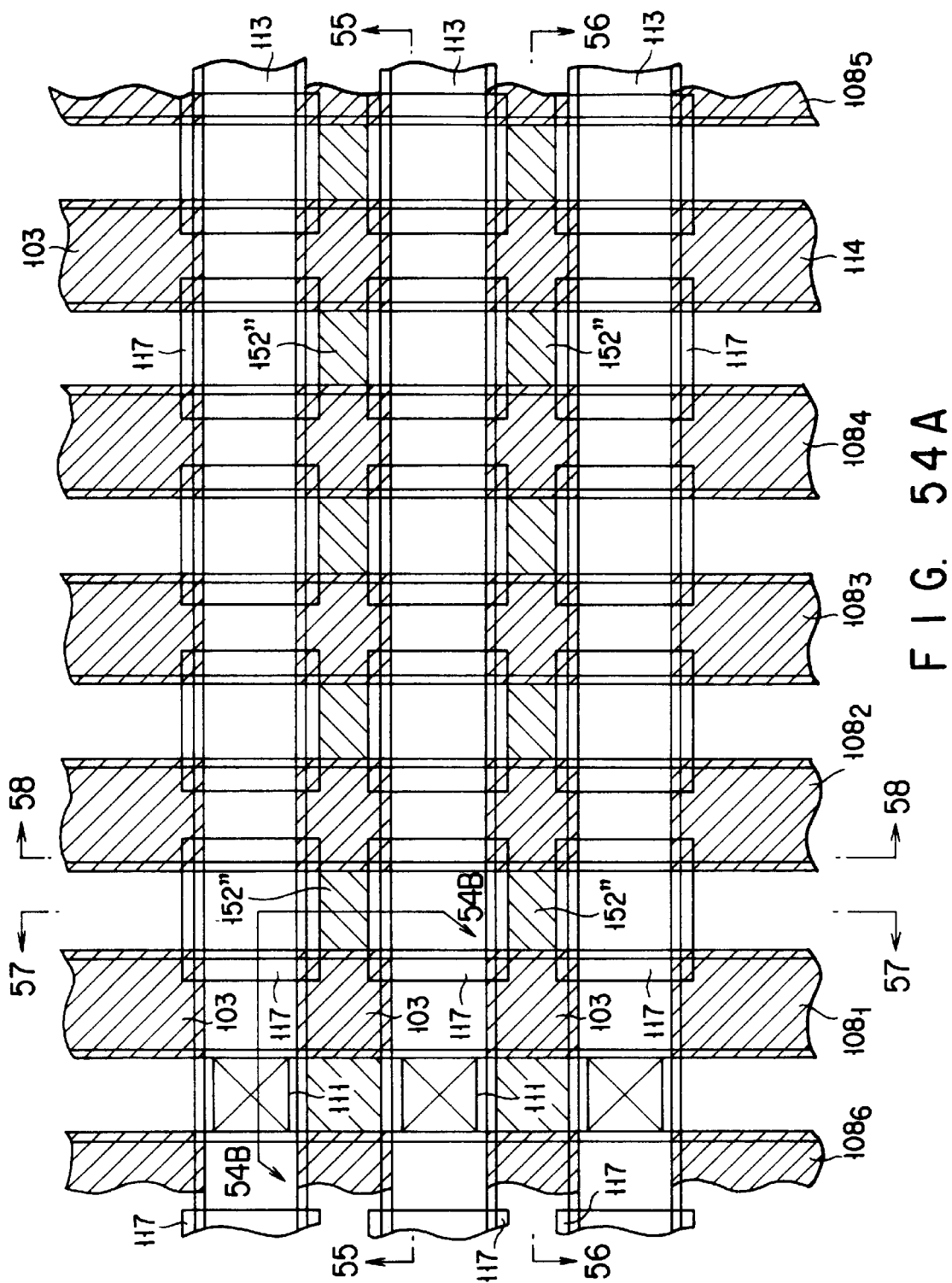
FIG. 54A is a plan view showing a cell array of a 2-cell 1 bit-line contact type DRAM of an eighth embodiment of the present invention.
Figure 55:
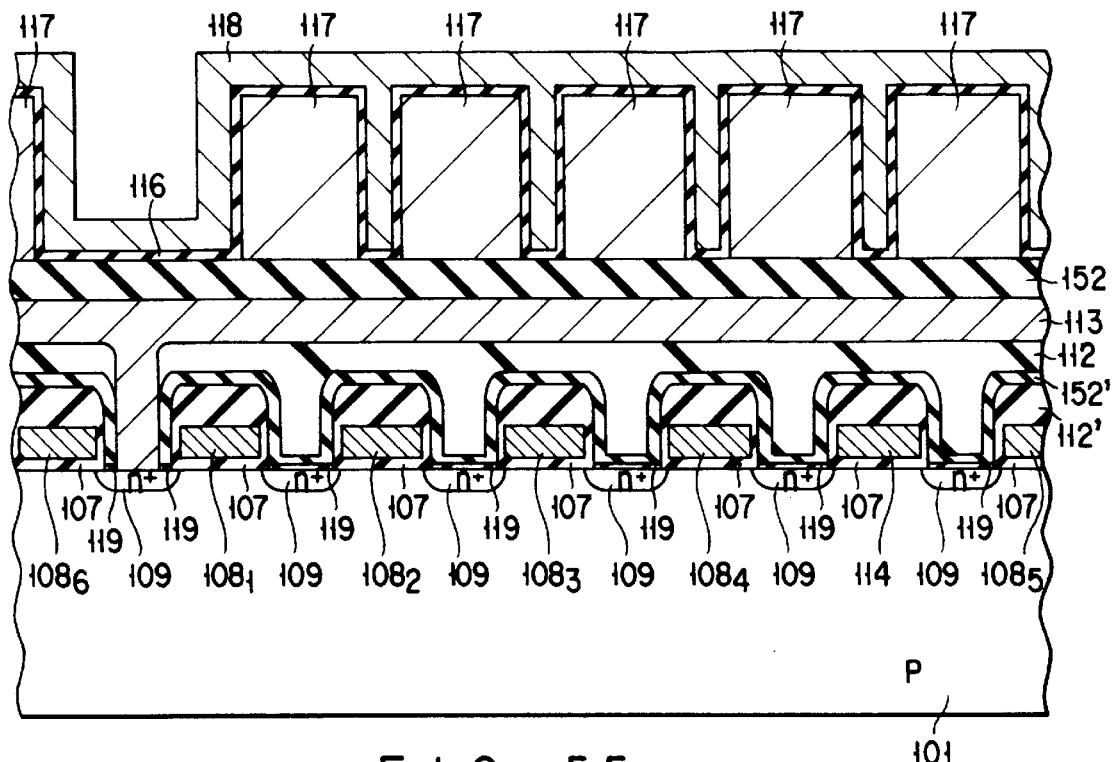
FIGS. 55, 56, 57, and 58 are cross sectional views of the DRAM cell array of the eighth embodiment of the present invention, and these figures are cross sectional views taken along lines 55—55, 56—56, 57—57, and 58—58 of FIG. 54A, respectively.
Figure 56:
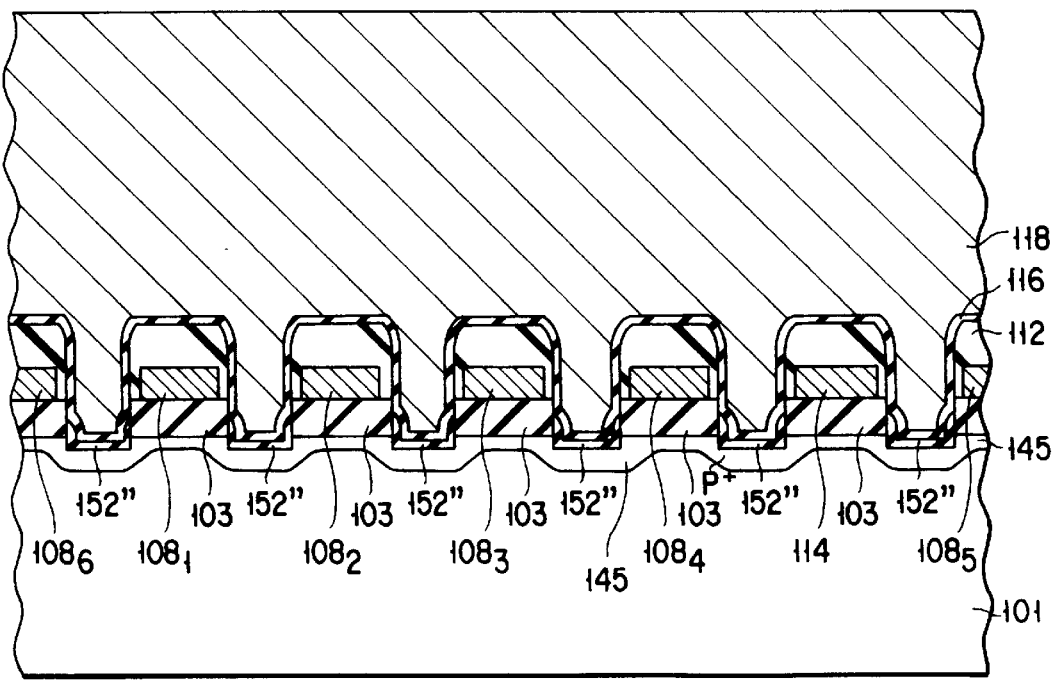
Figure 57:
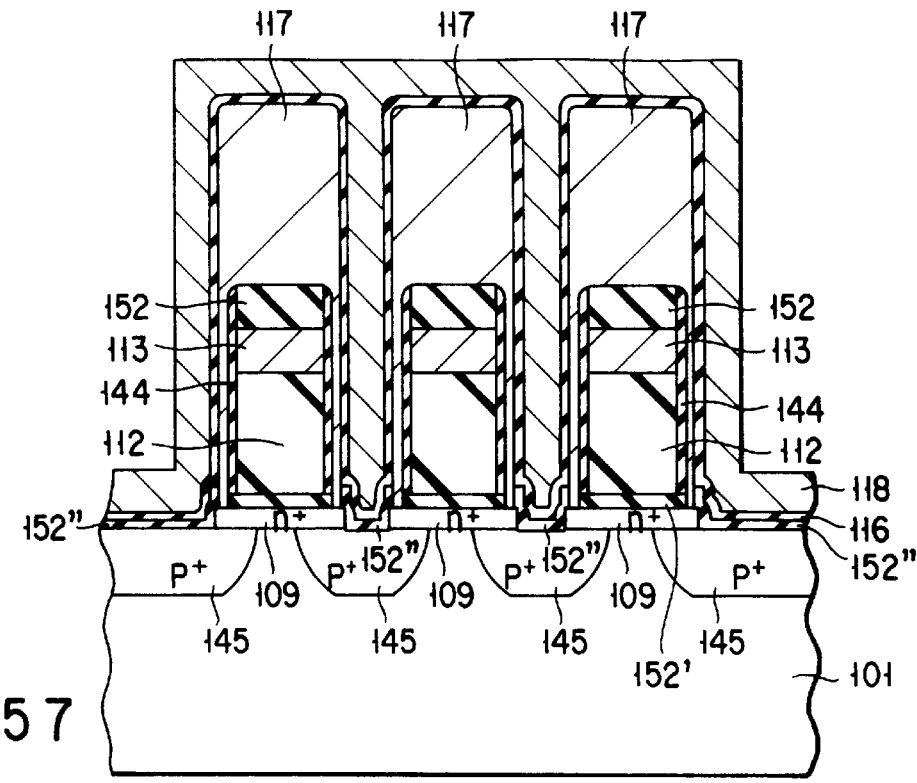
Figure 58:
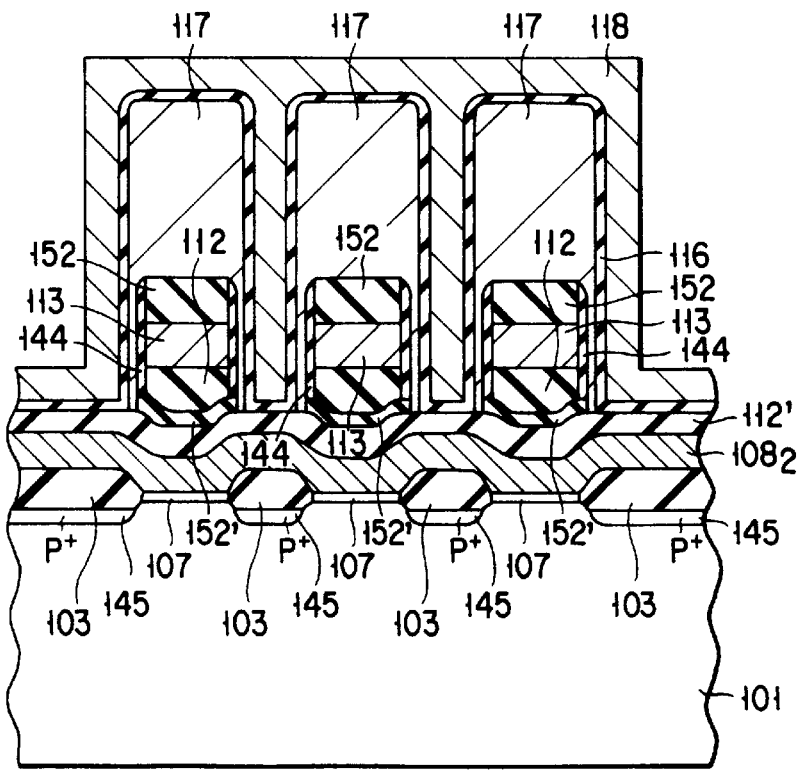

FIG. 54A is a plan view showing the cell array of the NAND type DRAM according to the eighth embodiment of the present invention. FIGS. 55 to 58 are cross sectional views taken along lines 55—55, 56—56, 57—57, and 58—58 of FIG. 54A, respectively. FIG. 54B is a perspective view seeing the cross section taken along line 54B—54B of FIG. 54A in a direction of an arrow. The three-dimensional relationship among the respective structural elements will be clarified from this figure.

In the eighth embodiment, four cell memory cells are connected in series, thereby the NAND type memory cell array is structured. Also, the field shield gate electrode 114 is formed, so that the insulation between the memory cell arrays is realized. In this NAND type memory cell array, since the number of the bit line contacts per eight memory cells is one, the memory cell area can be further reduced.

The manufacturing method of the eighth embodiment is basically an improved one of the manufacturing method of the seventh embodiment. The following will explain the manufacturing method of the eighth embodiment with reference to FIGS. 59 to 67.

The step of a first stage is shown in FIGS. 59 and 60. FIG. 59 is a plan view conceptually showing the cell array arrangement of the first stage. FIG. 60 is a cross sectional view taken along line 60—60 of FIG. 59.

First, for example, boron is ion-implanted into the p type silicon substrate 101 to form the punch-through stopper 145. Thereafter, the field oxide film 103 is formed on the p type silicon substrate 101 by, for example, LOCOS.

Figure 61:
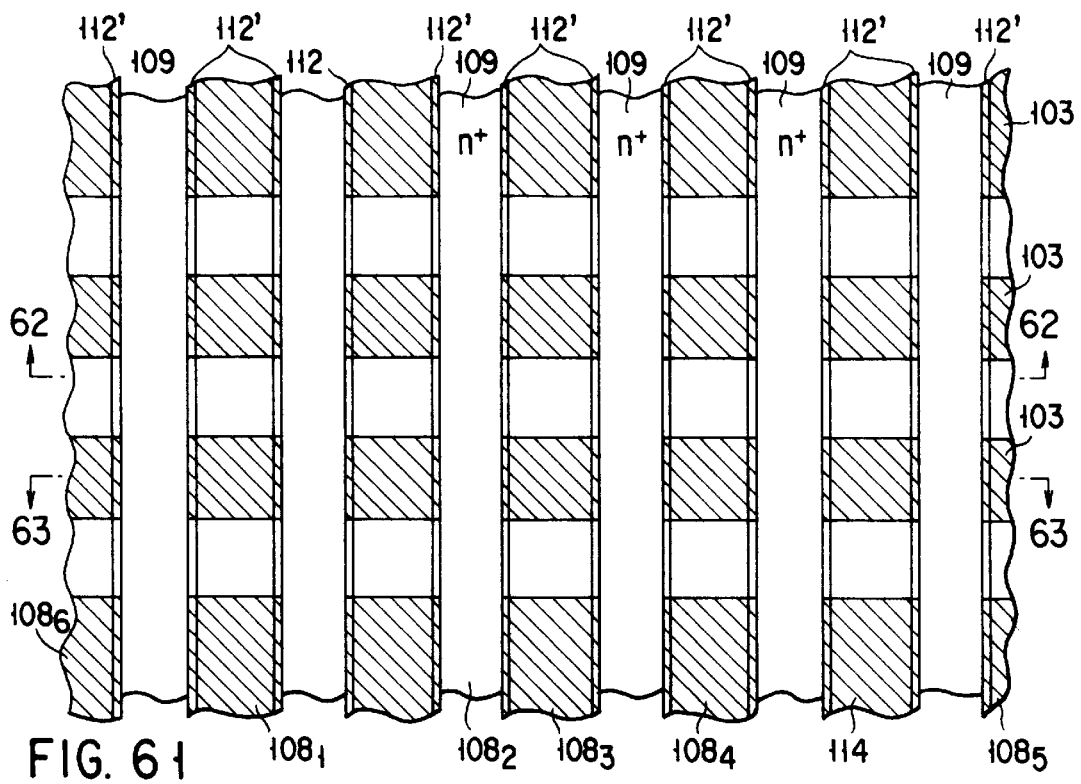
FIG. 61 is a plan view showing a manufacturing step a second stage of the DRAM cell array of the eighth embodiment of the set invention.
Figure 62:
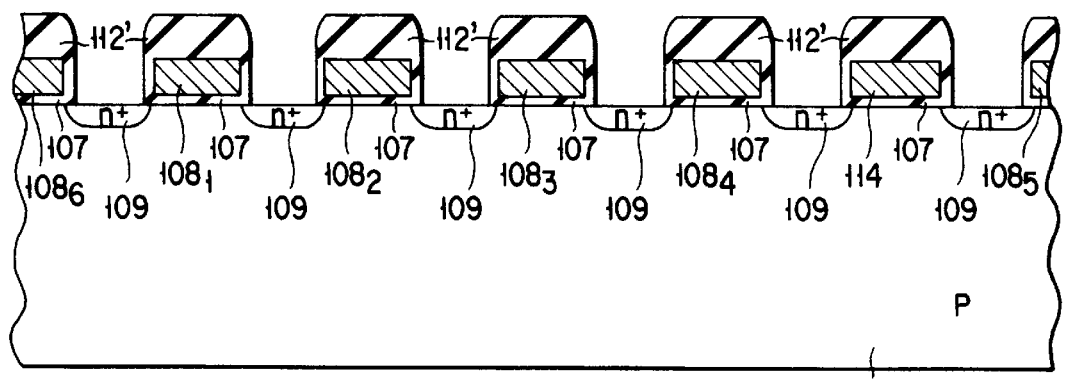
FIG. 62 and 63 are cross sectional views showing a manufacturing step of the second stage of the DRAM cell array of the eighth embodiment of the present invention, taken along lines 62—62 and 63—63 of FIG. 61, respectively.
Figure 63:
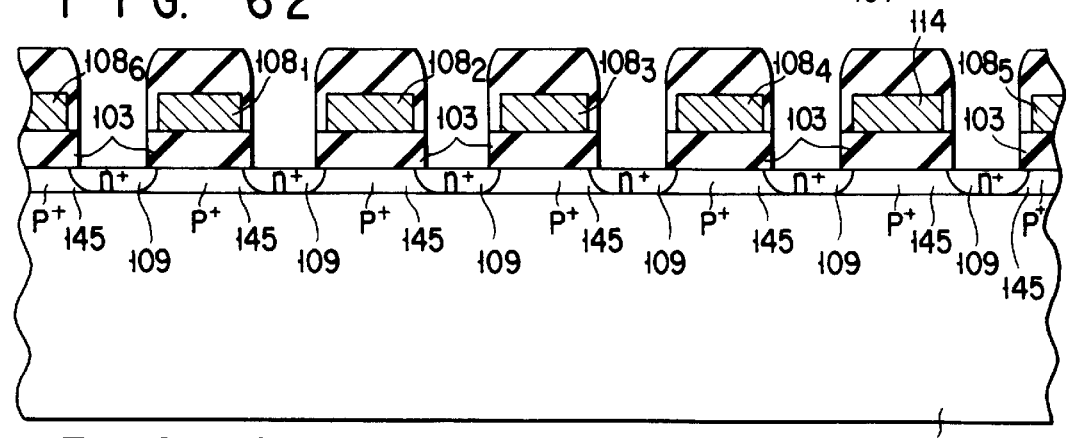

Then, the process goes to a second stage shown in FIGS. 61 to 63. FIG. 61 is a plan view of the cell array of the second stage. FIGS. 62 and 63 are cross sections taken along lines 62—62 and 63—63 of FIG. 61, respectively.

First, the p type silicon substrate 101 is oxidized by, for example, 10 nm, to form the gate oxide film 107. Thereafter, the first polycrystalline silicon film, serving as the gate electrodes 108 and 114, are deposited on the entire surface, and $POCl_3$ is diffused thereto, thereby the resistance of the first polycrystalline silicon film is lowered.

Then, the silicon nitride film, serving as the insulating film 112', is deposited on the entire surface, and the silicon nitride film and the polycrystalline silicon film are processed by lithography and reactive ion etching, so that the gate electrode 108 is formed.

Next, As is ion-implanted into the entire surface to form the n type diffusion layer 109. Thereafter, the silicon nitride film, serving as the insulating film 112', is further deposited on the entire surface. Then, the insulating film 112' is left on the side wall of the vertical gate electrodes 108 and 114 by isotropic etching, so that the side wall insulating film of the gate is formed.

After forming the insulating film 112' of the gate side wall, the element isolation film 103 exposed onto the surface is removed by etching, and for example, As is ion-implanted into the entire surface to have concentration of $10^{19}$ cm$^{-3}$, so that the entire area other than the gate is made to be n-typed.

According to the above-described method, since the element isolation insulating film is not introduced into the n type diffusion area 109, there can be obtained good contact between the stacked capacitor storage node electrode 117 and the n type diffusion area 109 without depending on accuracy of alignment of the bit line 113.

Figure 64:
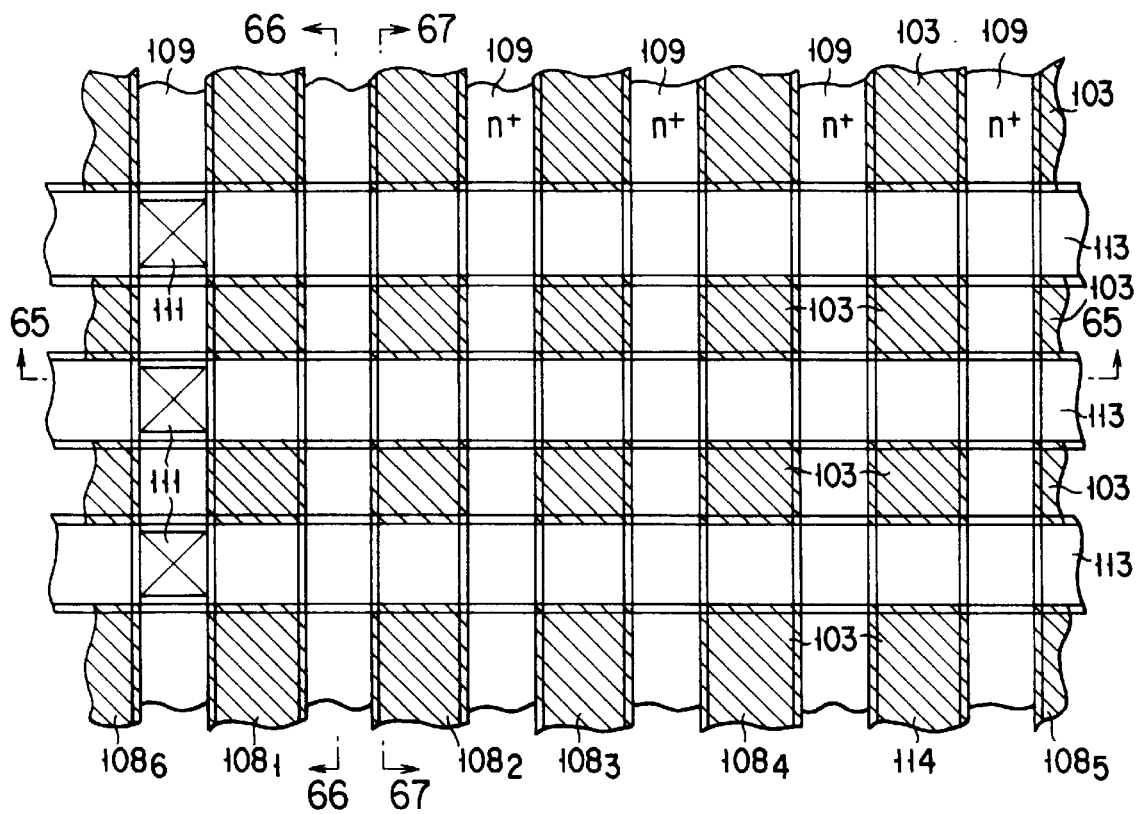
FIG. 64 is a plan view showing a manufacturing step of a third stage of the DRAM cell array of the eighth embodiment of the present invention.
Figure 65:
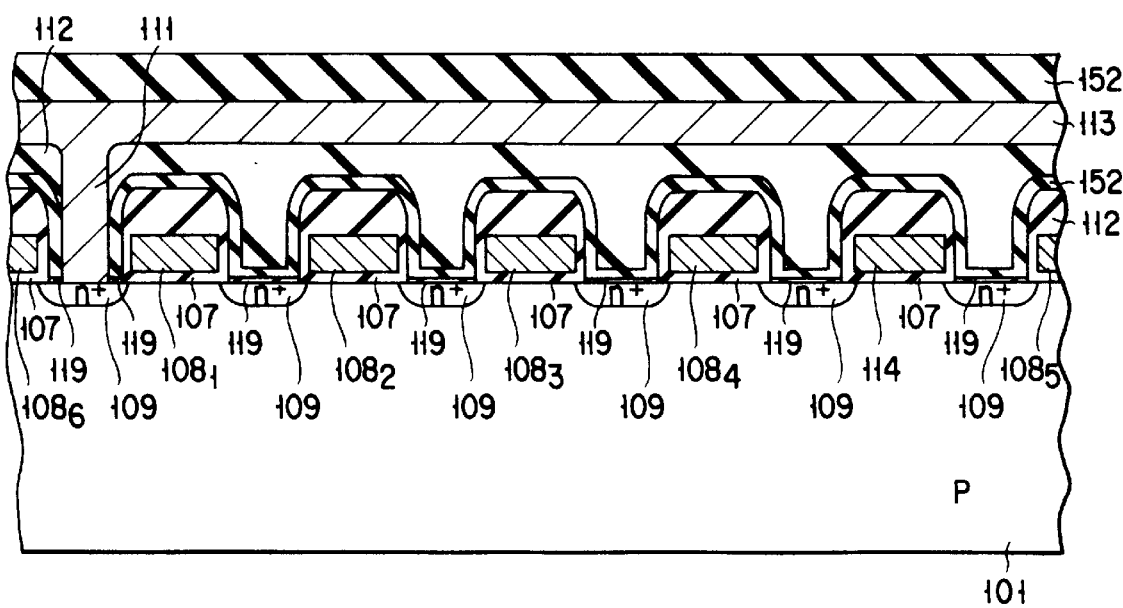
FIGS. 65, 66, and 67 are cross sectional views showing a manufacturing step of the third stage of the DRAM cell array of the eighth embodiment of the present invention, taken along lines 65—65, 66—66, and 67—67 of FIG. 64, respectively.
Figure 66:
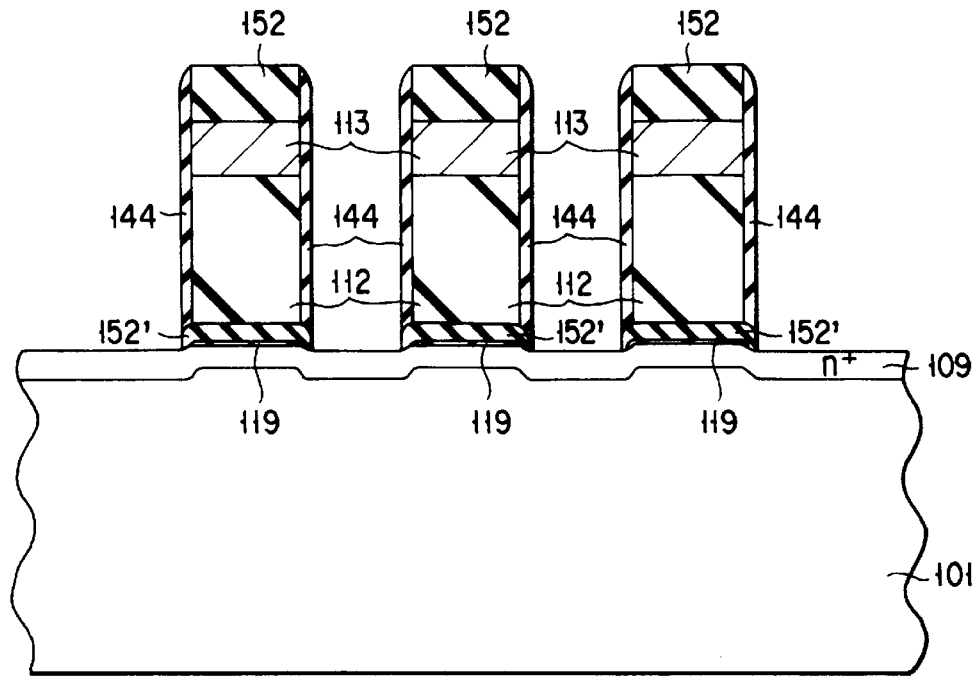
Figure 67:
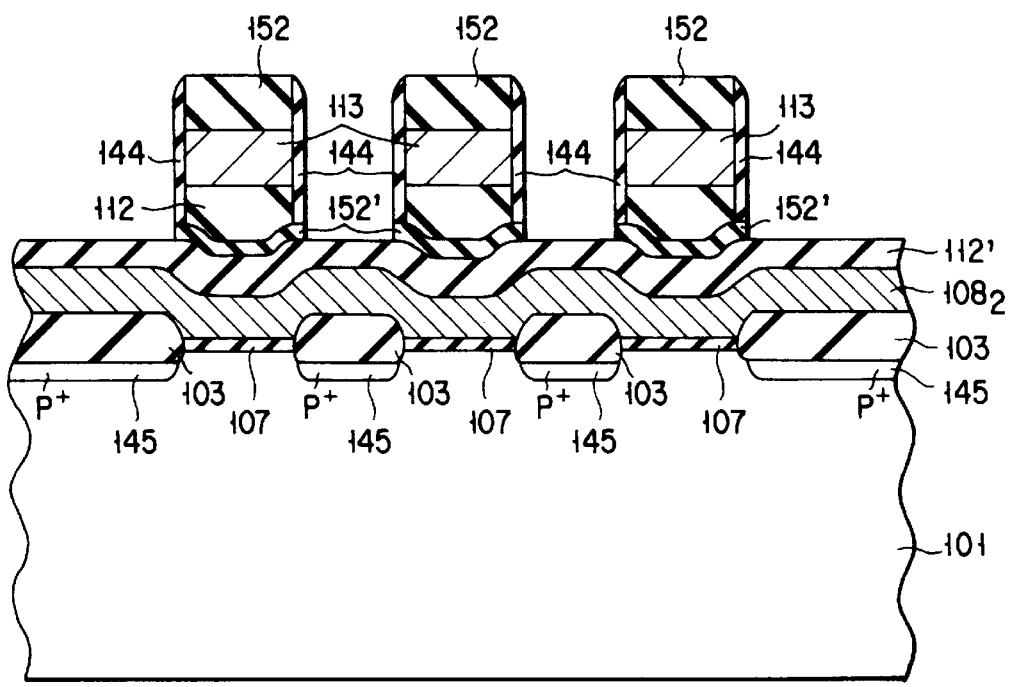
Figure 70:
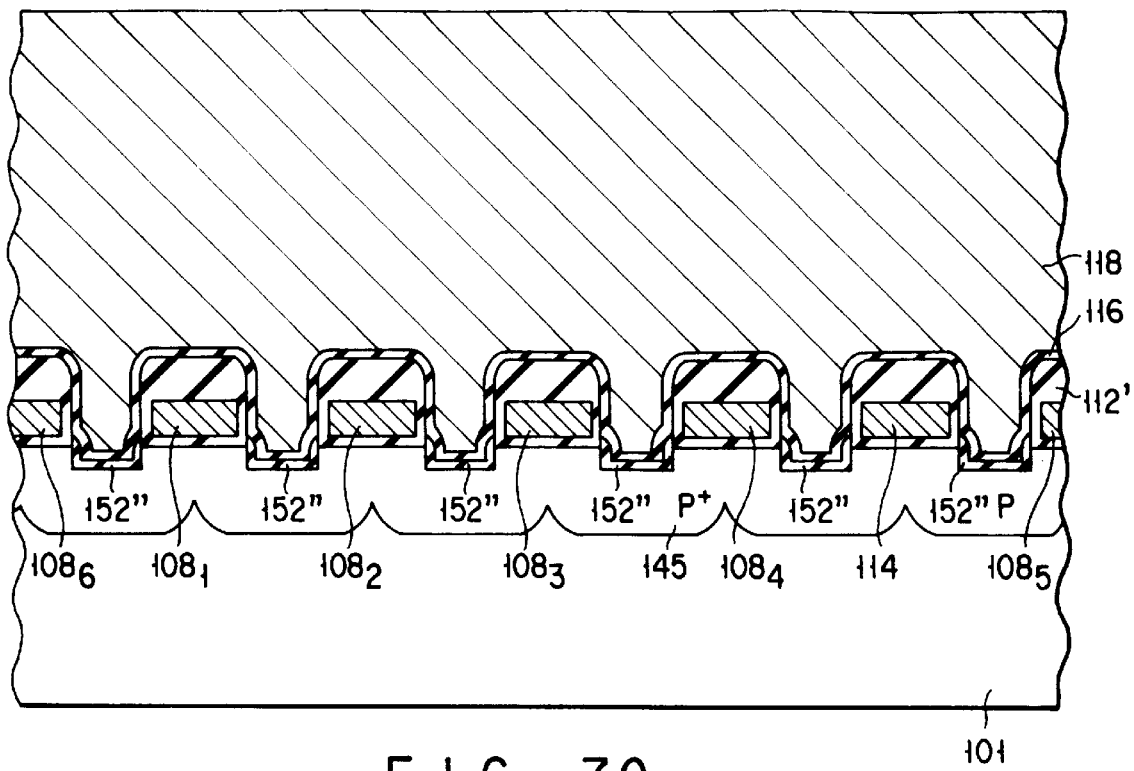
Figure 71:
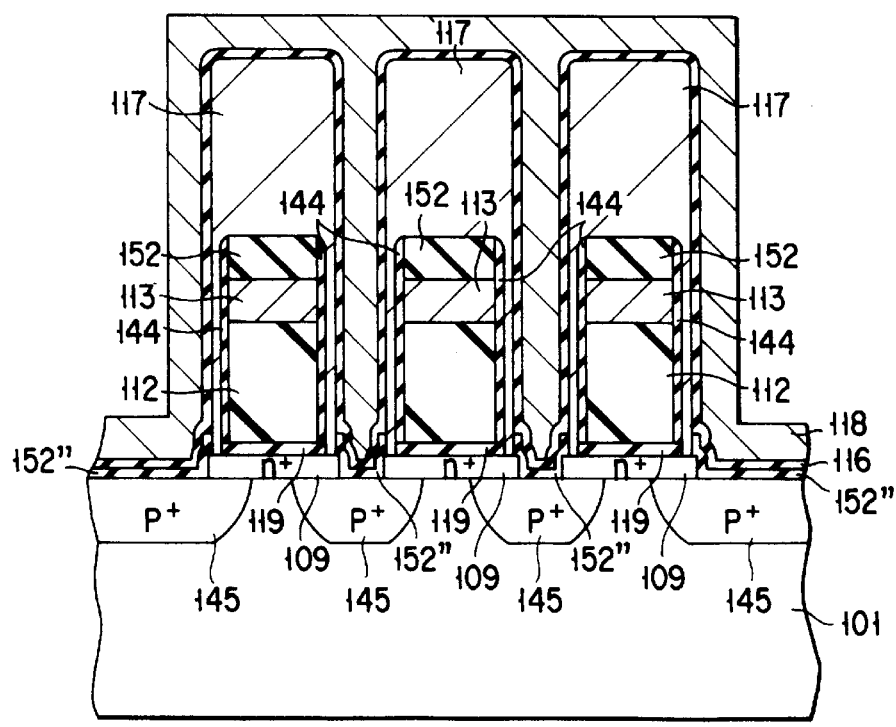

Next, the process goes to a third stage shown in FIGS. 64 to 67. FIG. 64 is a plan view of the cell array of the third stage. FIGS. 65 to 67 are cross sectional views taken along lines 65—65, 66—66, and 67—67 of FIG. 64, respectively.

First, the surface of the silicon substrate 101 is oxidized to, for example, 10 nm to form the insulating film 119.

Then, the interlayer insulating film 152', formed of, e.g., silicon nitride film, is deposited on the entire surface to about 50 nm. Thereafter, the interlayer insulating film 152' is processed by lithography and reactive ion etching, so that the element isolation insulating film around the bit line contact path 111 to be formed later is formed.

Next, the interlayer insulating film 112, formed of, for example, BPSG, is deposited on the entire surface. Thereafter, the interlayer insulating films 112, 152' and the insulating film 119 are etched by lithography and reactive ion etching, so that the contact area for the bit line contact path 111 is opened (FIG. 65).

Then, the bit line material, for example, the polycrystalline silicon film 113 is deposited on the entire surface. Thereafter, the resistance of the polycrystalline silicon film 113 is lowered by ion-implantation of As.

Next, the interlayer insulating film 152 is deposited on the entire surface, so that the interlayer insulating film 152, the polycrystalline silicon film 113, and the interlayer insulating film 112 are processed based on the pattern of the bit line 113 by lithography and reactive ion etching (FIGS. 66 and 67).

Thereafter, through the same process as the seventh embodiment, the memory cell array is completed.

In the eighth embodiment, the interlayer film structure under the bit line is formed by two layers of the interlayer insulating film 112, formed of BPSG, and the interlayer insulating film 152' formed of the silicon nitride film having a thickness of 50 nm. As a result, even in a case where the interlayer insulating film 112 is thick and a selection ratio of the interlayer insulating film 112 to the substrate 101 is not easily obtained, good accuracy of depth of etching can be obtained.

In other words, for the contact formation by reactive ion etching, the interlayer insulating film 112 is etched under an etching condition having a large selection ratio to the the interlayer insulating film 152', and the interlayer insulating film 152' may be etched with different etchant.

In the above-mentioned sixth to eighth embodiments, the gate electrodes 108 and 114 are passing on the previously formed element isolation insulating film 103 without passing on the element isolation insulating film 152". Due to this, reduction of the element isolation ability caused by the application of the gate voltage is small in the interlayer insulating film 152". Therefore, punch through withstand voltage of the element isolation insulating film 152" can be made smaller than the withstand voltage of the element isolation insulating film 103, and a width of the element isolation insulating film 152" for the element isolation can be made smaller than that of the element isolation film 103.

Ninth Embodiment

FIG. 68 is a plan view showing a DRAM cell array of according to the ninth embodiment of the present invention. FIGS. 69 to 72 are cross sectional views taken along lines of 69—69, 70—70, 71—71, and 72—72 of FIG. 68, respectively.

The ninth embodiment is basically the same as the eighth embodiment. However, the ninth embodiment differs from the eighth embodiment in the point that the element isolation film 103 is not formed in advance.

More specifically, in the ninth embodiment, before the element isolation film 152" is formed, for example, boron is deeply ion-implanted in the substrate under a condition of 100 keV to form a punch-through stopper, and the ion-implanted areas are connected to each other between the element isolation film 152" so as to prevent leakage between the cells.

After etching the interlayer insulating film 152', the etched interlayer insulating film 152' is oxidized with oxidant having rapid diffusion, for example, under atmosphere of $H_2O$. Thereby, as shown in FIG. 73, oxidization of the gate oxide film 107 is advanced from its side surface to thicken the oxide film, and the punch-through withstand voltage at the time of applying the gate voltage may be improved. FIG. 73 is a cross section corresponding to one part of FIG. 70.

In the ninth embodiment, it is not needed that the element isolation film is formed by LOCOS in advance. There is no influence of the difference in level by the thick element isolation insulating film at the time of patterning the gate. Due to this, the gate electrode having a good shape can be formed, and uniformity of the transistor characteristic can be reserved. Moreover, the step of forming the LOCOS element isolation insulating film can be omitted.

In the above-mentioned sixth to ninth embodiments, the capacitor insulating film 116 and the plate electrode 118 can be also formed on the surface of the stacked capacitor storage node electrode 117 formed in the area sandwiched between the bit line 113 and the silicon substrate 102 (i.e. on the side wall under the bit line).

Due to this, as compared with the conventional structure in which all stacked capacitors are formed above the bit line, the capacity of the stacked capacitor can be enlarged, and the memory cell area can be more reduced.

Tenth Embodiment

Figure 74:
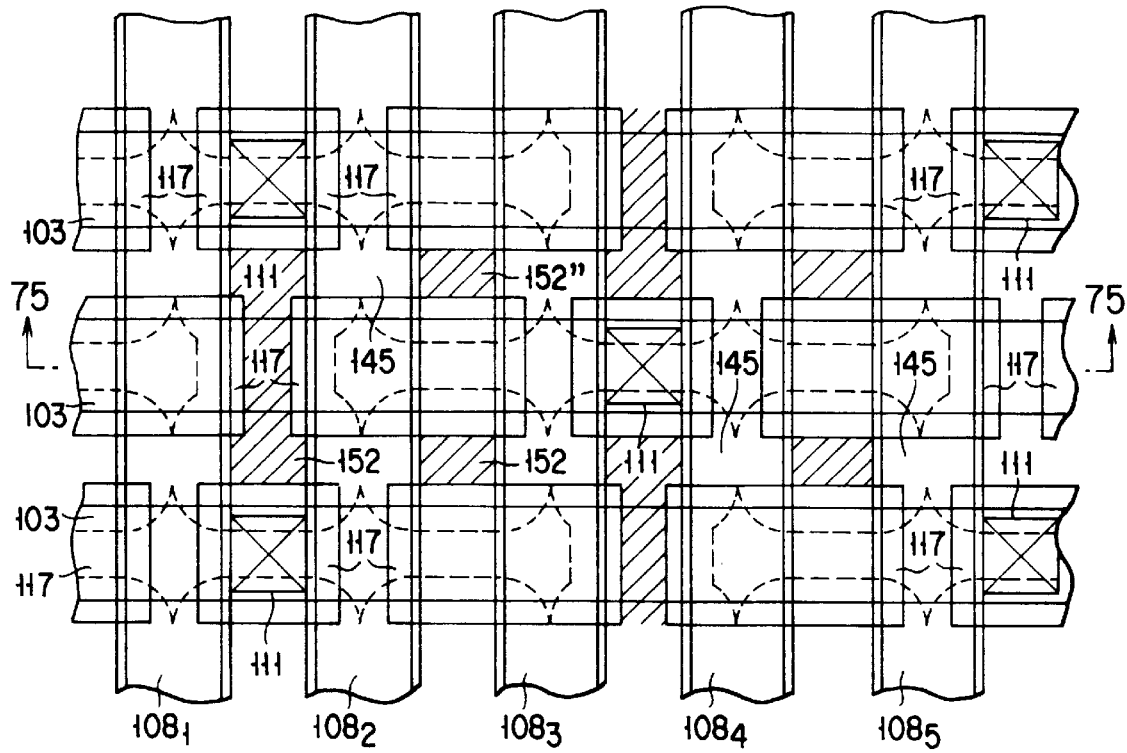
FIG. 74 is a plan view of a DRAM cell array of a folded bit line system of a tenth embodiment of the present invention.
Figure 75:
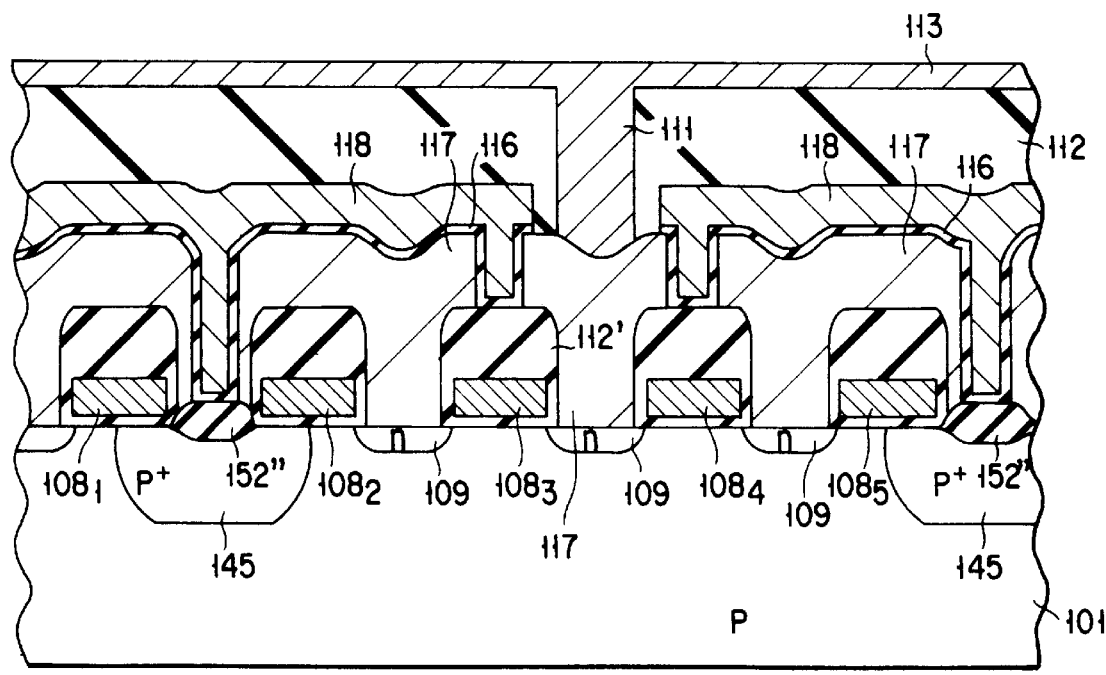
FIG. 75 is a cross sectional view taken along line 75—75 of FIG. 74.

FIG. 74 is a plan view of the cell array of DRAM of the folded bit line system in which one bit line contact per two cells is formed according to the tenth embodiment of the present invention. FIG. 75 is a cross sectional view taken along line 75—75 of FIG. 74.

Figure 76:
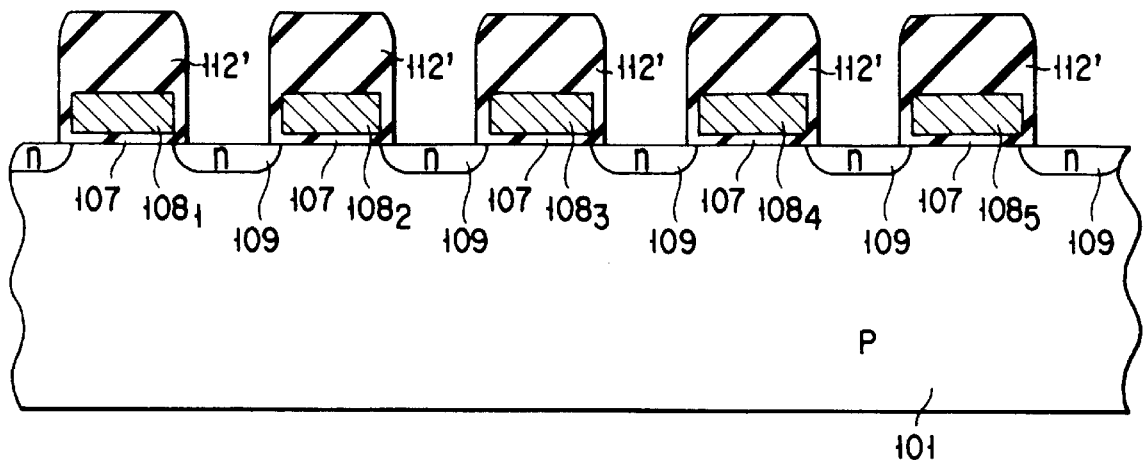
Figure 77:
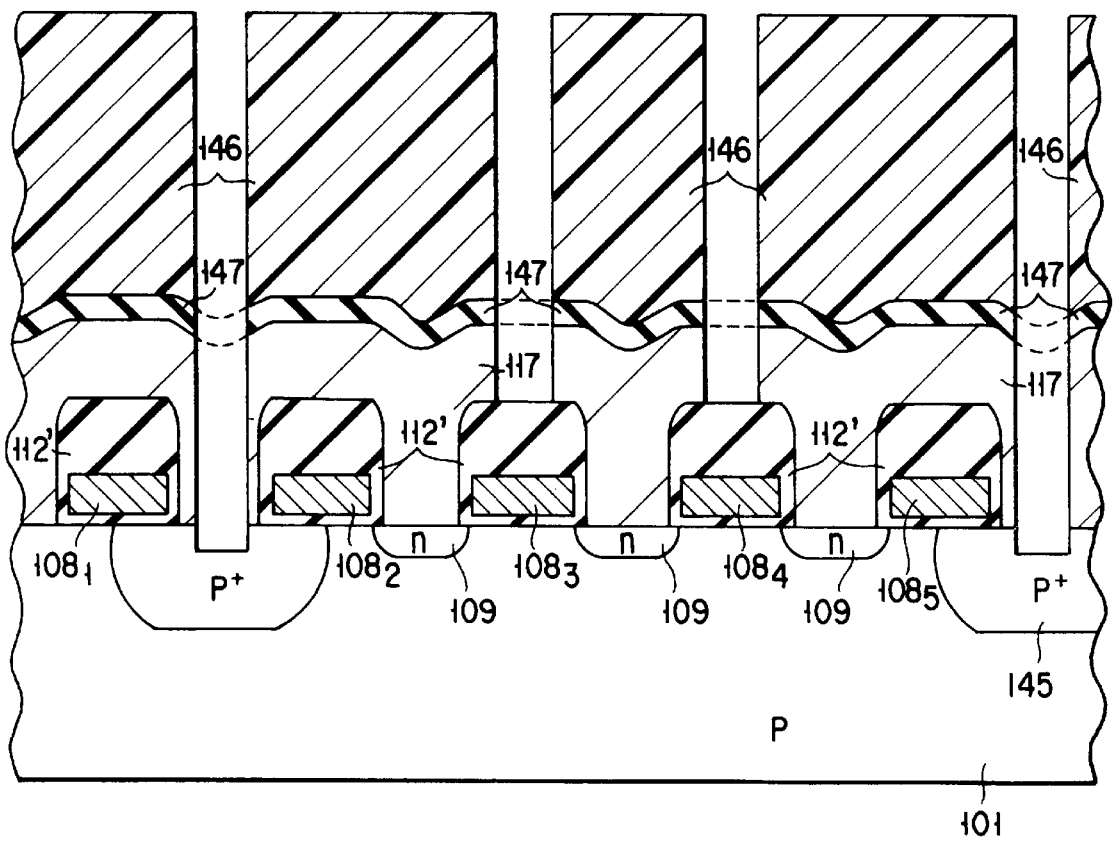

FIGS. 76 to 78 are cross sectional views stepwise showing the manufacturing method of the cell array of the DRAM of the tenth embodiment at the same cross section as FIG. 75.

In the tenth embodiment, the stacked capacitor storage node electrode 117 is formed under the bit line 113, and the contact between the stacked capacitor storage node electrode 117 and the n type diffusion layer 109 can be obtained easily as compared with the sixth to ninth embodiments.

The manufacturing method of the tenth embodiment is the same as the ninth embodiment till the gate side wall insulating film 112' shown in FIG. 76 is formed.

As shown in FIG. 77, the conductive film, serving as the stacked capacitor storage node electrode 117, for example, the polycrystalline silicon film is deposited on the entire surface. Thereafter, the resistance of the polycrystalline silicon film is lowered by ion-implantation of, for example, As. Thereafter, an upper layer insulating film 147 is formed.

Then, the polycrystalline silicon film is processed by lithography using resist 146 and reactive ion etching, so that the stacked capacitor storage node electrode 117 is formed. Thereafter, p type impurity material such as boron is implanted to the entire surface to form the punch-through prevention area 145, and the implanted areas are connected to each other even under the gate electrode 108 as shown by a dotted line of FIG. 74.

Then, the silicon nitride film, serving as an oxide prevention film 143, is deposited on the entire surface to have a thickness of, e.g., 10 nm. Thereafter, by isotropic ion etching, the silicon nitride film is processed, and the oxide prevention film 143, formed of the silicon nitride film, is left on the side wall as shown in FIG. 78.

Though the following steps are not shown, the element isolation insulating film 152" is formed on the bottom of the isolation groove of the capacitor node 117 by oxidization. Thereafter, the oxide prevention film 143 is etched to be removed, and resist is applied onto the entire surface, and the entire surface is exposed. Thereby, resist is left on the bottom (portion under the side wall) of the isolation groove of the stacked capacitor storage node electrode 117. Then, the upper layer insulating film 147 of the upper portion of the stacked capacitor storage node electrode 117 and the element isolation insulating film 152" are removed by etching.

Then, resist is ashed. Thereafter, the capacitor insulating film 116 is deposited on the entire surface and the plate electrode 118 and the wiring layer of the upper layer are processed, so that the memory cell array is completed as shown in FIG. 75.

In this case, the capacitor insulating film 116 is used as, for example, a layered film of silicon oxide film/silicon nitride film/silicon oxide film (effective film thickness: 10 nm). Also, as the plate electrode 118, there is used the polycrystalline silicon film whose resistance is lowered by ion-implantation of As. In order to improve electrical insulation between the plate electrode 118 and the silicon substrate 101, after resist is ashed, the insulating film, formed of, for example, BPSG, is deposited in the deep groove portion (portion between the side walls) of the stacked capacitor storage node electrode 117 to be etched back so that the insulating film may be buried therein.

Eleventh Embodiment

Figure 79:
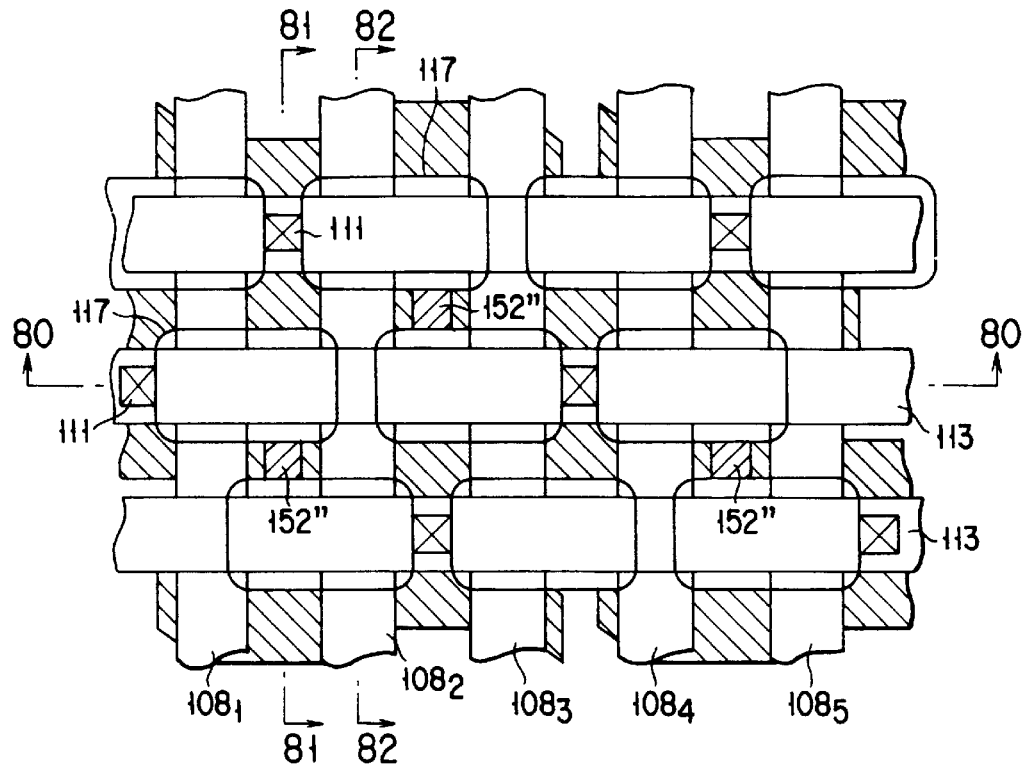
FIG. 79 is a schematic plan view showing a cell array of a 2-cell 1-bit contact DRAM of an eleventh embodiment of the present invention.
Figure 80:
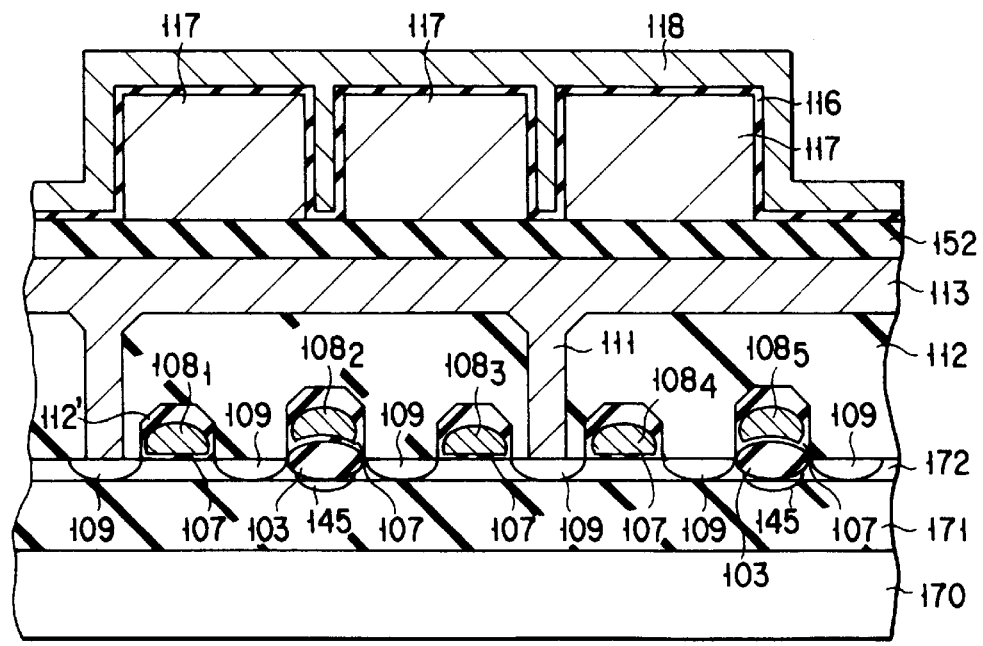
FIGS. 80, 81, and 82 are cross sectional views of the DRAM cell array of the eleventh embodiment of the present invention, respectively, and these figures are cross sectional views taken along lines 80—80, 81—81, and 82—82 of FIG. 79, respectively.
Figure 81:
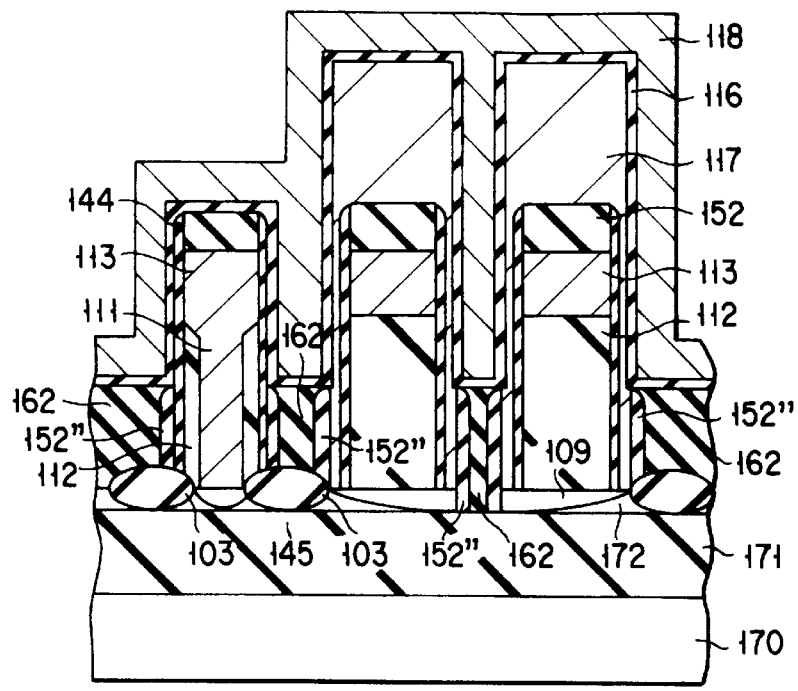
Figure 82:
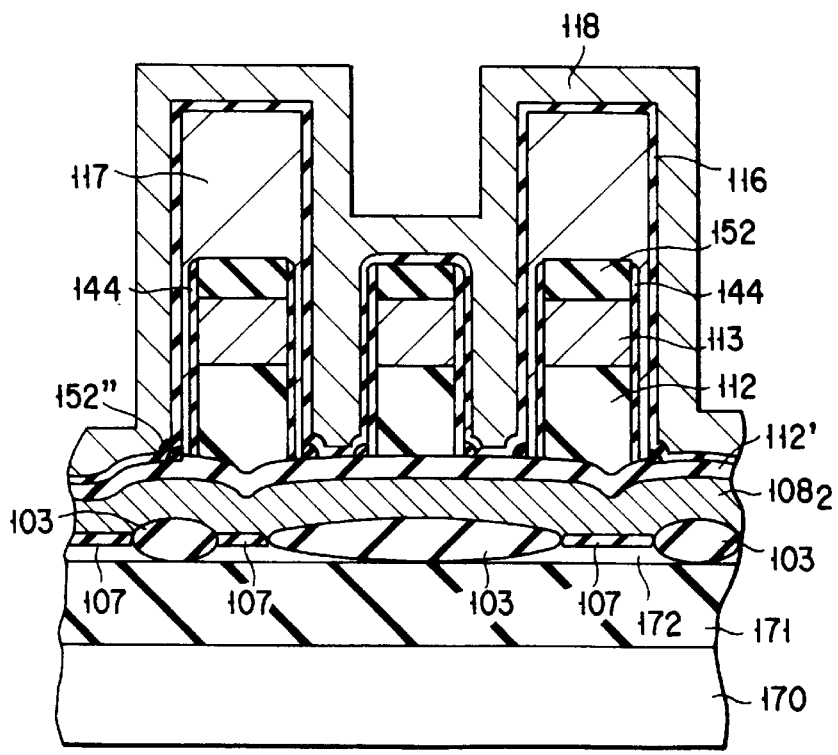

FIG. 79 is a plan view showing a cell array of DRAM having a layered structure of semiconductor layer/insulating layer of two-cell one-bit line contact type according to an eleventh embodiment of the present invention. FIGS. 80, 81, and 82 are cross sectional views taken along lines 80—80, 81—81, and 82—82 of FIG. 79. FIGS. 83 to 92 are views stepwise showing the manufacturing steps of the DRAM cell array of the eleventh embodiment.

The eleventh embodiment is basically the same as the sixth embodiment. However, the eleventh embodiment differs from the sixth embodiment in the point that the semiconductor substrate 101 of the sixth embodiment is formed to have the layered structure of an insulating layer 171 formed on a base plate 170 and a semiconductor film 172. In the eleventh embodiment, by use of the insulating layer, a junction area of the n type diffusion layer 109 and the semiconductor film 172 is reduced, a junction leak current is reduced, so that a soft error, which is caused by radiation incident onto a junction depletion layer, can be reduced. Moreover, by use of the insulating layer 171 whose dielectric constant is lower than the dielectric constant of the semiconductor film 172, the junction capacity of the n type diffusion layer 109 can be reduced.

Figure 83:
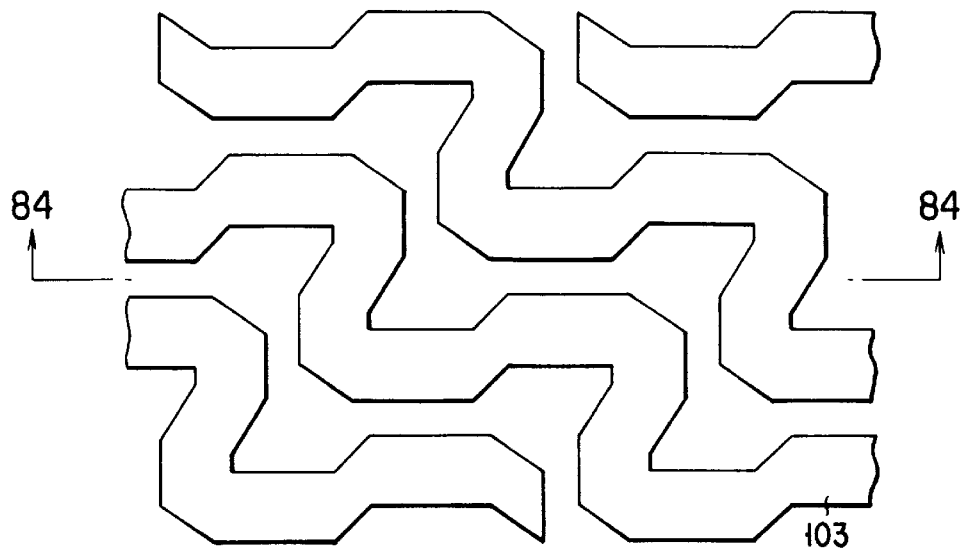
FIG. 83 is a plan view showing a manufacturing step of a first stage of the DRAM cell array of the eleventh embodiment of the present invention.
Figure 84:
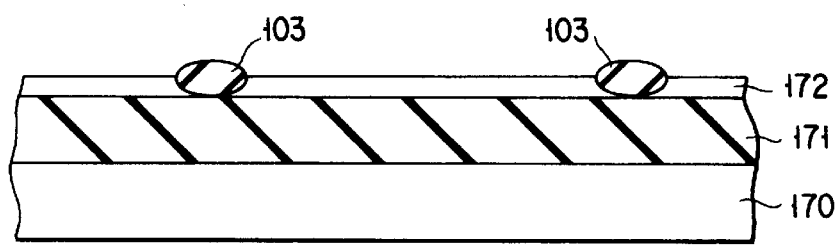
FIG. 84 is a cross sectional view showing a manufacturing step of the first stage of the DRAM cell array of the eleventh embodiment of the present invention, and this figure is the cross sectional view taken along lines 84—84 of FIG. 83.
Figure 85:
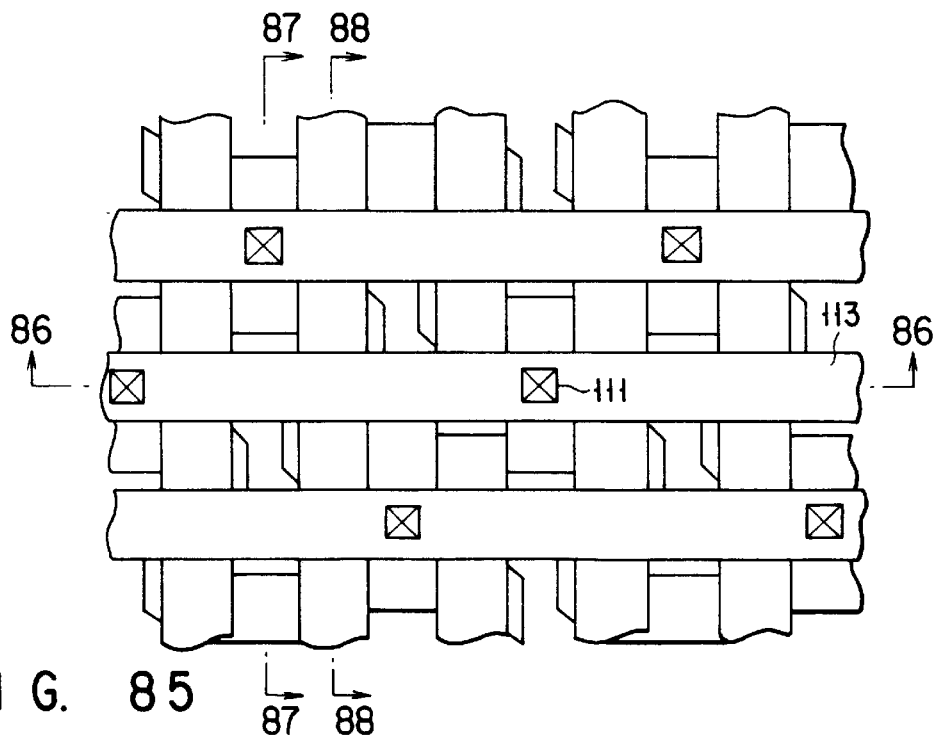
FIG. 85 is a plan view showing a manufacturing step of a second stage of the DRAM cell array of the eleventh embodiment of the present invention.
Figure 86:
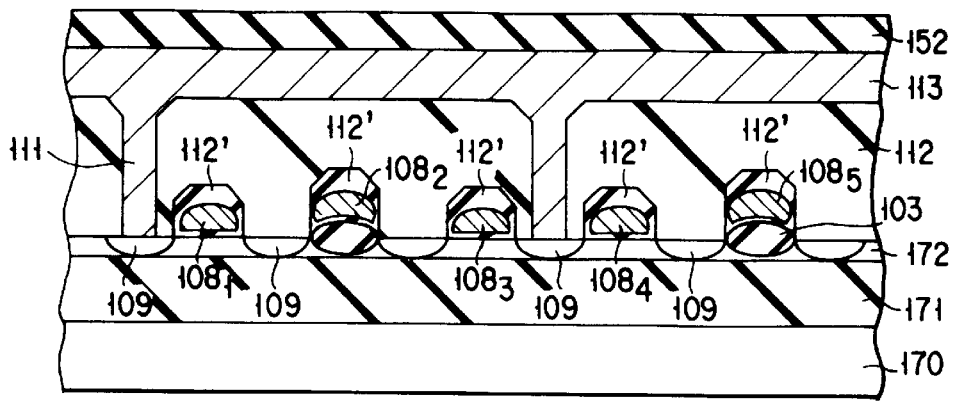
FIGS. 86, 87, and 88 are cross sectional views showing a manufacturing step of the second stage of the DRAM cell array of the eleventh embodiment of the present invention, and these figures are cross sectional views taken along lines 86—86, 87—87, and 88—88 of FIG. 85, respectively.
Figure 87:
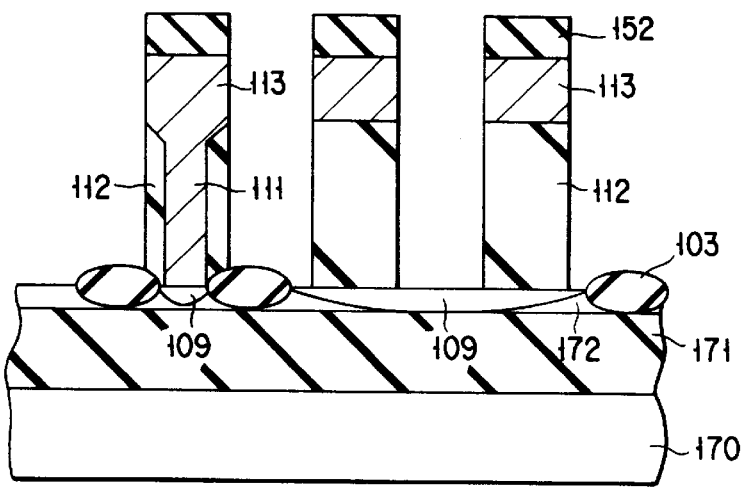
Figure 88:
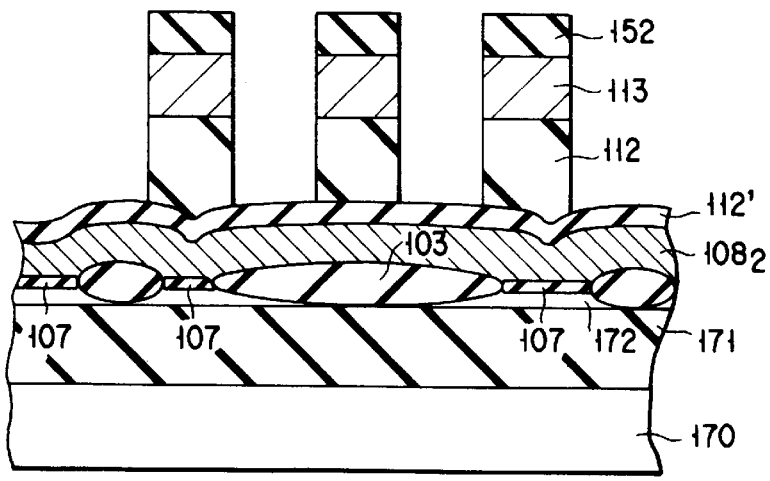
Figure 89:
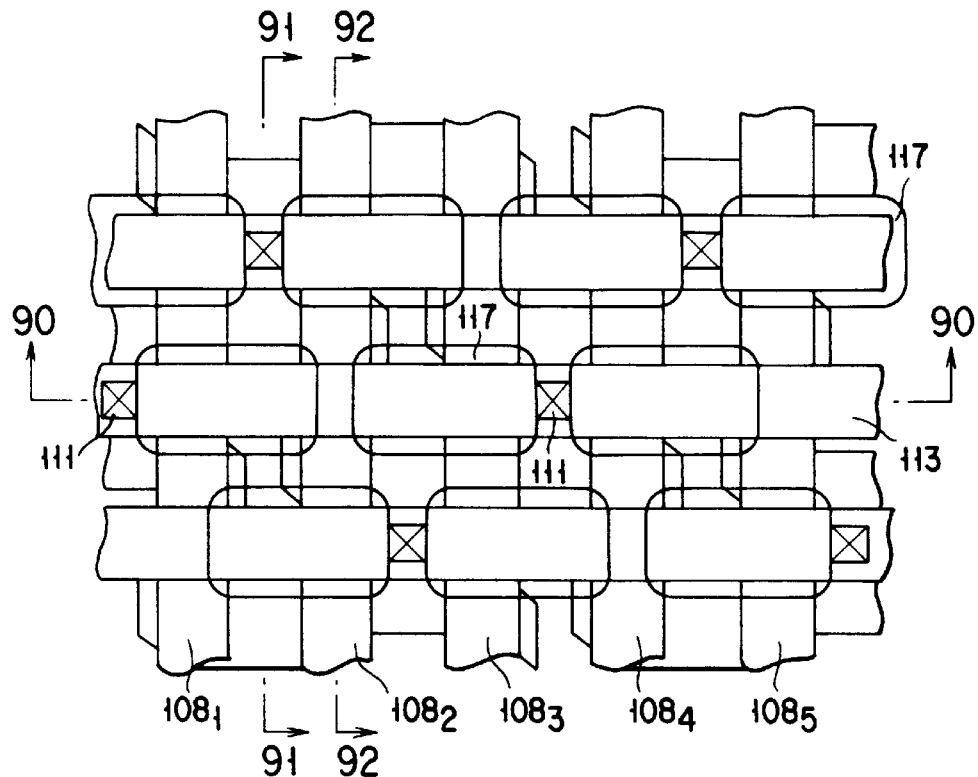
FIG. 89 is a plan view showing a manufacturing step of a third stage of the DRAM cell array of the eleventh embodiment of the present invention.
Figure 90:
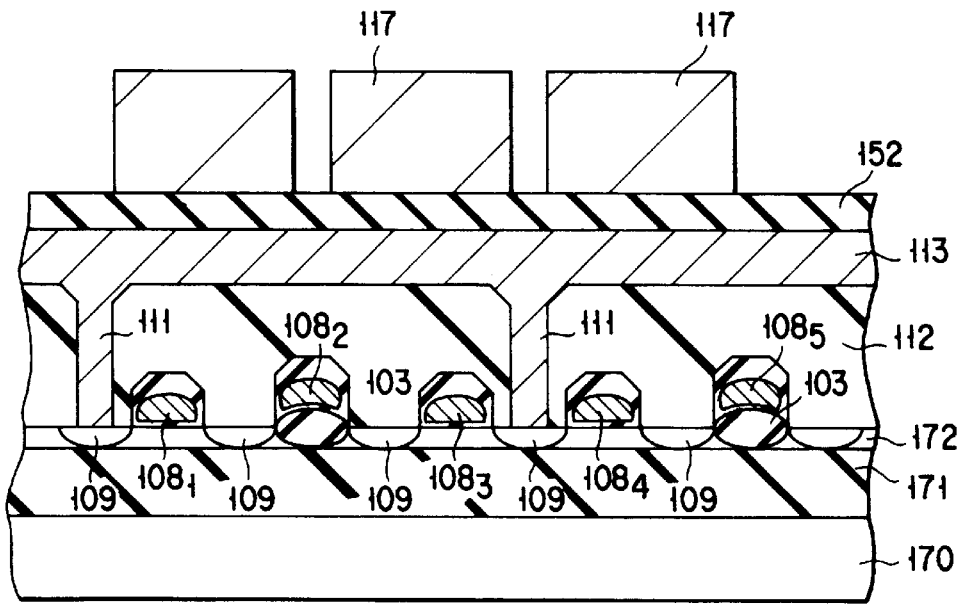
Figure 93:
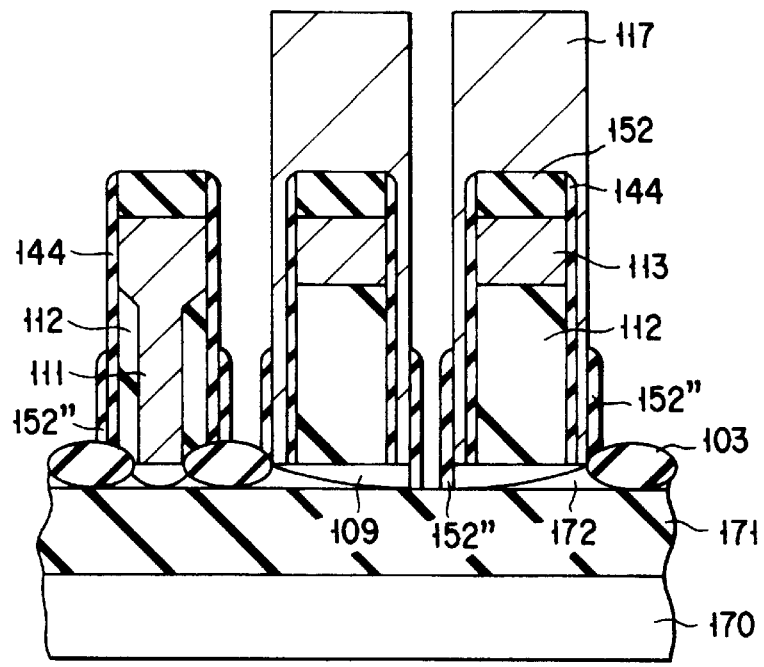
FIGS. 93 and 94 are cross sectional views showing a manufacturing step of the third stage of the DRAM cell a ray of the eleventh embodiment of the present invention, respectively, and these figures are views showing a state after a next step of FIGS. 91 and 92 is ended.
Figure 94:
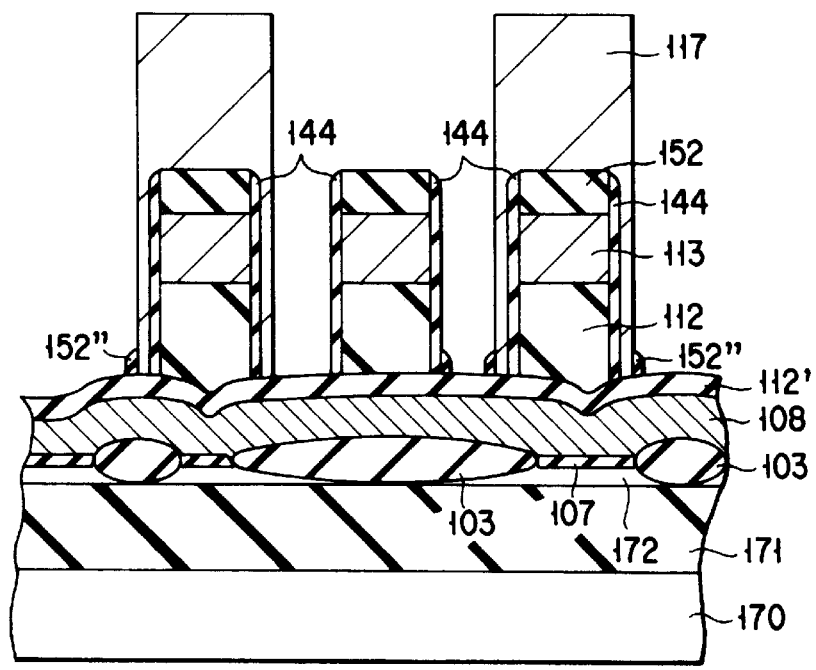

The following will explain the manufacturing process of the memory cell of the eleventh embodiment with reference to FIGS. 83 to 92. FIGS. 83 and 84 show a first stage of the manufacturing process.

First, there is prepared a substrate having a layer the semiconductor layer 172 and the insulating layer 171 are layered on its surface. As such a substrate, there may be used an SIMOX substrate in which an oxygen ion is implanted and the insulating layer 171 is formed in Si. Or, there may be used the so-called bonded SOI substrate in which two semi-conductor wafers are bonded to sandwich the oxide film and at least one surface is polished. As the semiconductor layer 172, an Si layer having a thickness of 10 to 500 nm is used, and as the insulating layer 172, a silicon oxide film layer having a thickness of 50 to 5000 nm is used.

Next, as shown in FIG. 83, the element isolation insulating film 103, formed of the silicon oxide film, is formed on the semiconductor film 172 by LOCOS. In this case, the element isolation film 103 is formed to have a depth contacting the insulating layer 171.

Then, the process goes to a second stage as shown in FIGS. 85 to 88, and the gate electrode and the bit line 113 are formed by the same method as the sixth embodiment. The bit line 113 is formed on the bank-shaped insulating film 112 by processing the interlayer insulating film 152, the polycrystalline silicon film 113, and the interlayer insulating film 112 based on the pattern of the bit line 113 by lithography and reactive ion etching.

Then, the process goes to a third stage as shown in FIGS. 89 to 94. First, for example, a silicon nitride film, serving as the insulating film 144, is deposited on the entire surface of the substrate. Then, the insulating film 144 is left on the side wall of the bank on which bit line 113 is formed by isotropic etching, so that the bit line side wall insulating film is formed and the the insulating film 119 (not shown) formed on the semiconductor film 172 is etched away. The insulating film 144 and the interlayer insulating film 152 are formed to surround the bit line 113, so that the electrical insulation from the stacked capacitor storage node electrode 117 can be easily maintained. Also, it is possible to use a method in which the side wall of the bit line 113 is oxidized to about 20 nm to form the insulating film as the preprocess of forming the side wall insulating film 144 or the alternative thereof.

Then, as a storage node electrode material, for example, the polycrystalline silicon film is deposited on the entire surface, and As, for example, is ion-implanted thereto, so that the resistance can be lowered. Moreover, by lithography or reactive ion etching, the stacked capacitor storage node electrode 117 is processed, so that the groove reaching the transistor diffusion area 109 is formed by etching (FIG. 91).

Moreover, the storage node electrode is oxidized to, for example, 20 nm, so that the element isolation film 152" is formed. It is needed that the thickness of the oxide film be set to maintain the contact between the stacked capacitor storage node electrode 117 and the diffusion layer 109. In place of the oxidization, for example, an oxygen ion may be implanted to form an oxide film area. Moreover, for example, resist is applied to the entire surface and the entire surface is exposed, so that resist is left on the bottom of the deep groove formed between the stacked capacitor electrodes, and the element isolation film 152" of the upper portion of the storage node electrode is removed by etching. The state just after the removal is shown in the cross sectional views of FIGS. 93 and 94. These figures correspond to FIGS. 91 and 92, respectively.

Though the following steps are not shown in the drawings, the capacitor insulating film 116 is deposited on the entire surface, and the plate electrode 118, and the wiring layer of the upper layer are processed, so that the DRAM is completed. The capacitor insulating film 116 is used as, for example, a layered film of silicon oxide film/silicon nitride film/silicon oxide film (effective film thickness: 10 nm). Moreover, the plate electrode 118 is formed of, for example, polycrystalline silicon, and the resistance of polycrystalline silicon is lowered by ion-implantation of, for example, arsenic (As).

The manufacturing method of the semiconductor memory device using the stacked capacitor of the present invention is not limited to the above-mentioned sixth to eleventh embodiments.

The above-mentioned sixth to eleventh embodiments explained the different memory cell forming methods. However, these methods can be applied to any of the NAND typo DRAM, the DRAM of the folded bit line system, and the DRAM of the two passing bit lines per three memory cells.

Moreover, the above-mentioned sixth to eleventh embodiments explained the structure in which the distance between the storage node electrodes is constant in a direction where the plate electrodes are piled up. However, by use of the manufacturing method in which the storage node electrodes are processed from the upper portion by reactive ion etching, there may be provided the structure in which the distance between the storage node electrodes become wider in the direction of the upper portion (pile-up direction). For example, if this method is applied to the sixth embodiment, the cross sectional view at the surface perpendicular to the bit line is shown in FIG. 95. This figure corresponds to the cross sectional view of FIG. 57.

Moreover, the above-mentioned sixth to eleventh embodiments show the oxide film forming method by thermal oxidization as a method for forming the element isolation insulating film. However, the oxide film may be formed by implantation of oxygen under a condition of low acceleration energy of about 30 keV. Or, the oxide film may be formed by the method for depositing the insulating film, or these methods may be combined.

As the element isolation insulating film forming method, there may be used other methods for transforming silicon to a silicon oxide film or a silicon nitride film than the above-described methods.

Moreover, as a process after the preparation of the electrical insulating film area, there may be added a process to reserve the thickness of the insulating film having sufficient withstand voltage, in which the silicon oxide film is deposited and the silicon oxide film is etched by isotropic etching to further deposit a new silicon oxide film. It is needless to say that a single layer film such as a silicon nitride film, a ferroelectric film, a para electric film or a composite film of these films can be used as the insulating film and the capacitor insulating film 116 in place of the silicon oxide film.

Especially for a capacitor insulating film, ditantalum pentaoxide ($Ta_2O_5$), strontium titanate ($SrTiO_3$) or barium strontium titanate ($BaSrTiO_3$) may be used.

Further, a single layer film such as silicon oxide film, a para dielectric film or a composite film of these films can be used as the insulating film 112' in place of the silicon nitride film.

The above-mentioned sixth to eleventh embodiments showed the example using the LOCOS element isolation film as the element isolation insulating film 103. However, a recessed LOCOS method or an improved LOCOS method, and an element isolation of a trench isolation, or a field shield isolation may be used, or these methods may be combined.

Moreover, an element isolation insulating film prepared by use of a different mask may be used in the isolation between the bit line contacts, the field shield isolation (gate electrode 114), and a part of the isolation of the transistor area.

In the ninth embodiment, the number of trenches to be connected in cascade may be set to be a plurality of trenches, and one-bit line contact per eight memory cells is not always needed.

The above-described sixth to eleventh embodiments showed the simple shaped stacked capacitor electrode 117. However, there may be used the stacked capacitor electrode so-called fin-typed or crown-typed in which surface areas are increased.

Also, there may be used the cell structure in which the surface is roughened to increase the surface area. Moreover, any capacitor shape may be used if the element isolation insulating film 152" can be formed by the pattern of the stacked capacitor electrode.

Moreover, in place of the p type silicon substrate 101 having high impurity concentration, an n type silicon substrate may be used to form a p type well in the cell array area.

In the above-described sixth to eleventh embodiments, there were used, as the stacked capacitor storage node electrode 117, the plate electrode 118 and the bit line 113, the polycrystalline silicon film in which arsenic is ion-implanted. However, arsenic may be solid-phase-diffused using AsSG. Or, there may be used the so-called doped polycrystalline silicon film in which arsenic is doped at the same time when the film is formed. Also, in place of arsenic, phosphorus may be doped in the same manner. Moreover, the stacked capacitor storage node electrode 117, the plate electrode 118, the bit line 113 can be made to be p-typed in which boron is doped.

Moreover, as materials of the stacked capacitor storage node electrode 117, the plate electrode 118, and the bit line 113, there can be used metal such as a single crystal silicon, porous silicon, amorphous silicon, W, Ta, Ti, Hf, Co, Pt, Pd or its silicide other than the polycrystalline silicon. Or, the layered structure of these materials may be used.

The above-described sixth to ninth, and eleventh embodiments showed the structure in which two contacts per one storage node electrode is provided between the stacked capacitor storage node electrode 117 and the n type diffusion layer 109 on both sides of the bit line. However, it suffices either one contact be provided.

In the above-described sixth to tenth embodiments, the n channel MOS transistor was used. However, a p channel MOS transistor may be used.

As mentioned above, according to the present invention, there can be obtained the stacked capacitor in which the storage node electrode and the element isolation insulating film are not misaligned with each other even if the memory cell is fined. Therefore, there can be realized the semiconductor memory device having higher degree of integration and higher reliability than the prior art.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate having a plurality of trenches selectively formed on a main surface thereof;
   a plurality of trench capacitors formed in said plurality of trenches, each of said trench capacitors formed of said semiconductor substrate, a capacitor insulating film formed on a surface of each of said trenches, and a storage node electrode buried in each of said trenches interposing said capacitor insulating film;
   a plurality of transistors, formed on said semiconductor substrate, for forming a plurality of memory cells in relation to said plurality of trench capacitors, each of said plurality of transistors having a gate electrode formed on said semiconductor substrate interposing a gate insulating film therebetween and source and drain regions formed in said semiconductor substrate on both sides of said gate electrode, respectively;
   a plurality of element isolation insulating films formed on side surfaces of upper portions of said plurality of trenches to surround the circumference of said trenches, respectively, adjacent ones of said plurality of element isolation insulating films being in direct contact with each other at a portion of outward peripheries thereof and below said main surface of said semiconductor substrate to form a chain of said element isolation films connected in line, such that at least one of said transistors is electrically insulated from another one of said transistors by said chain; and,
   a plurality of conductive members, each connecting one of said source and drain regions of said plurality of transistors to said storage node electrode of a corresponding one of said plurality of capacitors,
   wherein said plurality of element isolation insulating films are formed along side surfaces of said plurality of trenches, respectively, and a depth of each of said element isolation insulating films in a direction along said side surfaces is greater than a thickness of each of said element isolation insulating films in a direction perpendicular to said side surfaces.

2. The semiconductor memory device according to claim 1, wherein each of said plurality of element isolation insulating films is formed of a two-layered insulating film.

3. The semiconductor memory device according to claim 1, further comprising a plurality of inner element isolation films formed on inside surfaces of said upper portions of said plurality of trenches, respectively.

4. The semiconductor memory device according to claim 1, wherein said plurality of trenches are arranged in rows and columns, and said element isolation insulating films formed in said trenches are coupled to each other in a direction of said columns wherein a plurality of bit lines are arranged so as to form a plurality of element isolation areas.

5. The semiconductor memory device according to claim 4, wherein said plurality of transistors are formed in areas sandwiched by adjacent two of said plurality of element isolation areas, and adjacent ones of said transistors use one of said source and drain regions in common, so that said plurality of transistors are connected in cascade.

6. A method for manufacturing a semiconductor memory device, comprising the steps of:
   selectively forming a plurality of first trenches on a semiconductor substrate;
   oxidizing said substrate at inner surfaces of said plurality of first trenches to form on said substrate a plurality of element isolation insulating films, with adjacent ones of said plurality of element isolation insulating films corresponding to adjacent ones of said trenches being in direct contact with each other at a portion of outward peripheries thereof and below said main surface of said semiconductor substrate, to form a chain of said element isolation insulating films connected in line and form a plurality of element forming areas isolated by said chain of said element isolation insulating films;
   opening bottom surfaces of said first trenches after oxidizing said inner surfaces of said first trenches, thereby forming a plurality of second trenches under said plurality of first trenches, respectively;
   forming a plurality of storage node electrodes in said plurality of first and second trenches and interposing capacitor insulating films, respectively, to form a plurality of capacitors;
   forming a plurality of transistors each having a gate electrode formed on said semiconductor substrate with an interposed gate insulating film therebetween, and source and drain regions formed in said semiconductor substrate on both sides of said gate electrode, respectively, in said plurality of element forming areas, respectively; and
   forming a plurality of conductive members for connecting said storage node electrodes to ones of said source and drain regions of said transistors, respectively.

7. The method according to claim 6, after said step of forming said plurality of capacitors, further comprising the steps of:
   etching back the storage node electrodes of the upper portions of said plurality of first trenches and said capacitor insulating films to a predetermined depth, respectively;
   burying upper layer insulating films into concave portions formed by said etching back step, respectively; and
   forming openings in said upper layer insulating films to form second element isolation insulating films along the inner surfaces of said trenches, respectively.

8. A semiconductor memory device comprising:
   a semiconductor substrate;
   a plurality of transistors formed on said semiconductor substrate, said transistors each having a gate electrode formed on said semiconductor substrate interposing a gate insulating film, and source and drain regions formed in said semiconductor substrate on both sides of said gate electrode, respectively;
   a plurality of layered capacitors formed on said plurality of transistors and insulated therefrom, respectively, said capacitors having storage node electrodes formed on said transistors and insulated therefrom, capacitor insulating films formed on said storage node electrodes, and plate electrodes formed on said capacitor insulating films, respectively;
   a plurality of word lines, arranged substantially in parallel, each selectively connected to said gate electrode of each of said plurality of transistors;

a plurality of bit lines, arranged substantially in parallel, each selectively connected to one of said source and drain regions of said plurality of transistors, and formed to be substantially perpendicular to a direction where said word lines are arranged; and a plurality of element isolation insulating films formed on said semiconductor substrate between adjacent ones of said transistors in a direction where said bit lines are arranged, wherein an edge of one of said source and drain regions which is coupled to a corresponding one of said storage node electrodes is substantially aligned with an edge of said one of said storage node electrodes at a surface of said substrate in the direction where said bit lines are arranged, and each of said element isolation insulating films is provided between an adjacent ones of said source and drain regions in the direction where bit lines are arranged, having a portion formed on a side surface of a lower section of each of said storage node electrodes.

9. The device according to claim 8, wherein a distance between said adjacent ones of said storage node electrodes in the direction where said bit lines are arranged is adjusted in such a manner that a distance at an uppermost portion of each of said storage node electrodes is not smaller than a distance at a surface of said substrate.

10. The device according to claim 9, wherein the distance between adjacent ones of said storage node electrodes in the direction where said bit lines are arranged is adjusted to have a gradual change in such a manner that the distance at the uppermost portion of each of said storage node electrodes is greater than the distance at the surface of said substrate.

11. The device according to claim 9, wherein said element isolation films are coupled to another kind of element isolation means to selectively isolate forming areas of said plurality of transistors.

12. The device according to claim 11, wherein an LOCOS film is used for said another kind of element isolation means.

13. The device according to claim 11, wherein a semiconductor layer of a predetermined conductive type having a predetermined concentration is used for said another kind of element isolation means.

14. The device according to claim 9, wherein each of said storage node electrodes is formed to stride over each of said bit lines, and connected to one of said source and drain regions at a lower portion of both sides of each of said bit lines.

15. The semiconductor memory device according to claim 14, further comprising a bit line insulating film formed between each of said bit lines and said substrate and having a same width as that of each of said bit lines, wherein each of said bit lines has a top insulating film on an top surface thereof and a side wall insulating film formed on a side wall of each of said bit lines and a side wall of said bit line insulating film, thereby insulated from each of said storage node electrodes.

16. A method for manufacturing a semiconductor memory device, comprising the steps of:

forming a plurality of gate electrodes on a semiconductor substrate with gate insulating films interposed therebetween, respectively;

forming source and drain regions on said semiconductor substrate on both sides of said plurality of gate electrodes, respectively, to form a plurality of transistors;

forming an insulating film on upper and side surfaces of each of said plurality of said gate electrodes;

forming a plurality of bit lines on said insulating film and selectively connected to one of said source and drain regions of said plurality of transistors;

forming a conductive film insulated from said bit lines on an entire surface of said substrate where said transistors are formed after the step of forming said insulating film on each of said gate electrodes and the step of forming said plurality of bit lines;

patterning said conductive film by anisotropic etching to form storage node electrodes on said transistors, each of said storage node electrodes being connected to a corresponding one of said source and drain regions, and to expose surfaces of said substrate between said storage node electrodes being adjacent in a direction where said plurality of bit lines are arranged by removing exposed portions of said source and drain regions, respectively;

forming element isolation insulating films on said surfaces exposed on said substrate in a self-aligned manner with said storage node electrodes, respectively, after the step of patterning said conductive film; and forming plate electrodes on said storage node electrodes with capacitor insulating films interposed therebetween, respectively.

17. The method according to claim 16, wherein said step of forming said storage node electrodes includes a step of adjusting a distance between said storage node electrodes being adjacent in a direction where said bit lines are arranged to have a gradual change in such a manner that a distance at an uppermost portion of each of said storage node electrodes is greater than a distance at a surface of said substrate.

18. The method according to claim 16, wherein said step of forming said storage node electrodes includes a step of adjusting a distance between said storage node electrodes being adjacent in a direction where said bit lines are arranged to be constant throughout a range from a surface of said substrate to an uppermost portion of each of said storage node electrodes.

19. The semiconductor memory device according to claim 1, wherein said plurality of trenches includes at least first, second and third trenches, each having first, second and third element isolation insulating films formed on side surfaces of upper portions of said trenches to surround the circumference thereof, and wherein the first and second element isolation insulating films are formed separately to have a portion of a forming area for one of said transistors therebetween, the first and third element isolation insulating films are connected to each other, and the second and third element isolation insulating films are connected to each other.

20. The semiconductor memory device according to claim 1, wherein a separation between adjacent ones of said plurality of trenches defines a width of one of said transistors.

21. The semiconductor memory device according to claim 1, wherein selected ones of said element isolation insulation films are connected to at least two of said element isolation insulating films other than the selected ones.

22. The semiconductor memory device according to claim 1, wherein at least three of said element isolation insulating films are connected to each other to define an isolation region.

23. The method according to claim 6, wherein the step of selectively forming said plurality of first trenches comprises a step of separating two of said first trenches to define a width of said transistors.

24. The method according to claim 6, wherein the step of selectively forming said plurality of first trenches comprises a step of forming said plurality of first trenches in rows and columns; and said oxidizing step comprises a step of coupling element isolation insulating films of said first trenches in a direction of said columns.

25. The method according to claim 6, wherein said oxidizing step comprises a step of coupling one of said element isolation insulating films to two other ones of said element isolation insulating films.

26. The method according to claim 6, wherein said oxidizing step comprises a step of connecting at least three of said element isolation insulating films to each other to define an isolation region.

27. The device according to claim 9 wherein said plurality of word lines are disposed areas other than areas where said element isolation films are formed.

28. The device according to claim 9, wherein the distance between adjacent ones of said storage node electrodes in the direction where said bit lines are arranged is adjusted to be constant throughout a range from the surface of said substrate to the uppermost portion of each of said storage node electrodes.

* * * * *